United States Patent
Nogoshi et al.

(10) Patent No.: US 11,543,750 B2
(45) Date of Patent: *Jan. 3, 2023

(54) LITHOGRAPHIC PRINTING PLATE PRECURSOR AND METHOD FOR PRODUCING LITHOGRAPHIC PRINTING PLATE

(71) Applicant: FUJIFILM Corporation, Tokyo (JP)

(72) Inventors: Keisuke Nogoshi, Shizuoka (JP); Takeshi Inasaki, Shizuoka (JP); Kazuaki Enomoto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 83 days.

This patent is subject to a terminal disclaimer.

(21) Appl. No.: 16/714,808

(22) Filed: Dec. 16, 2019

(65) Prior Publication Data

US 2020/0117086 A1 Apr. 16, 2020

Related U.S. Application Data

(63) Continuation of application No. PCT/JP2018/024962, filed on Jun. 29, 2018.

(30) Foreign Application Priority Data

Jun. 30, 2017 (JP) .............................. JP2017-129814

(51) Int. Cl.
*G03F 7/033* (2006.01)
*B41C 1/10* (2006.01)

(52) U.S. Cl.
CPC ............ *G03F 7/033* (2013.01); *B41C 1/1008* (2013.01); *B41C 2210/04* (2013.01); *B41C 2210/06* (2013.01); *B41C 2210/08* (2013.01); *B41C 2210/10* (2013.01); *B41C 2210/22* (2013.01)

(58) Field of Classification Search
CPC ....................................................... G03F 7/033
See application file for complete search history.

(56) References Cited

U.S. PATENT DOCUMENTS

| 2004/0024157 | A1 | 2/2004 | Okazaki et al. | |
|---|---|---|---|---|
| 2007/0275322 | A1 | 11/2007 | Tao et al. | |
| 2008/0254384 | A1* | 10/2008 | Iwai | C09B 23/0066 430/281.1 |
| 2009/0047599 | A1* | 2/2009 | Horne | G03F 7/3035 430/281.1 |
| 2012/0190810 | A1* | 7/2012 | Nguyen | B41C 1/1008 526/277 |
| 2015/0360498 | A1 | 12/2015 | Mizuno et al. | |
| 2016/0121596 | A1 | 5/2016 | Saito | |
| 2016/0326372 | A1 | 11/2016 | Mizuno et al. | |
| 2017/0123315 | A1 | 5/2017 | Mizuno et al. | |
| 2018/0356730 | A1* | 12/2018 | Inasaki | G03F 7/168 |
| 2019/0187557 | A1 | 6/2019 | Ochimizu et al. | |

FOREIGN PATENT DOCUMENTS

| CN | 105190436 | | 12/2015 | |
|---|---|---|---|---|
| CN | 108699344 | | 10/2018 | |
| CN | 109641475 | | 4/2019 | |
| EP | 1956428 | | 8/2008 | |
| EP | 2690495 | | 1/2014 | |
| EP | 2690495 | A1 * | 1/2014 | ........... B41C 1/1008 |
| EP | 3418332 | | 12/2018 | |
| EP | 3508349 | | 7/2019 | |
| JP | 2003307844 | | 10/2003 | |
| JP | 2008191468 | | 8/2008 | |
| JP | 2009538446 | | 11/2009 | |
| JP | 2013504632 | | 2/2013 | |
| JP | 2014024278 | | 2/2014 | |
| JP | 2017132227 | A * | 8/2017 | ........... B41C 1/1008 |
| WO | 2015008578 | | 1/2015 | |
| WO | 2016027886 | | 2/2016 | |
| WO | 2017141882 | | 8/2017 | |
| WO | 2018043125 | | 3/2018 | |

OTHER PUBLICATIONS

"Search Report of Europe Counterpart Application", dated Jun. 3, 2020, p. 1-p. 9.
"International Search Report (Form PCT/ISA/210) of PCT/JP2018/024962," dated Aug. 21, 2018, with English translation thereof, pp. 1-5.
"Written Opinion of the International Searching Authority (Form PCT/ISA/237) of PCT/JP2018/024962," dated Aug. 21, 2018, with English translation thereof, pp. 1-15.
"Office Action of China Counterpart Application", dated Dec. 31, 2020, with English translation thereof, p. 1-p. 14.
"Office Action of China Counterpart Application" with English translation thereof, dated Jun. 23, 2021, p. 1-p. 9.

* cited by examiner

*Primary Examiner* — Chanceity N Robinson
(74) *Attorney, Agent, or Firm* — JCIPRNET

(57) ABSTRACT

A lithographic printing plate precursor has an image-recording layer on a hydrophilic support, in which the image-recording layer contains an infrared absorbing dye that decomposes by exposure to an infrared ray and a color developer that develops color due to the exposure to an infrared ray. A method for producing a lithographic printing plate includes image-exposing the lithographic printing plate precursor using an infrared laser.

17 Claims, No Drawings

LITHOGRAPHIC PRINTING PLATE PRECURSOR AND METHOD FOR PRODUCING LITHOGRAPHIC PRINTING PLATE

CROSS REFERENCE TO RELATED APPLICATION

This is a continuation of International Application No. PCT/JP2018/024962 filed on Jun. 29, 2018, and claims priority from Japanese Patent Application No. 2017-129814 filed on Jun. 30, 2017, the entire disclosures of which are incorporated herein by reference.

BACKGROUND OF THE INVENTION

1. Field of the Invention

The present invention relates to a lithographic printing plate precursor and a method for producing a lithographic printing plate.

2. Description of the Related Art

Generally, a lithographic printing plate includes a lipophilic image area that receives ink in a printing process and a hydrophilic non-image area that receives dampening water. Lithographic printing is a method in which the properties of water and oil-based ink that repel each other are used, the lipophilic image area of the lithographic printing plate is used as an ink-receiving portion, the hydrophilic non-image area is used as a dampening water-receiving portion (non-ink-receiving portion), a difference in the adhesive property of ink to the surface of the lithographic printing plate is caused, the ink is inked only in the image area, and then the ink is transferred to a body to be printed such as paper, thereby carrying out printing.

At the moment, in a plate making step of producing a lithographic printing plate from a lithographic printing plate precursor, image exposure is carried out using a computer to plate (CTP) technology. That is, image exposure is directly carried out on a lithographic printing plate precursor by means of scanning, exposure, or the like using a laser or a laser diode without using a lith film.

Meanwhile, due to the intensifying interest in the global environment, regarding the plate making of lithographic printing plate precursors, an environmental issue of waste liquid generated by wet processes such as a development process has gathered attention, and accordingly, there have been attempts to simplify or remove development processes. As one of simple development processes, a method called "on-machine development" has been proposed. The on-machine development refers to a method in which, after the image exposure of a lithographic printing plate precursor, a wet-type development process of the related art is not carried out, and instead, the lithographic printing plate precursor is attached to a printer, and non-image areas in an image-recording layer are removed at the initial phase of an ordinary printing step.

Generally, as a previous step of attaching the lithographic printing plate to the printer, an operation of inspecting and identifying an image on the lithographic printing plate (the inspection of the plate) in order to check whether image is recorded as intended on the lithographic printing plate is carried out. Particularly, in polychromatic printing, the capability of determining a register mark which serves as a mark for registration is critical in printing operations.

In lithographic printing plate precursors that are subjected to an ordinary development process step, a colored image is obtained by a development process in which an image-recording layer is colored, and thus it is possible to easily check the image before a lithographic printing plate is attached to a printer.

Meanwhile, in on-machine development-type or process-less (development-less)-type lithographic printing plate precursors that are not subjected to an ordinary development process step, it is difficult to check an image on the lithographic printing plate precursor in a phase of attaching the lithographic printing plate precursor to a printer, and thus it is impossible to sufficiently inspect the plate. Therefore, for on-machine development-type or process-less (development-less)-type lithographic printing plate precursors, there is a demand for means for checking an image in a phase of being exposed, that is, the formation of a so-called print-out image in which an exposed region develops or does not develop a color. Furthermore, from the viewpoint of improving workability, it is also critical that an exposed region which develops or does not develop a color does not change even after the elapsing of time and maintains a state of developing or not developing a color.

WO2016/027886A describes a color developing composition containing a compound having a specific structure which decomposes by exposure to heat or an infrared ray and generates a color developing body, a lithographic printing plate precursor containing this color developing composition in an image-recording layer, and a method for making a plate in which this lithographic printing plate precursor is used.

JP2009-538446A describes an image-forming element having an image-forming layer including a radical polymerizable component, an iodonium borate initiator composition having a specific structure, a radiation-absorbing compound, a polymer binder, and a leuco dye color developer having a specific structure on substrate, and a method for making a plate in which this image-forming element is used.

SUMMARY OF THE INVENTION

An object that the invention intends to achieve is to provide a lithographic printing plate precursor providing a lithographic printing plate which is excellent in terms of visibility (plate inspection property) by color development, is capable of maintaining excellent visibility (plate inspection property) even after aged, has excellent white light stability, and is excellent in terms of printing resistance and tone reproducibility and a method for producing a lithographic printing plate in which the lithographic printing plate precursor is used.

Means for achieving the above-described object will be described below.

(1) A lithographic printing plate precursor comprising: an image-recording layer on a hydrophilic support, in which the image-recording layer contains an infrared absorbing dye that decomposes by exposure to an infrared ray and a color developer that develops color due to the exposure to an infrared ray.

(2) The lithographic printing plate precursor according to (1), in which the infrared absorbing dye is an infrared absorbing dye that decomposes by migration of an electron due to the exposure to an infrared ray.

(3) The lithographic printing plate precursor according to (1) or (2), in which the infrared absorbing dye is a cyanine dye.

(4) The lithographic printing plate precursor according to (3), in which the cyanine dye is a cyanine dye represented by Formula 1.

Formula 1

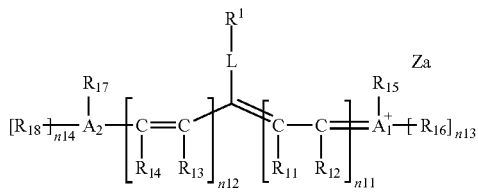

In Formula 1, $R^1$ represents a group in which an $R^1$-L bond is cleaved by exposure to an infrared ray. $R_{11}$ to $R_{18}$ each independently represent a hydrogen atom, a halogen atom, —Ra, —ORb, -SRc, or -NRdRe. Ra to Re each independently represent a hydrocarbon group. $A_1$, $A_2$, and a plurality of $R_{11}$ to $R_{18}$ may be linked to each other to form a monocycle or a polycycle. $A_1$ and $A_2$ each independently represent an oxygen atom, a sulfur atom, or a nitrogen atom. $n_{11}$ and $n_{12}$ each independently represent an integer of 0 to 5. However, a total of $n_{11}$ and $n_{12}$ is 2 or more. $n_{13}$ and $n_{14}$ each independently represent 0 or 1. L represents an oxygen atom, a sulfur atom, or —$NR_{10}$—. $R_{10}$ represents a hydrogen atom, an alkyl group, or an aryl group. Za represents a counter ion that neutralizes a charge.

(5) The lithographic printing plate precursor according to (3) or (4), in which the cyanine dye is a cyanine dye represented by Formula 2.

Formula 2

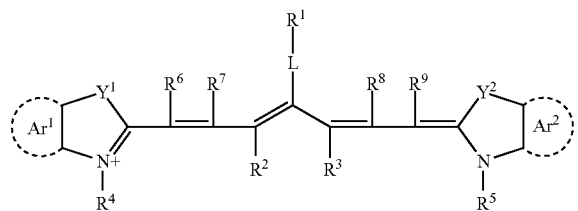

In Formula 2, $R^1$ represents a group in which an $R^1$-L bond is cleaved by exposure to an infrared ray. $R^2$ and $R^3$ each independently represent a hydrogen atom or an alkyl group or $R^2$ and $R^3$ may be linked to each other to form a ring. $Ar^1$ and $Ar^2$ each independently represent a group forming a benzene ring or a naphthalene ring. $Y^1$ and $Y^2$ each independently represent an oxygen atom, a sulfur atom, —$NR^0$—, or a dialkyl methylene group. $R^0$ represents a hydrogen atom, an alkyl group, or an aryl group. $R^4$ and $R^5$ each independently represent an alkyl group, a —$CO_2M$ group, or a —$PO_3M_2$ group. M represents a hydrogen atom, a Na atom, a K atom, or an onium group. $R^6$ to $R^9$ each independently represent a hydrogen atom or an alkyl group. L represents an oxygen atom, a sulfur atom, or —$NR^{10}$—. $R^{10}$ represents a hydrogen atom, an alkyl group, or an aryl group. Za represents a counter ion that neutralizes a charge.

(6) The lithographic printing plate precursor according to (5), in which, in Formula 2, $R^4$ and $R^5$ each are independently an unsubstituted alkyl group.

(7) The lithographic printing plate precursor according to (5) or (6), in which, in Formula 2, L represents a sulfur atom or —$NR^{10}$—, and $R^{10}$ represents an alkyl group, or an aryl group.

(8) The lithographic printing plate precursor according to (7), in which, in Formula 2, (a) L represents a sulfur atom, and $R^1$ is a group represented by Formula (2-1) or (b) L represents —$NR^{10}$—, and $R^1$ that bonds to N is a group represented by Formula (3-1).

Formula (2-1)

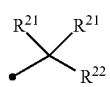

In Formula (2-1), represents a bonding site with a sulfur atom represented by L in Formula 2, $R^{21}$'s each independently represent a hydrogen atom, an alkyl group, or an aryl group, and $R^{22}$ represents an aryl group, an alkenyl group, an alkoxy group, or an onium group.

Formula (3-1)

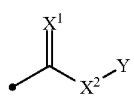

In Formula (3-1), represents a bonding site with a, nitrogen atom included in L in Formula 2, $X^1$ and $X^2$ each independently represent an oxygen atom or a sulfur atom, and Y represents a group represented by Formula (2-1).

(9) The lithographic printing plate precursor according to (1), in which the color developer is a heat color developer.

(10) The lithographic printing plate precursor according to (9), in which the heat color developer is at least one compound selected from a spiropyran compound, a spirooxazine compound, a spirolactone compound, and a spirolactam compound.

(11) The lithographic printing plate precursor according to (1), in which the color developer is an acid color developer, and the image-recording layer further contains an acid-generating agent.

(12) The lithographic printing plate precursor according to (11), in which the acid color developer is at least one compound selected from a spiropyran compound, a spirooxazine compound, a spirolactone compound, and a spirolactam compound.

(13) The lithographic printing plate precursor according to (11), in which the acid color developer is a spirolactone compound represented by Formula 3.

Formula 3

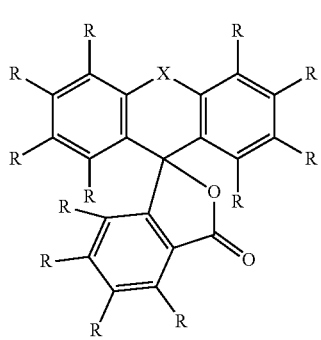

In Formula 3, X represents an oxygen atom, a sulfur atom, or —$NR^{19}$—, $R^{19}$ represents a hydrogen atom, an alkyl group, or an aryl group. R's each independently represent a hydrogen atom or a monovalent substituent.

(14) The lithographic printing plate precursor according to (13), in which, in Formula 3, X is an oxygen atom.

(15) The lithographic printing plate precursor according to (11), in which the acid-generating agent is an electron-donating acid-generating agent.

(16) The lithographic printing plate precursor according to (11), in which the acid-generating agent is an electron-accepting acid-generating agent.

(17) The lithographic printing plate precursor according to (11), in which the acid-generating agent is made up of an electron-donating acid-generating agent and an electron-accepting acid-generating agent.

(18) The lithographic printing plate precursor according to (15) or (17), in which the electron-donating acid-generating agent is a borate compound.

(19) The lithographic printing plate precursor according to any one of (1) to (18), in which the image-recording layer further contains a polymerizable compound.

(20) The lithographic printing plate precursor according to any one of (1) to (19), in which the image-recording layer further contains a polymer particle.

(21) The lithographic printing plate precursor according to any one of (1) to (20), in which the image-recording layer further contains a binder polymer.

(22) A method for producing a lithographic printing plate comprising: a step of image-exposing the lithographic printing plate precursor according to any one of (1) to (21) using an infrared laser; and a step of removing a non-exposed portion of the image-recording layer using at least one selected from printing ink and dampening water on a printer.

According to the present invention, it is possible to provide a lithographic printing plate precursor providing a lithographic printing plate which is excellent in terms of visibility (plate inspection property) by color development, is capable of maintaining excellent visibility (plate inspection property) even after aged, has excellent white light stability, and is excellent in terms of printing resistance and tone reproducibility and a method for producing a lithographic printing plate in which the lithographic printing plate precursor is used.

DESCRIPTION OF THE PREFERRED EMBODIMENTS

Hereinafter, the present invention will be described in detail.

In the present specification, regarding the expression of a group in a compound represented by a formula, in a case in which a group that is not described to be "substituted" or "unsubstituted" is capable of further having a substituent, unless particularly otherwise described, the group refers not only to an unsubstituted group but also to a group having a substituent. For example, in a formula, the expression "R represents an alkyl group, an aryl group, or a heterocyclic group" means that "R represents an unsubstituted alkyl group, a substituted alkyl group, an unsubstituted aryl group, a substituted aryl group, an unsubstituted heterocyclic group, or a substituted heterocyclic group".

In the present specification, the terminology "(meth) acrylate" refers to "at least any of acrylate and methacrylate". The above description will be also true for "a (meth) acryloyl group", "a (meth)acrylic acid", "a (meth)acrylic resin", and the like.

[Lithographic Printing Plate Precursor]

A lithographic printing plate precursor of an embodiment of the present invention is a lithographic printing plate precursor having an image-recording layer on a hydrophilic support, in which the image-recording layer contains an infrared absorbing dye that decomposes by exposure to an infrared ray and a color developer that develops color due to the exposure to an infrared ray.

A lithographic printing plate can be produced by image-exposing the lithographic printing plate precursor of the embodiment of the present invention using an infrared laser and then supplying at least any of dampening water and printing ink on a printer to remove a non-exposed portion of the image-recording layer.

[Image-Recording Layer]

The image-recording layer in the lithographic printing plate precursor of the embodiment of the present invention contains an infrared absorbing dye that decomposes by exposure to an infrared ray and a color developer that develops color due to the exposure to an infrared ray.

The infrared absorbing dye that decomposes by exposure to an infrared ray (hereinafter, also simply referred to as "decomposable infrared absorbing dye") and the color developer that develops color due to the exposure to an infrared ray (hereinafter, also simply referred to as "color developer") which are included in the image-recording layer will be described below in detail.

<Decomposable Infrared Absorbing Dye>

The decomposable infrared absorbing dye contained in the image-recording layer is an infrared absorbing dye having a function of absorbing an infrared ray, decomposing, and developing color by exposure to the infrared ray. Here, the expression "developing color" means that the infrared absorbing dye rarely absorbs light in the visible light range (a wavelength range of 400 to 750 nm) before the exposure to an infrared ray, but begins to absorb light in the visible light range by the exposure to an infrared ray, which includes the elongation of a wavelength by which light in a wavelength range lower than the visible light range is absorbed.

Hereinafter, a color-developed compound formed of the decomposable infrared absorbing dye that absorbs an infrared ray and decomposes by exposure to an infrared ray will also be referred to as "the color developing body of the decomposable infrared absorbing dye".

In addition, the decomposable infrared absorbing dye has a function of absorbing an infrared ray by exposure to an infrared ray and converting the absorbed infrared ray into heat.

The decomposable infrared absorbing dye is preferably an infrared absorbing dye that decomposes by the migration of an electron due to exposure to an infrared ray. Here, the expression "decomposing by the migration of an electron" means that an electron excited from the highest occupied molecular orbital (HOMO) to the lowest occupied molecular orbital (LUMO) of the decomposable infrared absorbing dye by exposure to an infrared ray migrates into the molecule of an electron-accepting group (a group having a similar potential to LUMO) in the molecule and, accordingly, the infrared absorbing dye decomposes.

As a preferred example of the decomposable infrared absorbing dye, a cyanine dye that decomposes by exposure to an infrared ray is exemplified.

The cyanine dye that decomposes by exposure to an infrared ray includes a cyanine dye represented by Formula 1.

Formula 1

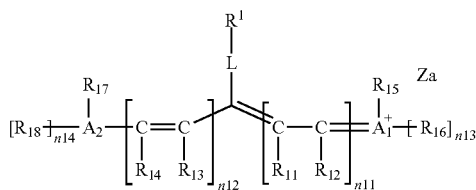

In Formula 1, $R^1$ represents a group in which an $R^1$-L bond is cleaved by exposure to an infrared ray. $R_{11}$ to $R_{18}$ each independently represent a hydrogen atom, a halogen atom, —Ra, —ORb, -SRc, or -NRdRe. Ra to Re each independently represent a hydrocarbon group. $A_1$, $A_2$, and a plurality of $R_{11}$ to $R_{18}$ may be linked to each other to form a monocycle or a polycycle. $A_1$ and $A_2$ each independently represent an oxygen atom, a sulfur atom, or a nitrogen atom. $n_{11}$ and $n_{12}$ each independently represent an integer of 0 to 5. Here, a total of $n_{11}$ and $n_{12}$ is 2 or more. $n_{13}$ and $n_{14}$ each independently represent 0 or 1. L represents an oxygen atom, a sulfur atom, or —$NR_{10}$—. $R_{10}$ represents a hydrogen atom, an alkyl group, or an aryl group. Za represents a counter ion that neutralizes a charge.

In a case in which the cyanine dye represented by Formula 1 is exposed to an infrared ray, an $R^1$-L bond is cleaved, and L turns into =O, =S, or =$NR_{10}$, thereby forming the color developing body of the decomposable infrared absorbing dye. $R^1$ separates and forms a radical body or an ion body. These bodies contribute to the polymerization of a polymerizable compound included in the image-recording layer.

In Formula 1, $R_{11}$ to $R_{18}$ each are independently preferably a hydrogen atom, —$R^a$, —$OR^b$, -SRc, or -NRdRe.

The hydrocarbon group as Ra to Re is preferably a hydrocarbon group having 1 to 30 carbon atoms, more preferably a hydrocarbon group having 1 to 15 carbon atoms, and still more preferably a hydrocarbon group having 1 to 10 carbon atoms. The hydrocarbon group may have a linear shape, have a branch, or have a ring structure.

In Formula 1, $R_{11}$ to $R_{14}$ each are independently preferably a hydrogen atom or an alkyl group and more preferably a hydrogen atom.

In addition, $R_{11}$ and $R_{13}$ that bond to a carbon atom that bonds with a carbon atom to which L bonds are preferably an alkyl group, and it is more preferable that both are linked to each other to form a ring. The above-described ring being formed is preferably a five-membered ring or a six-membered ring and more preferably a five-membered ring.

It is preferable that $R_{12}$ that bonds to a carbon atom to which $A_1^+$ bonds and $R_{14}$ that bonds to a carbon atom to which $A_2$ bonds each are linked with $R_{15}$ and $R_{17}$ to form a ring.

$R_{15}$ in Formula 1 is preferably a hydrocarbon group. In addition, $R_{15}$ and $R_{12}$ that bonds to the carbon atom to which $A^{1+}$ bonds are preferably linked to each other to form a ring. The ring being formed is preferably an indolium ring, a pyrylium ring, a thiopyrylium ring, a benzoxazoline ring, or a benzimidazoline ring, and, from the viewpoint of the color developability, more preferably an indole ring.

$R_{17}$ in Formula 1 is preferably a hydrocarbon group. In addition, $R_{17}$ and $R_{14}$ that bonds to the carbon atom to which $A_2$ bonds are preferably linked to each other to form a ring. The ring being formed is preferably an indole ring, a pyran ring, a thiopyran ring, a benzoxazole ring, or a benzimidazole ring, and, from the viewpoint of the color developability, more preferably an indole ring.

$R_{15}$ and $R_{17}$ in Formula 1 are preferably the same group and, in the case of forming a ring respectively, preferably form the same ring.

$R_{16}$ and $R_{18}$ in Formula 1 are preferably the same group.

Furthermore, from the viewpoint of improving the water solubility of the compound represented by Formula 1, $R_{16}$ and $R_{18}$ each independently are preferably an alkyl group having a (poly)oxyalkylene group or an alkyl group having an anion structure, more preferably an alkyl group having an alkoxyalkyl group, a carboxylate group, or a sulfonate group, and still more preferably an alkyl group having a sulfonate group at a terminal. The alkyl group is preferably an alkyl group having 1 to 10 carbon atoms and more preferably an alkyl group having 1 to 4 carbon atoms.

A counter cation of the anion structure may be a cation or $A_1^+$ included in $R^1$-L in Formula 1 and may be an alkali metal cation or an alkaline earth metal cation.

A counter cation of the sulfonate group may be a cation or $A_1^+$ included in $R^1$-L in Formula 1 and may be an alkali metal cation or an alkaline earth metal cation.

In addition, from the viewpoint of an increase in the maximum absorption wavelength of the compound represented by Formula 1, the color developability, and the printing resistance of lithographic printing plates, $R_{16}$ and $R_{18}$ each independently are preferably an alkyl group or an alkyl group having an aromatic ring. The alkyl group is preferably an alkyl group having 1 to 10 carbon atoms, more preferably an alkyl group having 1 to 4 carbon atoms, and still more preferably a methyl group or an ethyl group. The alkyl group having an aromatic ring is preferably an alkyl group having an aromatic ring at a terminal and more preferably a 2-phenylethyl group, a 2-naphthaleneethyl group, or a 2-(9-anthracenyl)ethyl group.

$n_{11}$ and $n_{12}$ in Formula 1 represent the same integer of 0 to 5, are preferably an integer of 1 to 3, more preferably 1 or 2, and still more preferably 2.

$A_1$ and $A_2$ in Formula 1 each are independently an oxygen atom, a sulfur atom, or a nitrogen atom and preferably represent a nitrogen atom.

$A_1$ and $A_2$ in Formula 1 are preferably the same atom.

Za in Formula 1 represents a counter ion that neutralizes a charge. In a case in which Za represents an anion, examples thereof include a sulfonate ion, a carboxylate ion, a tetrafluoroborate ion, a hexafluorophosphate ion, a p-toluenesulfonate ion, a perchlorate ion, and the like, and a hexafluorophosphate ion is preferred. In a case in which Za represents a cation, an alkali metal ion, an alkaline earth metal ion, an ammonium ion, a pyridinium ion, or a sulfonium ion is preferred, a sodium ion, a potassium ion, an ammonium ion, a pyridinium ion, a sulfonium ion, or the like is preferred, and a sodium ion, a potassium ion, or an ammonium ion is more preferred.

$R_{11}$ to $R_{18}$ and $R^1$-L may have an anion structure or a cation structure, and, in a case in which all of $R_{11}$ to $R_{18}$ and $R^1$-L are electrically neutral groups, Za is a monovalent counter anion, and, for example, in a case in which $R_{11}$ to $R_{18}$ and $R^1$-L have two or more anion structures, Za may also become a counter cation.

In addition, in a case in which the compound represented by Formula 1 is a structure that is electrically neutral in the entire compound, Za is not present.

In Formula 1, the group in which an $R^1$-L bond is cleaved by exposure to an infrared ray, which is represented by $R^1$, will be described below in detail.

The cyanine dye that decomposes by exposure to an infrared ray is preferably a cyanine dye represented by Formula 2.

Formula 2

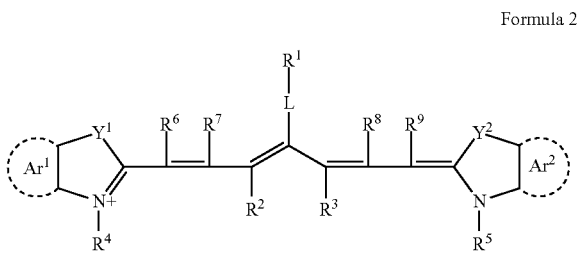

In Formula 2, $R^1$ represents a group in which an $R^1$-L bond is cleaved by exposure to an infrared ray. $R^2$ and $R^3$ each independently represent a hydrogen atom or an alkyl group or $R^2$ and $R^3$ may be linked to each other to form a ring. $Ar^1$ and $Ar^2$ each independently represent a group forming a benzene ring or a naphthalene ring. $Y^1$ and $Y^2$ each independently represent an oxygen atom, a sulfur atom, —$NR^0$—, or a dialkyl methylene group. $R^0$ represents a hydrogen atom, an alkyl group, or an aryl group. $R^4$ and $R^5$ each independently represent an alkyl group, a —$CO_2M$ group, or a —$PO_3M_2$ group. M represents a hydrogen atom, a Na atom, a K atom, or an onium group. $R^6$ to $R^9$ each independently represent a hydrogen atom or an alkyl group. L represents an oxygen atom, a sulfur atom, or —$NR^{10}$—. $R^{10}$ represents a hydrogen atom, an alkyl group, or an aryl group. Za represents a counter ion that neutralizes a charge.

In Formula 2, the alkyl group as $R^2$ to $R^9$ and $R^0$ is preferably an alkyl group having 1 to 30 carbon atoms, more preferably an alkyl group having 1 to 15 carbon atoms, and still more preferably an alkyl group having 1 to 10 carbon atoms. The alkyl group may have a linear shape or a branch and may have a ring structure.

Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

Among these alkyl groups, a methyl group, an ethyl group, a propyl group, and a butyl group are preferred.

In addition, the alkyl group may have a substituent. Examples of the substituent include an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, a group formed of a combination thereof, and the like.

The aryl group as $R^0$ is preferably an aryl group having 6 to 30 carbon atoms, more preferably an aryl group having 6 to 20 carbon atoms, and still more preferably an aryl group having 6 to 12 carbon atoms.

The aryl group may have a substituent. Examples of the substituent include an alkyl group, an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, a group formed of a combination thereof, and the like.

Specific examples thereof include a phenyl group, a naphthyl group, a p-tolyl group, a p-chlorophenyl group, a p-fluorophenyl group, a p-methoxyphenyl group, a p-dimethylaminophenyl group, a p-methyl thiophenyl group, a p-phenylthiophenyl group, and the like.

Among these aryl groups, a phenyl group, a p-methoxyphenyl group, a p-dimethylaminophenyl group, or a naphthyl group is preferred.

$R^2$ and $R^3$ are preferably linked to each other to form a ring.

In a case in which $R^2$ and $R^3$ are linked to each other to form a ring, a five-membered ring or a six-membered ring is preferred, and a five-membered ring is particularly preferred.

$Y^1$ and $Y^2$ each independently represent an oxygen atom, a sulfur atom, —$NR^0$—, or a dialkyl methylene group and are preferably —$NR^0$— or a dialkyl methylene group and more preferably a dialkyl methylene group.

$R^0$ represents a hydrogen atom, an alkyl group, or an aryl group and is preferably an alkyl group.

The alkyl group represented by $R^4$ or $R^5$ may be a substituted alkyl group. As the substituted alkyl group represented by $R^4$ or $R^5$, groups represented by Formulae (a1) to (a3) are exemplified.

 Formula (a1)

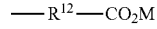 Formula (a2)

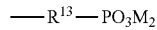 Formula (a3)

In Formulae (a1) to (a3), $R^{10}$ represents an alkylene group having 2 to 6 carbon atoms. W represents a single bond or an oxygen atom. n1 represents an integer of 1 to 45. $R^{11}$ represents an alkyl group having 1 to 12 carbon atoms or —C(=O)—$R^{14}$. $R^{14}$ represents an alkyl group having 1 to 12 carbon atoms. $R^{12}$ and $R^{13}$ each independently represent a single bond or an alkylene group having 1 to 12 carbon atoms. M represents a hydrogen atom, a Na atom, a K atom, or an onium group.

In Formula (a1), specific examples of the alkylene group represented by $R^{10}$ include an ethylene group, an n-propylene group, an isopropylene group, an n-butylene group, an isobutylene group, an n-pentylene group, an isopentylene group, an n-hexyl group, an isohexyl group, and the like, an ethylene group, an n-propylene group, an isopropylene group, and an n-butylene group are preferred, and an n-propylene group is particularly preferred.

n1 is preferably 1 to 10, more preferably 1 to 5, and particularly preferably 1 to 3.

Specific examples of the alkyl group represented by $R^{11}$ include a methyl group, an ethyl group, an n-propyl group, an isopropyl group, an n-butyl group, an isobutyl group, a tert-butyl group, an n-pentyl group, an isopentyl group, a neopentyl group, an n-hexyl group, an n-octyl group, an n-dodecyl group, and the like, a methyl group, an ethyl group, an n-propyl group, an isopropyl group, an n-butyl group, and a tert-butyl group are preferred, a methyl group and an ethyl group are more preferred, and a methyl group is particularly preferred.

The alkyl group represented by $R^{14}$ is identical to the alkyl group represented by $R^{11}$, and a preferred aspect thereof is also identical to the preferred aspect of the alkyl group represented by $R^{11}$.

Specific examples of the group represented by Formula (a1) will be illustrated below, but the present invention is not limited thereto. In the following structural formulae, Me represents a methyl group, Et represents an ethyl group, and * represents a bonding site.

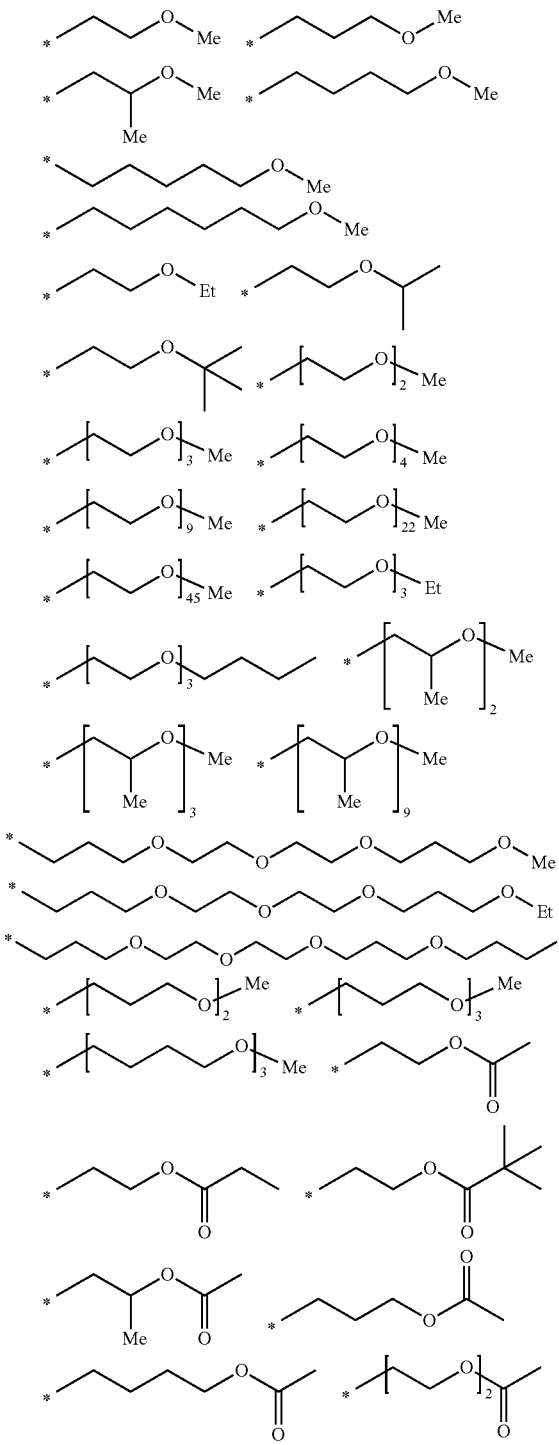

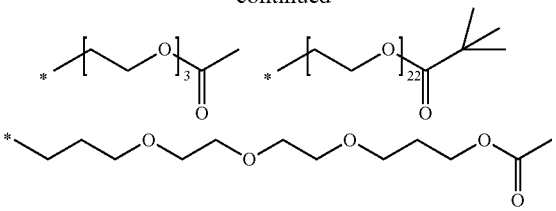

In Formula (a2) or (a3), specific examples of the alkylene group represented by $R^{12}$ or $R^{13}$ include a methylene group, an ethylene group, an n-propylene group, an isopropylene group, an n-butylene group, an isobutylene group, an n-pentylene group, an isopentylene group, an n-hexyl group, an isohexyl group, an n-octylene group, an n-dodecylene group, and the like, an ethylene group, an n-propylene group, an isopropylene group, and an n-butylene group are preferred, and an ethylene group and an n-propylene group are particularly preferred.

In Formula (a3), the two existing M's may be identical to or different from each other.

In Formula (a2) or (a3), as the onium group represented by M, an ammonium group, an iodonium group, a phosphonium group, a sulfonium group, and the like are exemplified.

Among the groups represented by Formulae (a1) to (a3), the group represented by Formula (a1) is preferred.

In Formula 2, $R^4$ and $R^5$ each are preferably an unsubstituted alkyl group. $R^4$ and $R^5$ are preferably the same group.

$R^6$ to $R^9$ each are independently a hydrogen atom or an alkyl group and are preferably a hydrogen atom.

$Ar^1$ and $Ar^2$ each independently represent a group forming a benzene ring or a naphthalene ring. The benzene ring or the naphthalene ring may have a substituent. Examples of the substituent include an alkyl group, an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, an acyloxy group, a phosphonic acid group, a group formed of a combination thereof, and the like. As the substituent, an alkyl group is preferred.

In addition, from the viewpoint of an increase in the maximum absorption wavelength of the compound represented by Formula 2 and the improvement of color developability and printing resistance in lithographic printing plates, $Ar^1$ and $Ar^2$ each are independently preferably a group forming a naphthalene ring or a benzene ring having an alkyl group or an alkoxy group as a substituent, more preferably a group forming a naphthalene ring or a benzene ring having an alkoxy group as a substituent, and particularly preferably a group forming a naphthalene ring or a benzene ring having a methoxy group as a substituent.

In Formula 2, $Ar^1$ or $Ar^2$ is preferably a group forming a group represented by Formula (b1).

Formula (b1)

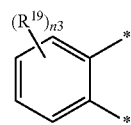

In Formula (b1), $R^{19}$ represents an alkyl group having 1 to 12 carbon atoms. n3 represents an integer of 1 to 4. * represents a bonding site.

Za represents a counter ion for neutralizing a charge. Here, in a case in which the compound represented by Formula 2 has a corresponding ionic substituent in the structure, and the neutralization of a charge is not necessary, Za is not required. In a case in which Za represents an anion, examples thereof include a sulfonate ion, a carboxylate ion, a tetrafluoroborate ion, a hexafluorophosphate ion, a p-toluenesulfonate ion, a perchlorate ion, and the like, and a hexafluorophosphate ion is preferred. In a case in which Za represents a cation, examples thereof include an alkali metal ion, an alkaline earth metal ion, an ammonium ion, a pyridinium ion, a sulfonium ion, and the like, a sodium ion, a potassium ion, an ammonium ion, a pyridinium ion, or a sulfonium ion is preferred, and a sodium ion, a potassium ion, or an ammonium ion is more preferred.

$R^1$ to $R^9$, $R^0$, $Ar^1$, $Ar^2$, $Y^1$, and $Y^2$ may have an anion structure or a cation structure, and, in a case in which all of $R^1$ to $R^9$, $R^0$, $Ar^2$, $Y^1$, and $Y^2$ are electrically neutral groups, Za is a monovalent counter anion, and, for example, in a case in which $R^1$ to $R^9$, $R^0$, $Ar^2$, $Y^1$, and $Y^2$ have two or more anion structures, Za is also capable of becoming a counter cation.

In Formula 1 and Formula 2, the group in which an $R^1$-L bond is cleaved by exposure to an infrared ray, which is represented by $R^1$, will be described below.

In a case in which L is an oxygen atom in Formula 1 or Formula 2, from the viewpoint of color developability, $R^1$ is preferably a group represented by any of Formulae (1-1) to (1-7) and more preferably a group represented by any of Formulae (1-1) to (1-3).

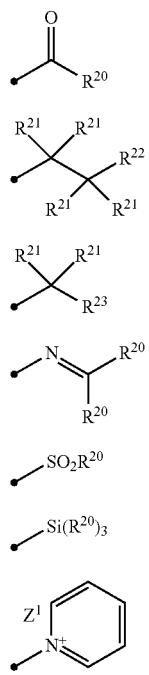

In Formulae (1-1) to (1-7), represents a bonding site with the oxygen atom represented by L in Formula 1 or Formula 2, $R^{20}$'s each independently represent a hydrogen atom, an alkyl group, an alkenyl group, an aryl group, —$OR^{24}$, —$NR^{25}R^{26}$, or —$SR^{27}$, $R^{21}$'s each independently represent a hydrogen atom, an alkyl group, or an aryl group, $R^{22}$ represents an aryl group, —$OR^{24}$, —$NR^{25}R^{26}$, —$SR^{27}$, —$C(=O)R^{28}$, —$OC(=O)R^{28}$, or a halogen atom, $R^{23}$ represents an aryl group, an alkenyl group, an alkoxy group, or an onium group, $R^{24}$ to $R^{27}$ each independently represent a hydrogen atom, an alkyl group, or an aryl group, $R^{28}$ represents an alkyl group, an aryl group, —$OR^{24}$, —$NR^{25}R^{26}$, or —$SR^{27}$, and $Z^1$ represents a counter ion for neutralizing a charge.

In a case in which $R^{20}$, $R^{21}$, are alkyl groups, the preferred aspects thereof are identical to the preferred aspects of the alkyl group as $R^2$ to $R^9$ and $R^0$.

The number of carbon atoms in the alkenyl group as $R^{20}$ and $R^{23}$ is preferably 1 to 30, more preferably 1 to 15, and still more preferably 1 to 10.

In a case in which $R^{20}$ to $R^{28}$ are aryl groups, the preferred aspects thereof are identical to the preferred aspects of the aryl group as $R^0$.

From the viewpoint of color developability, $R^{20}$ in Formula (1-1) is preferably an alkyl group, an alkenyl group, an aryl group, —$OR^{24}$, —$NR^{25}R^{26}$, or —$SR^{27}$, more preferably an alkyl group, —$OR^{24}$, —$NR^{25}R^{26}$, or —$SR^{27}$, still more preferably an alkyl group or —$OR^{24}$, and particularly preferably —$OR^{24}$.

In addition, in a case in which $R^{20}$ in Formula (1-1) is an alkyl group, the alkyl group may be an alkyl group having an arylthio group, an alkyloxycarbonyl group, or, an arylsulfonyl group at the α-position and is preferably an alkyl group having an arylthio group or an alkyloxycarbonyl group at the α-position.

In a case in which $R^{20}$ in Formula (1-1) is —$OR^{24}$, $R^{24}$ is preferably an alkyl group, more preferably an alkyl group having 1 to 8 carbon atoms, still more preferably an isopropyl group or a tert-butyl group, and particularly preferably a t-butyl group.

In a case in which $R^{20}$ in Formula (1-1) is -an alkenyl group, the alkenyl group may be an alkenyl group having an aryl group or a hydroxyaryl group.

From the viewpoint of color developability, $R^{21}$ in Formula (1-2) is preferably a hydrogen atom.

In addition, from the viewpoint of color developability, $R^{22}$ in Formula (1-2) is preferably —$C(=O)OR^{24}$, —$OC(=O)OR^{24}$, or a halogen atom and more preferably —$C(=O)OR^{24}$ or —$OC(=O)OR^{24}$. In a case in which $R^{22}$ in Formula (1-2) is —$C(=O)OR^{24}$ or —$OC(=O)OR^{24}$, $R^{24}$ is preferably an alkyl group.

From the viewpoint of color developability, $R^{21}$'s in Formula (1-3) each are independently preferably a hydrogen atom or an alkyl group, and at least one $R^{21}$ in Formula (1-3) is more preferably an alkyl group.

In addition, the alkyl group as $R^{21}$ is preferably an alkyl group having 1 to 10 carbon atoms and more preferably an alkyl group having 3 to 10 carbon atoms.

Furthermore, the alkyl group as $R^{21}$ is preferably an alkyl group having a branch, more preferably a secondary or tertiary alkyl group, and still more preferably an isopropyl group, a cyclopentyl group, a cyclohexyl group, or a tert-butyl group.

In addition, from the viewpoint of color developability, $R^{23}$ in Formula (1-3) is preferably an aryl group, an alkoxy group, or an onium group, more preferably p-dimethylaminophenyl group or a pyridinium group, and still more preferably a pyridinium group.

Examples of the onium group as $R^{23}$ include a pyridinium group, an ammonium group, a sulfonium group, and the like. The onium group may have a substituent. Examples of the substituent include an alkyl group, an aryl group, an alkoxy group, an aryloxy group, an amino group, an alkylthio group, an arylthio group, a halogen atom, a carboxy group, a sulfo group, an alkyloxycarbonyl group, an aryloxycarbonyl group, a group formed of a combination thereof, and the like, and an alkyl group, an aryl group, and a group formed of a combination thereof are preferred.

Among these, a pyridinium group is preferred, an N-alkyl-3-pyridinium group, an N-benzyl-3-pyridinium group, an N-(alkoxy polyalkyleneoxy alkyl)-3-pyridinium group, an N-alkoxycarbonylmethyl-3-pyridinium group, an N-alkyl-4-pyridinium group, an N-benzyl-4-pyridinium group, an N-(alkoxy polyalkyleneoxy alkyl)-4-pyridinium group, an N-alkoxycarbonylmethyl-4-pyridinium group, or an N-alkyl-3,5-dimethyl-4-pyridinium group is more preferred, an N-alkyl-3-pyridinium group or an N-alkyl-4-pyridinium group is still more preferred, an N-methyl-3-pyridinium group, an N-octyl-3-pyridinium group, an N-methyl-4-pyridinium group, or an N-octyl-4-pyridinium group is particularly preferred, and an N-octyl-3-pyridinium group or an N-octyl-4-pyridinium group is most preferred.

In addition, in a case in which $R^{23}$ is a pyridinium group, examples of the counter anion include a sulfonate ion, a carboxylate ion, a tetrafluoroborate ion, a hexafluorophosphate ion, a p-toluenesulfonate ion, a perchlorate ion, and the like, and a p-toluenesulfonate ion or a hexafluorophosphate ion is preferred.

From the viewpoint of color developability, $R^{20}$'s in Formula (1-4) are preferably alkyl groups or aryl groups, and it is more preferable that one of the two $R^{20}$'s is an alkyl group and the other is an aryl group. The two $R^{20}$'s may be linked to each other to form a ring.

From the viewpoint of color developability, $R^{20}$ in Formula (1-5) is preferably an alkyl group or an aryl group, more preferably an aryl group, and still more preferably a p-methylphenyl group.

From the viewpoint of color developability, $R^{20}$'s in Formula (1-6) each are independently preferably alkyl groups or aryl groups and more preferably methyl groups or phenyl groups.

From the viewpoint of color developability, $Z^1$ in Formula (1-7) may be a counter ion for neutralizing a charge and may be included in Za as the entire compound.

$Z^1$ is preferably a sulfonate ion, a carboxylate ion, a tetrafluoroborate ion, a hexafluorophosphate ion, a p-toluenesulfonate ion, or a perchlorate ion and more preferably a p-toluenesulfonate ion or a hexafluorophosphate ion.

From the viewpoint of color developability, $R^1$ is still more preferably a group represented by Formula (5).

$$*\!-\!\!\overset{R^{15}}{\underset{R^{16}}{|}}\!\!-\!E \qquad (5)$$

In Formula (5), $R^{15}$ and $R^{16}$ each independently represent a hydrogen atom, an alkyl group, or an aryl group, E represents an onium group, and * represents a bonding site with the oxygen atom represented by L in Formula 1 or Formula 2.

The alkyl group represented by $R^{15}$ or $R^{16}$ is identical to the alkyl group as $R^2$ to $R^9$ and $R^0$, and the preferred aspect is also identical to the preferred aspect of the alkyl group as $R^2$ to $R^9$ and $R^0$.

The aryl group represented by $R^{15}$ or $R^{16}$ is identical to the aryl group as $R^0$, and the preferred aspect is also identical to the preferred aspect of the aryl group as $R^0$.

The onium group represented by E is identical to the onium group as $R^{23}$, and the preferred aspect is also identical to the preferred aspect of the onium group as $R^{23}$.

In Formula (5), the onium group represented by E is preferably a pyridinium group represented by Formula (6).

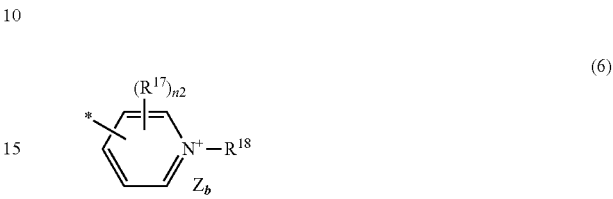

In Formula (6), $R^{17}$ represents a halogen atom, an alkyl group, an aryl group, a hydroxy group, or an alkoxy group, and, in a case in which a plurality of $R^{17}$'s is present, the plurality of $R^{17}$'s may be identical to or different from each other or the plurality of $R^{17}$'s may be linked to each other to form a ring. n2 represents an integer of 0 to 4. $R^{18}$ represents an alkyl group or an aryl group. $Z_b$ represents a counter ion for neutralizing a charge.

The alkyl group or the aryl group represented by $R^{17}$ or $R^{18}$ is identical to the alkyl group as $R^2$ to $R^9$ and $R^0$ or the aryl group as $R^0$, and the preferred aspect is also identical to the preferred aspect of the alkyl group as $R^2$ to $R^9$ and $R^0$ or the aryl group as $R^0$.

The alkoxy group represented by $R^{17}$ is preferably an alkoxy group having 1 to 10 carbon atoms, and examples thereof include a methoxy group, an ethoxy group, an n-propoxy group, an isopropoxy group, an n-butoxy group, an isobutoxy group, a tert-butoxy group, and the like.

n2 is preferably 0.

The counter ion for neutralizing a charge represented by $Z_b$ is identical to $Z^1$ in Formula (1-7), and the preferred aspect is also identical to the preferred aspect of $Z^1$ in Formula (1-7).

Hereinafter, specific examples of the group represented by $R^1$ in a case in which L is an oxygen atom in Formula 1 or Formula 2 will be illustrated, but the present invention is not limited thereto. In the following structural formulae, TsO⁻ represents a tosylate anion, and 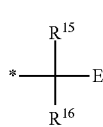 represents a bonding site with the oxygen atom represented by L in Formula 1 or Formula 2.

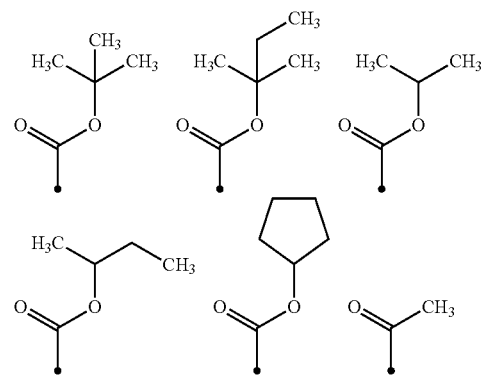

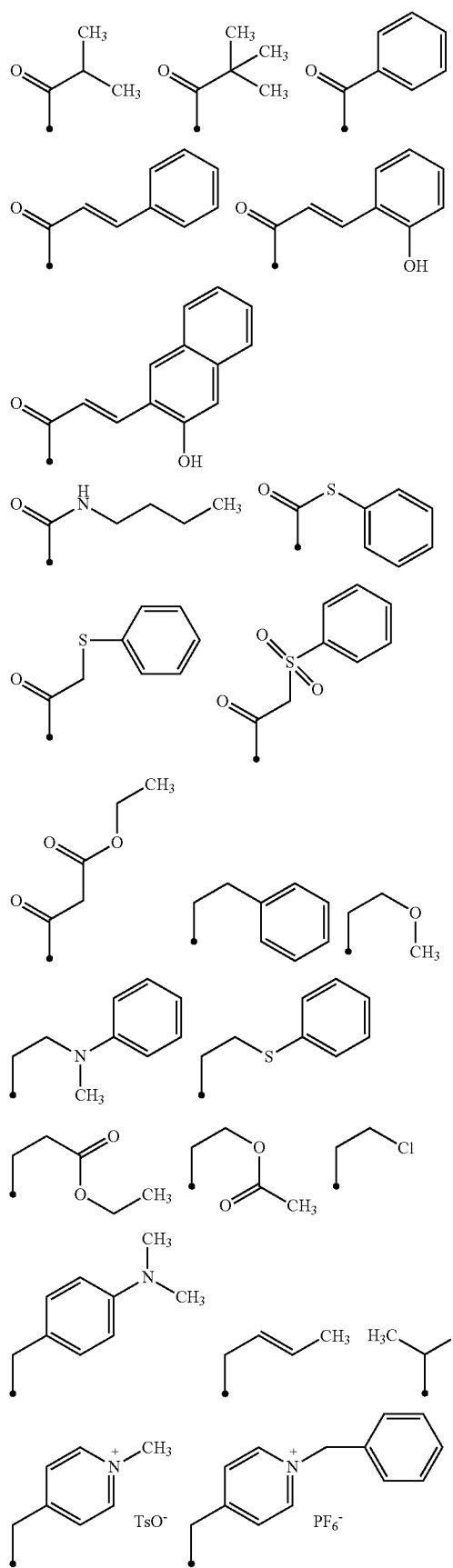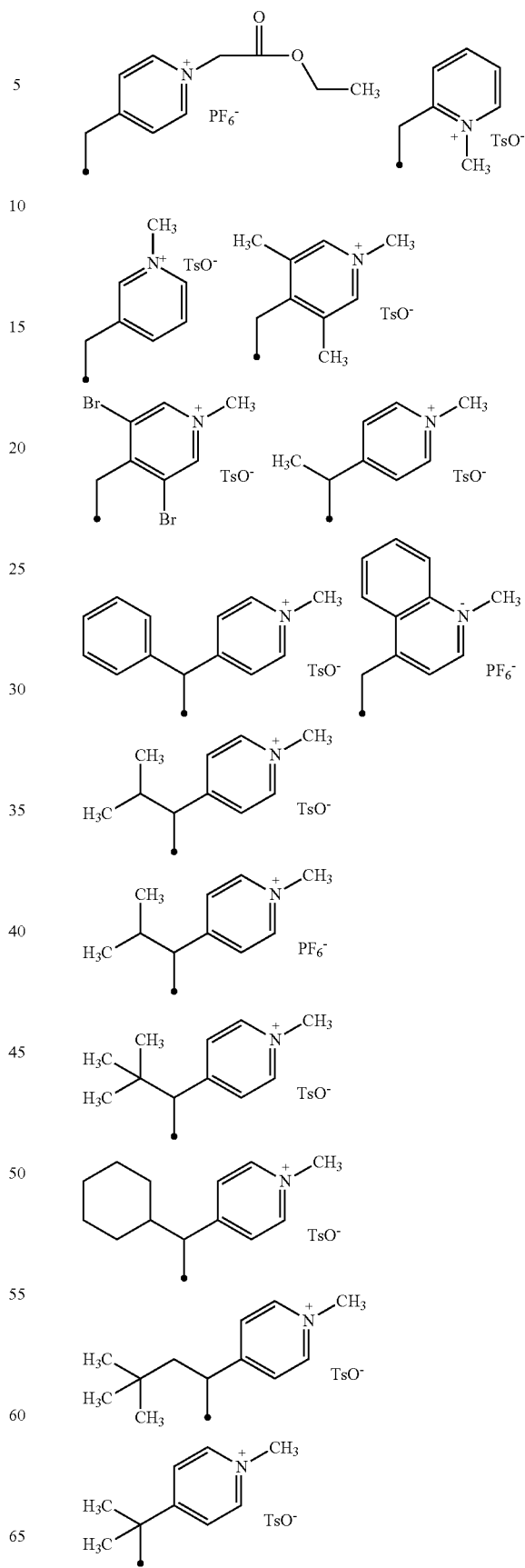

-continued
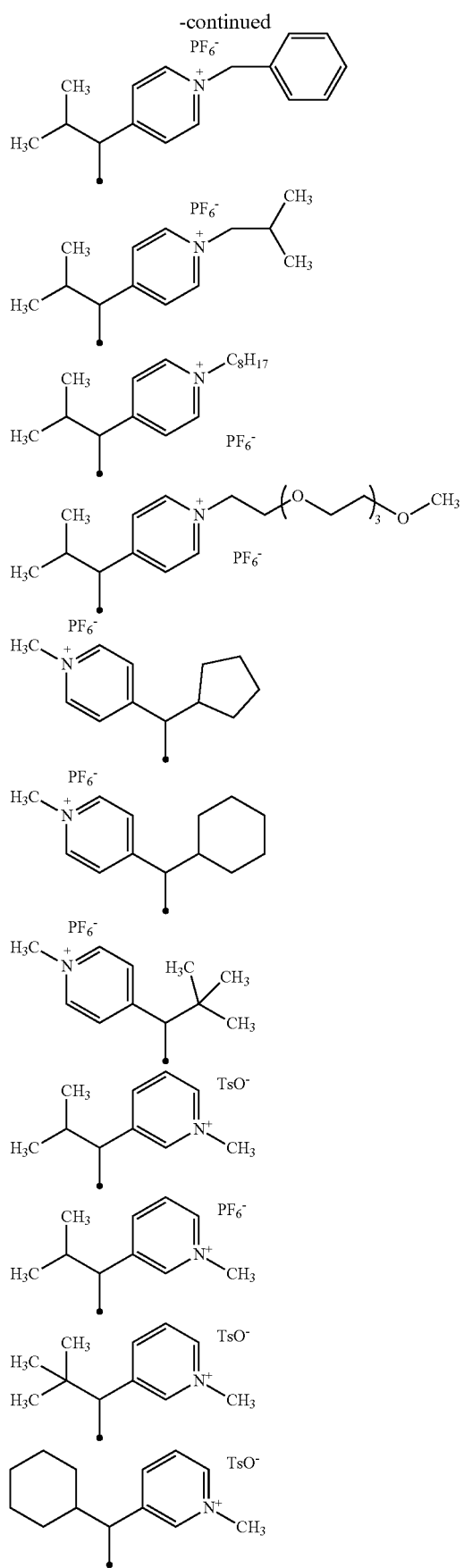
-continued
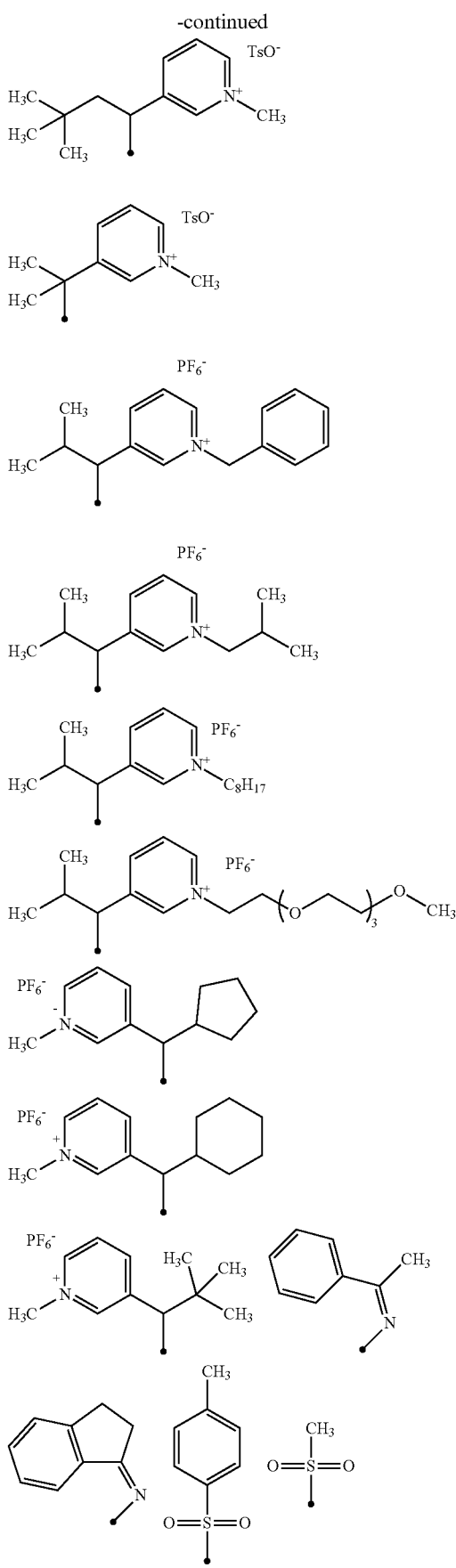

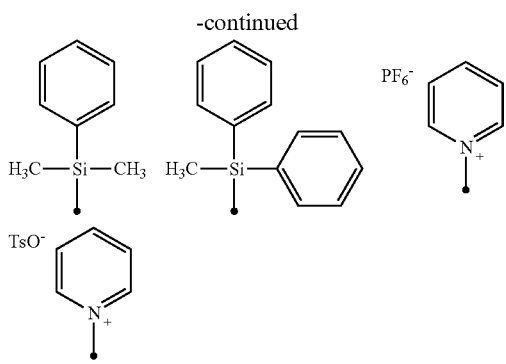

In a case in which L is an oxygen atom, and $R^1$ is an aryl group or a linear alkyl group, the cleavage of the $R^1$—O bond by exposure to an infrared ray does not occur.

In a case in which L is a sulfur atom in Formula 1 or Formula 2, $R^1$ is preferably a group represented by Formula (2-1).

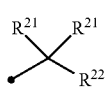

Formula (2-1)

In Formula (2-1), ● represents a bonding site with the sulfur atom represented by L in Formula 1 or Formula 2, $R^{21}$'s each independently represent a hydrogen atom, an alkyl group, or an aryl group, and $R^{22}$ represents an aryl group, an alkenyl group, an alkoxy group, or an onium group.

In a case in which L is —$NR^{10}$— in Formula 1 or Formula 2, $R^1$ that bonds to N is preferably a group represented by Formula (3-1).

Formula (3-1)

In Formula (3-1), ● represents a bonding site with a nitrogen atom included in L in Formula 1 or 2, $X^1$ and $X^2$ each independently represent an oxygen atom or a sulfur atom, and Y represents a group represented by Formula (2-1).

In Formula (2-1), regarding the alkyl group, the aryl group, the alkenyl group, the alkoxy group, and the onium group represented by $R^{21}$ and $R^{22}$, it is possible to cite the description regarding the alkyl group, the aryl group, the alkenyl group, and the onium group described in Formula (1-1) to Formula (1-7).

In Formula 1 or Formula 2, it is preferable that L represents a sulfur atom or —$NR^{10}$— and $R^{10}$ represents a hydrogen atom, an alkyl group, or an aryl group from the viewpoint of improving printing resistance.

Specific examples of the compound represented by Formula 1 or Formula 2 will be illustrated below, but the present invention is not limited thereto. In the following structural formulae, Me represents a methyl group, and TsO⁻ represents a tosylate anion.

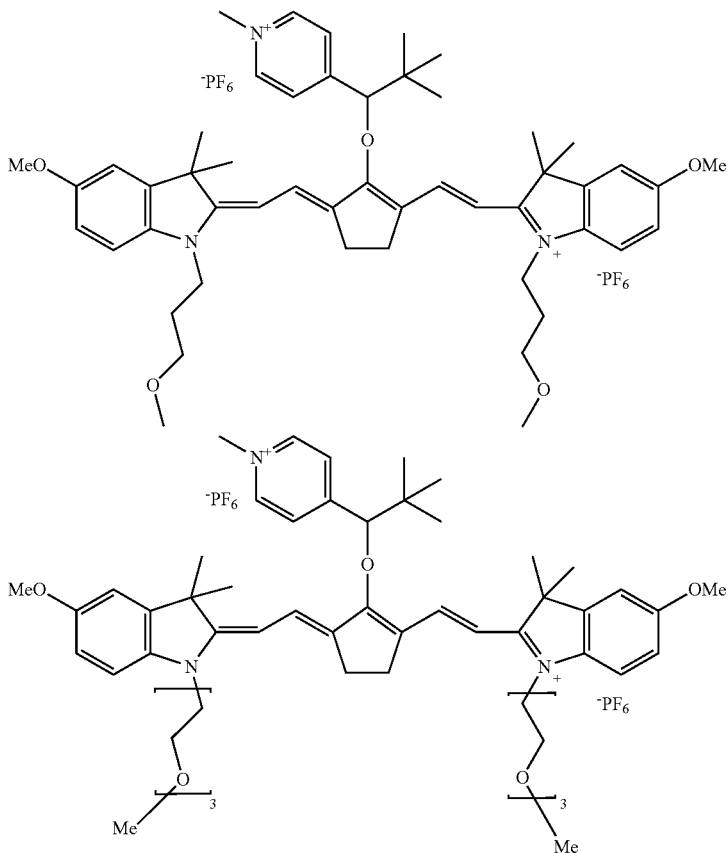

-continued
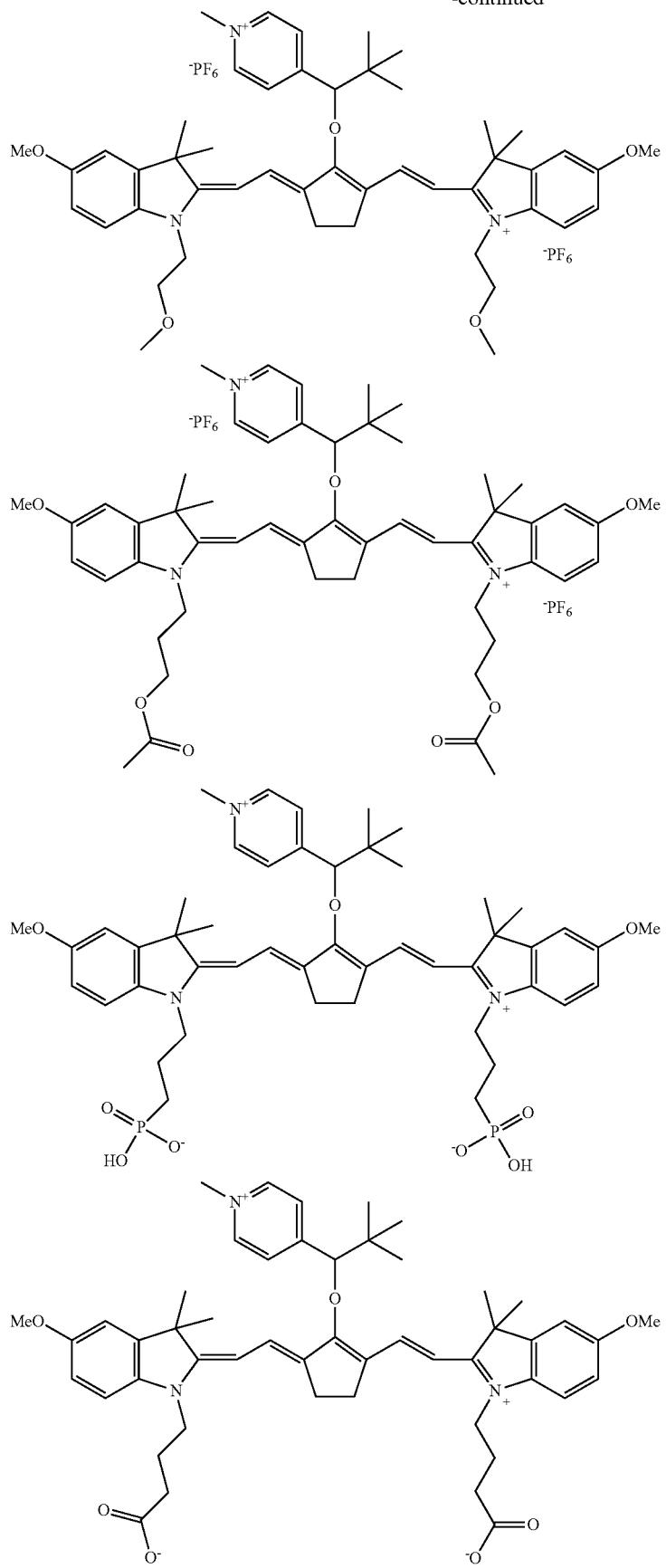

-continued
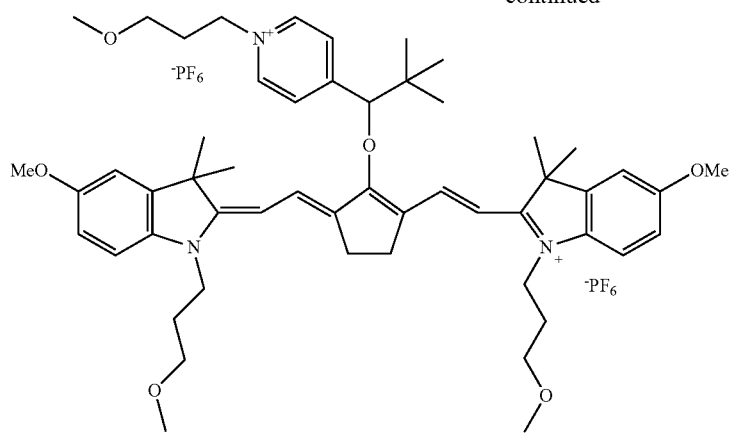
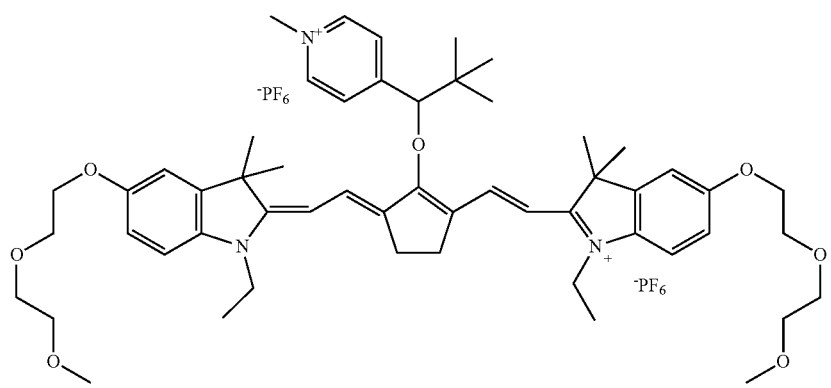
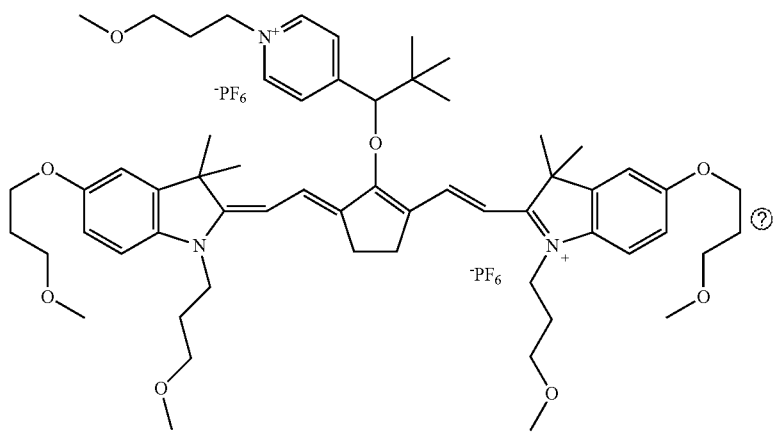
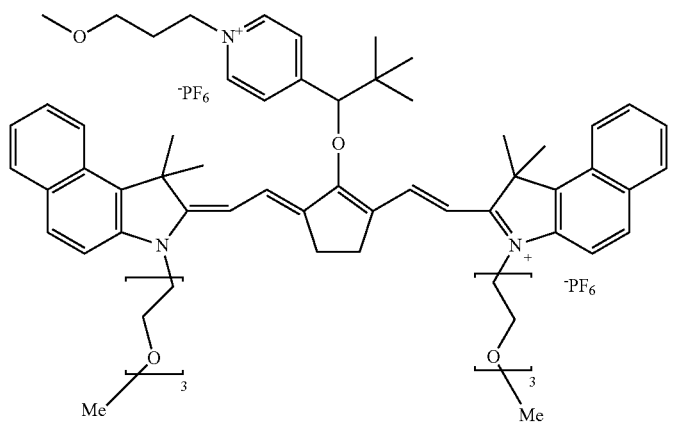

-continued
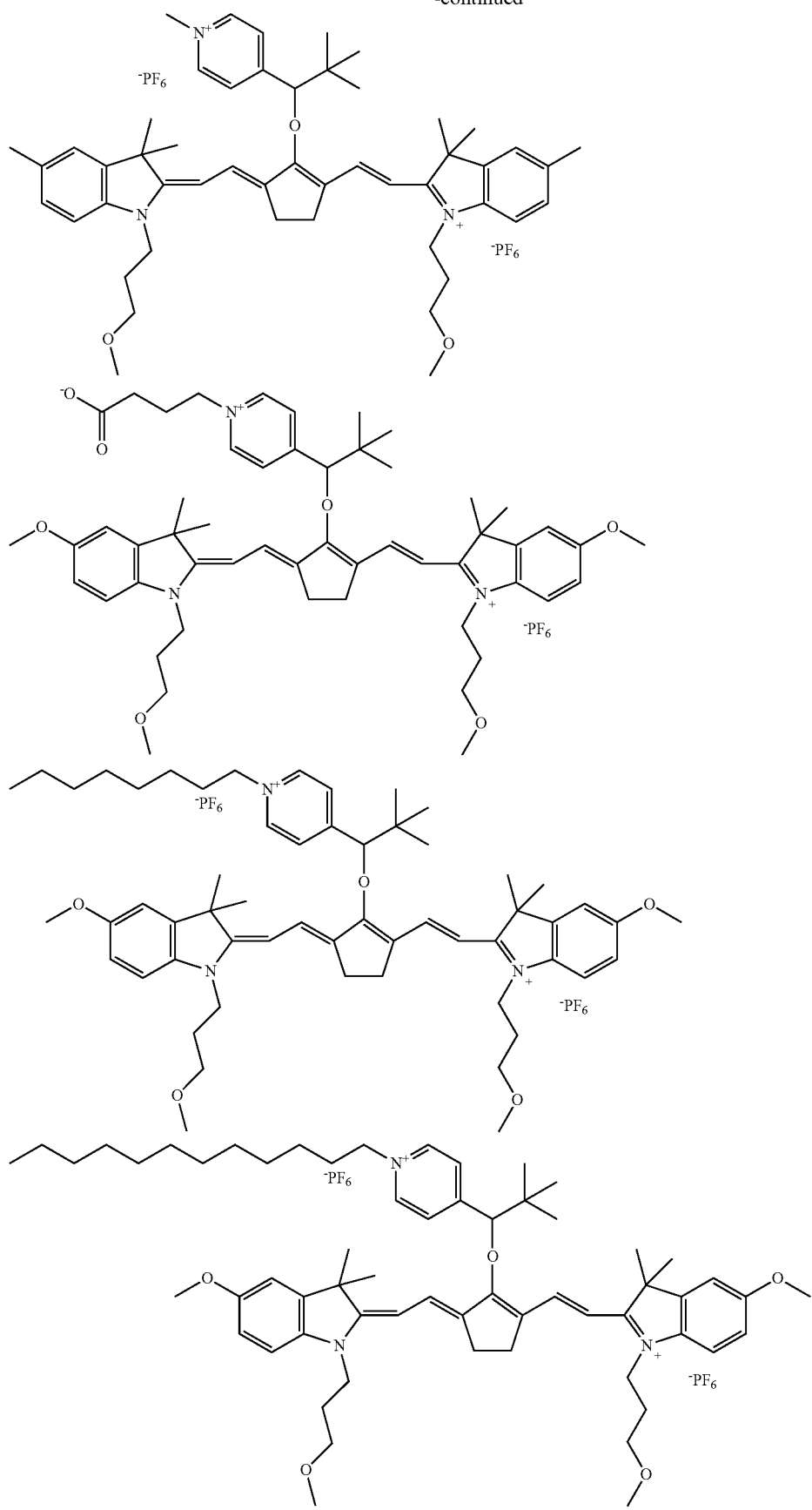

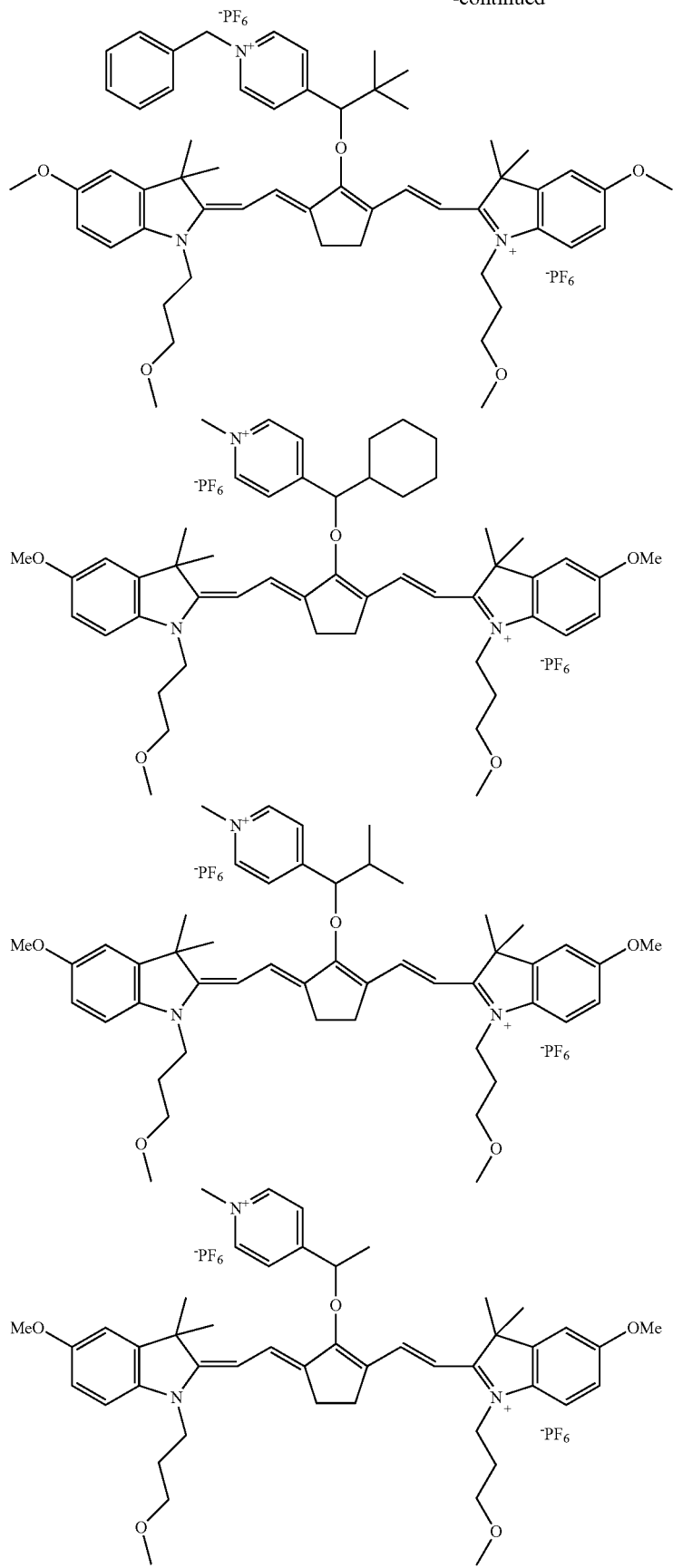

-continued
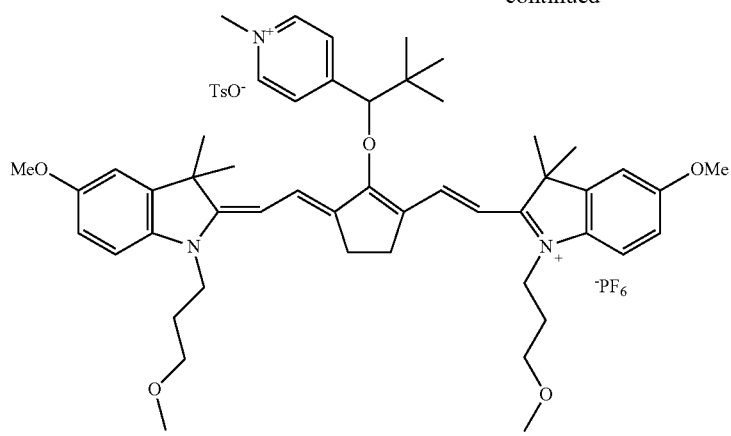
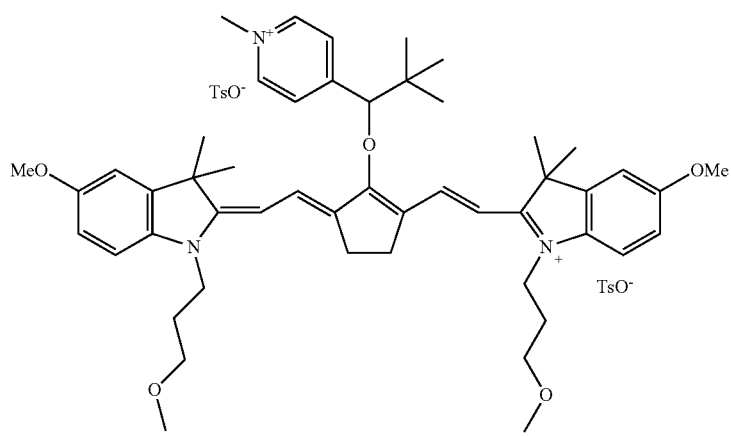
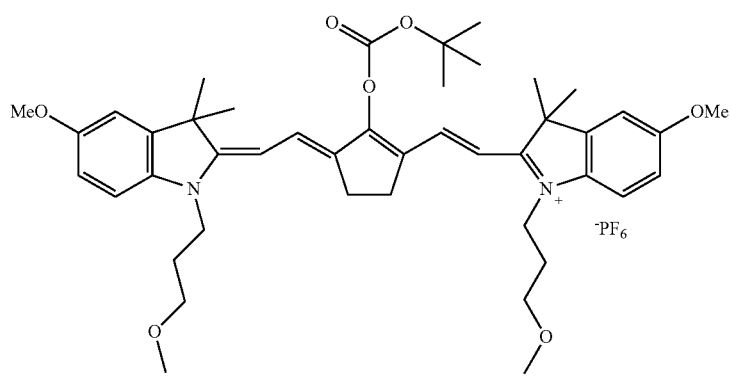
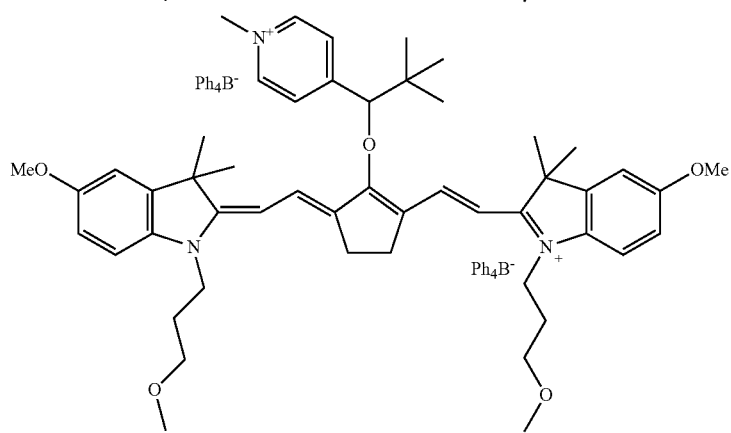

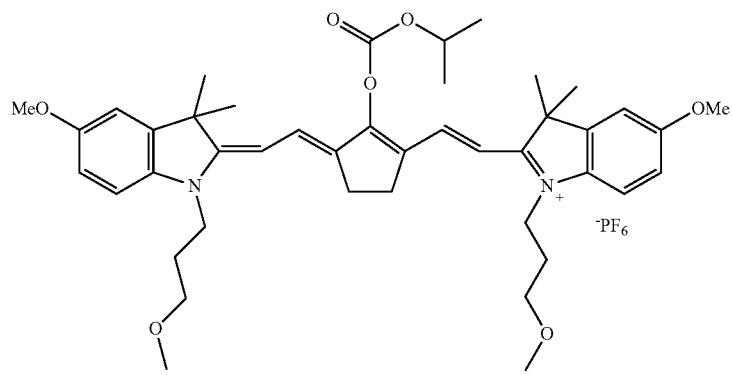
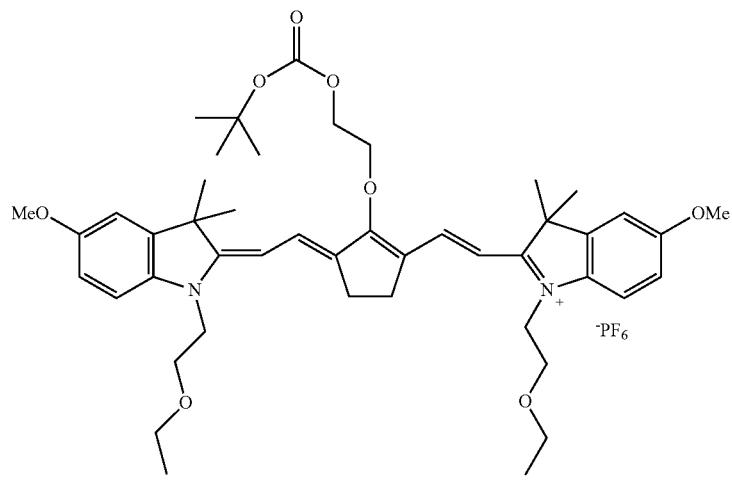
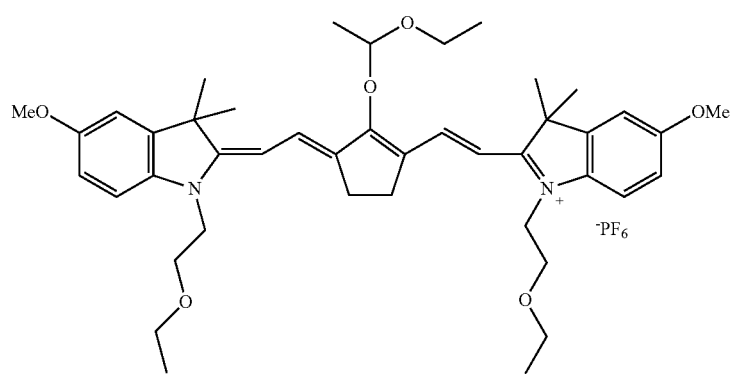
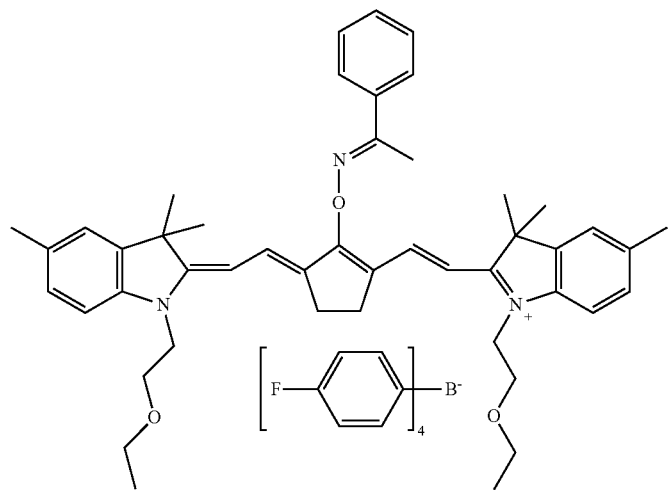

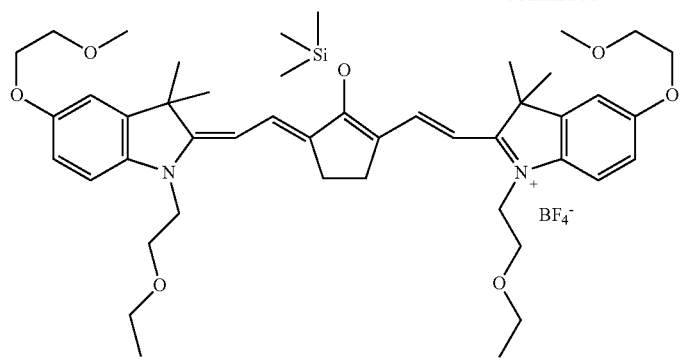
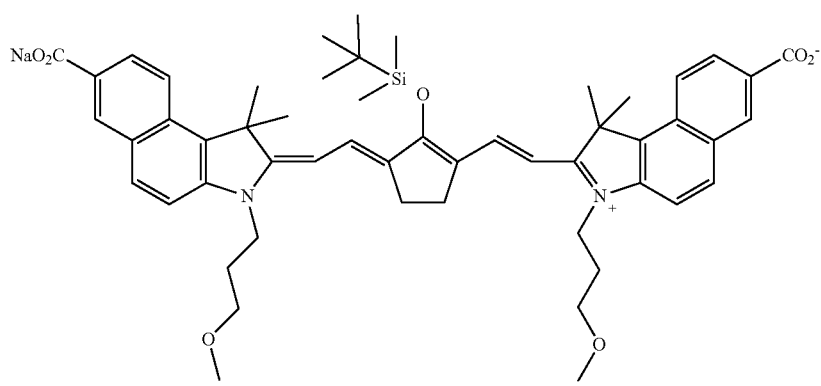
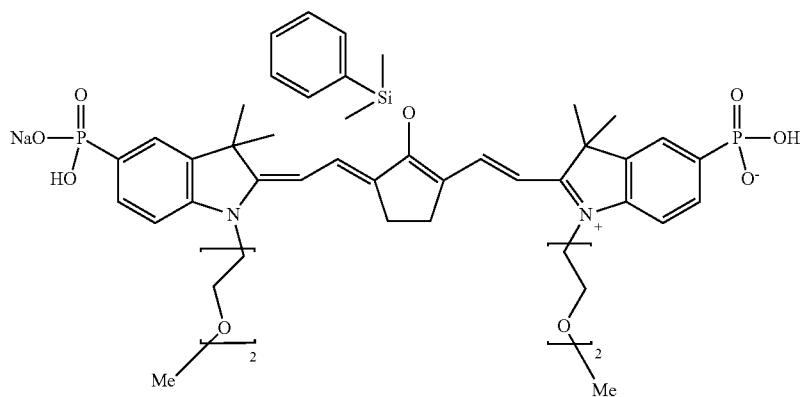
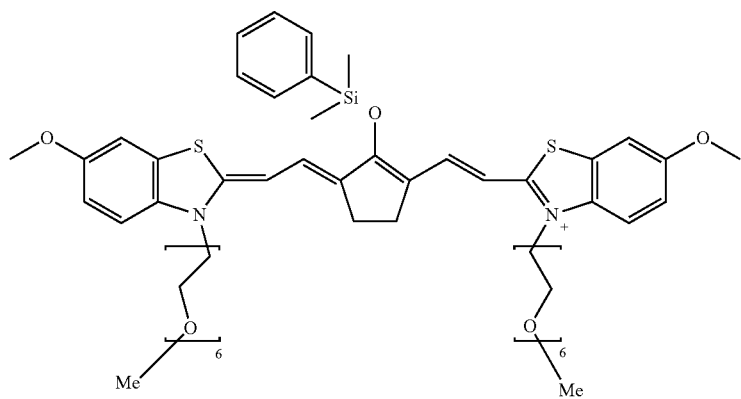

-continued
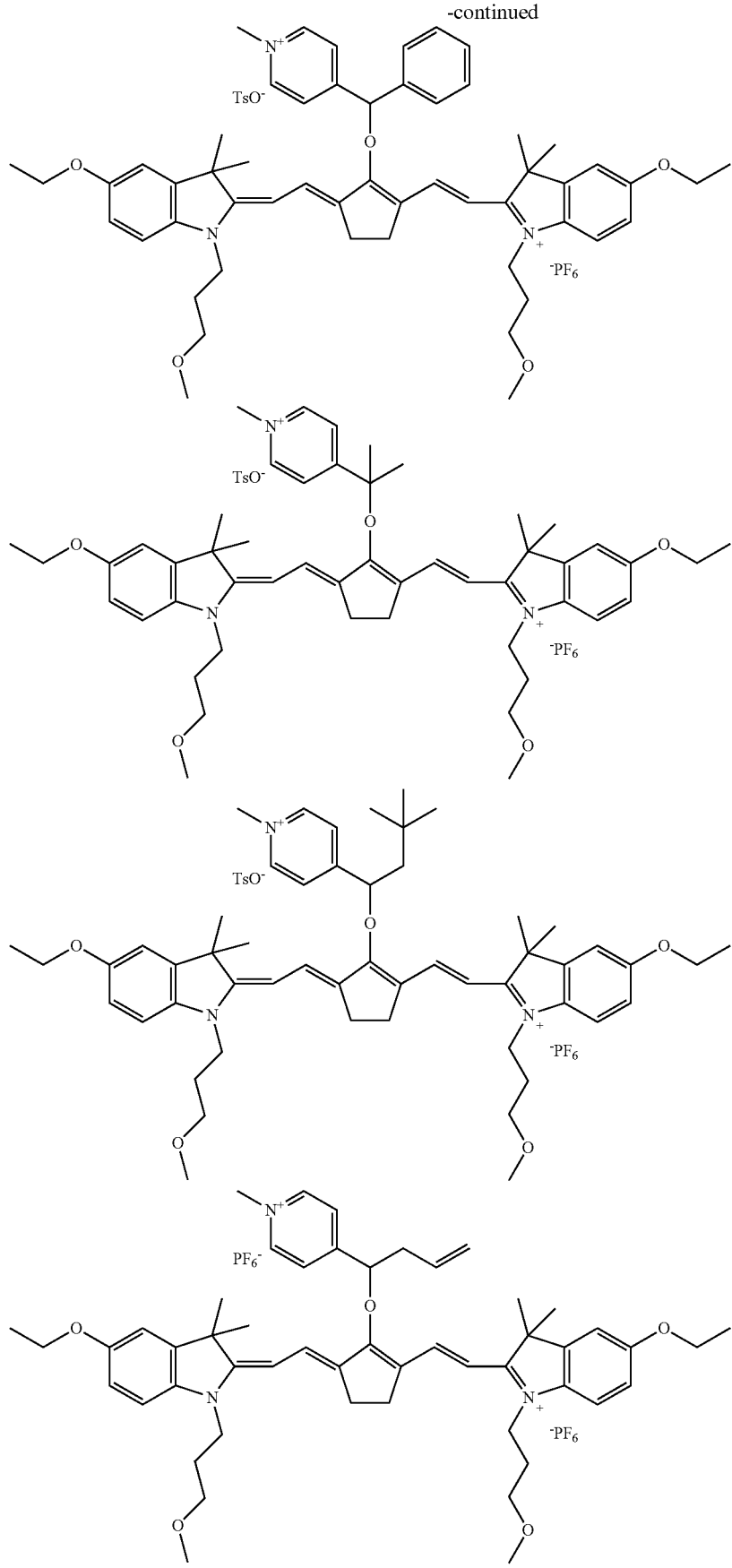

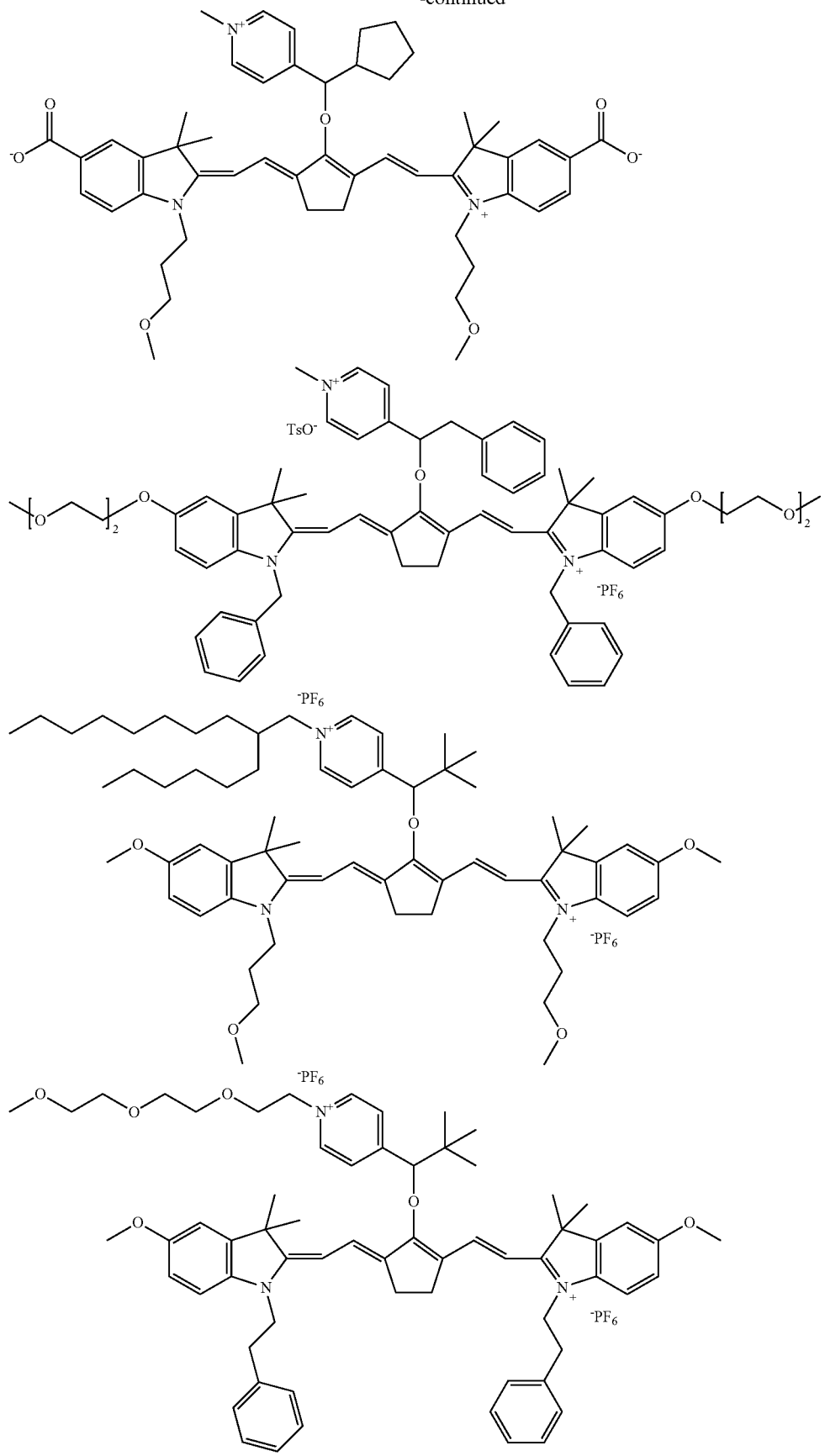

-continued
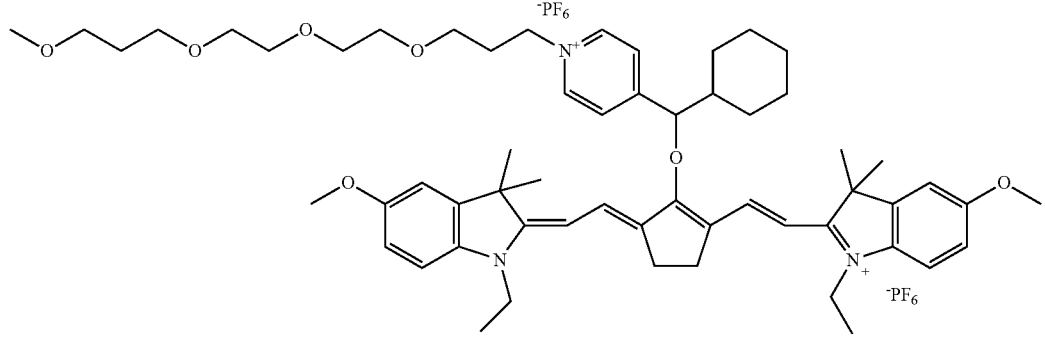
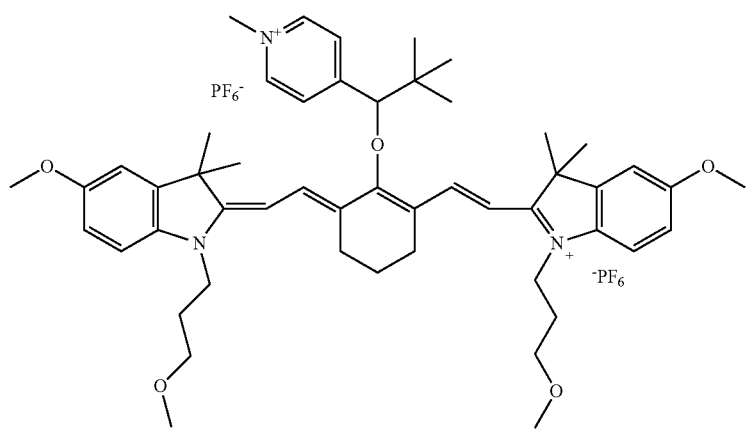
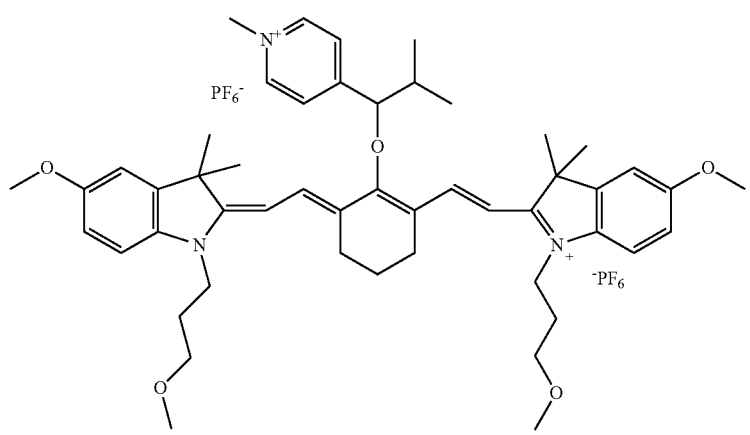
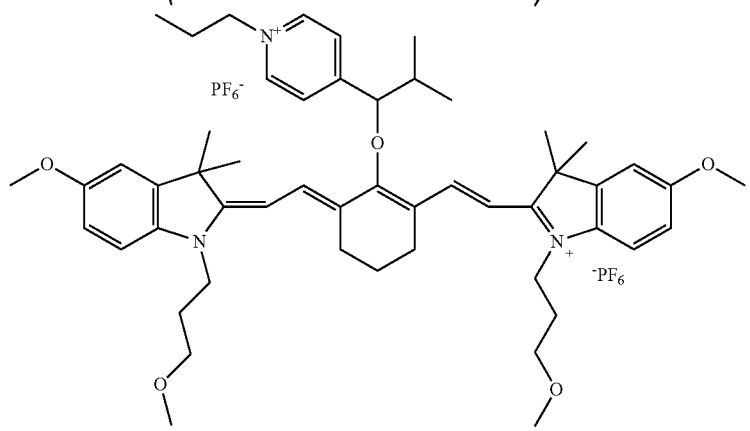

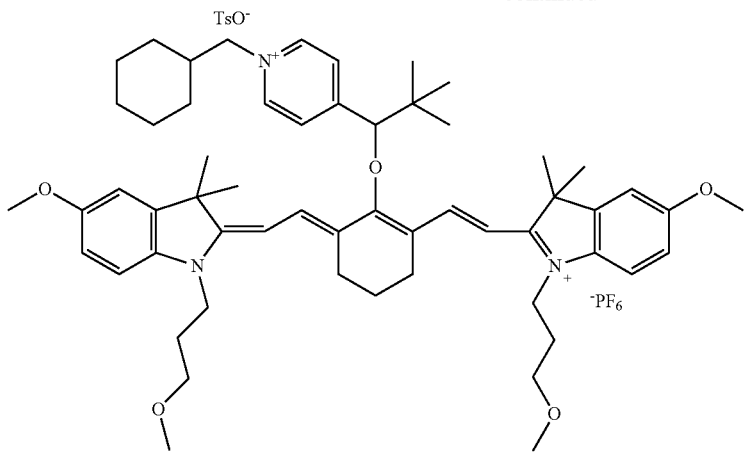
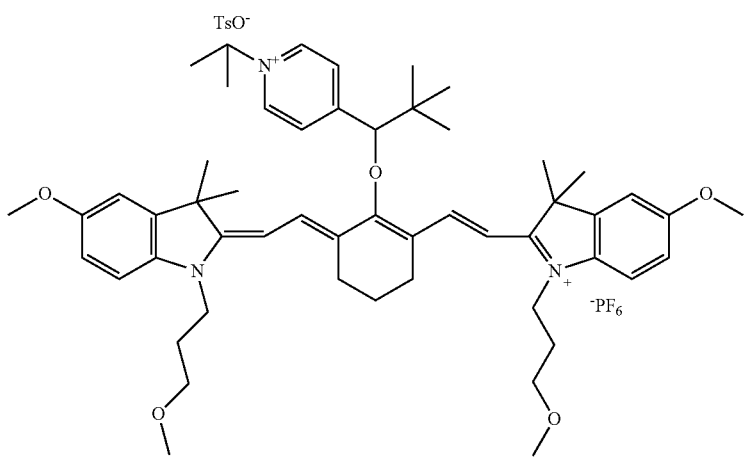
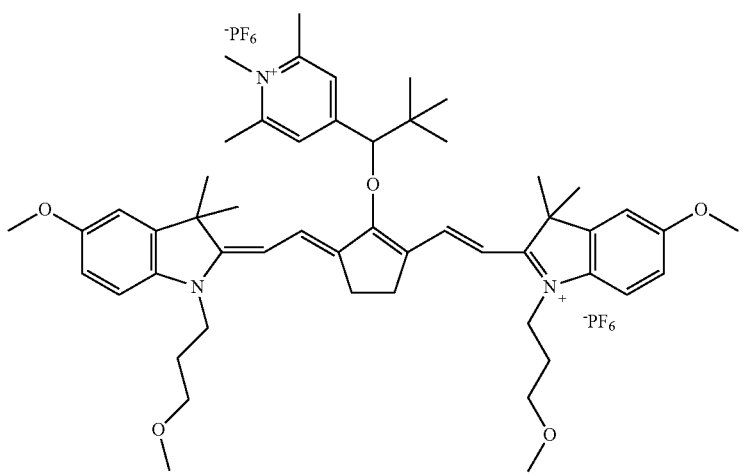

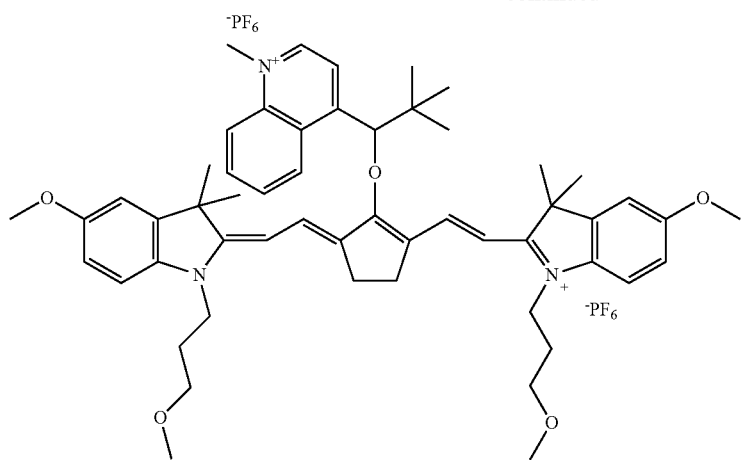
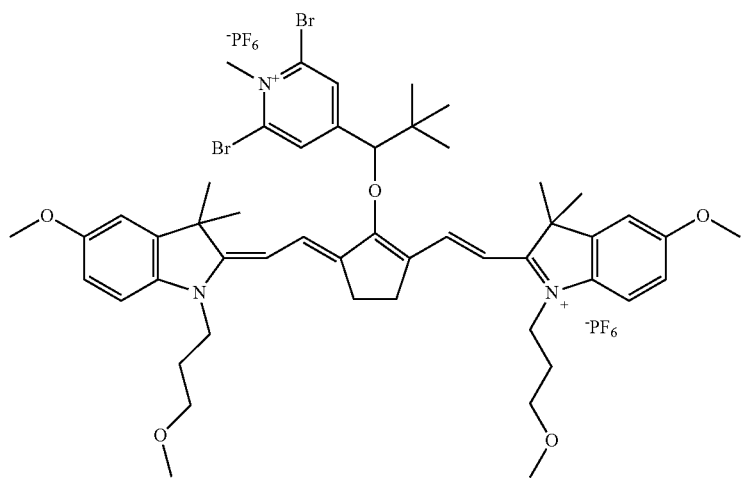
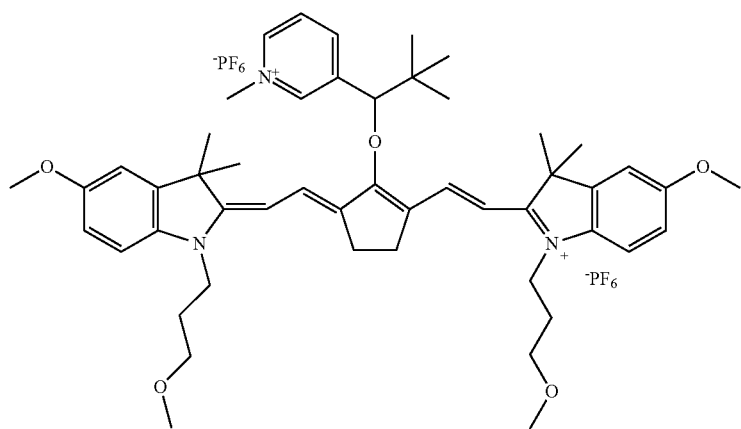

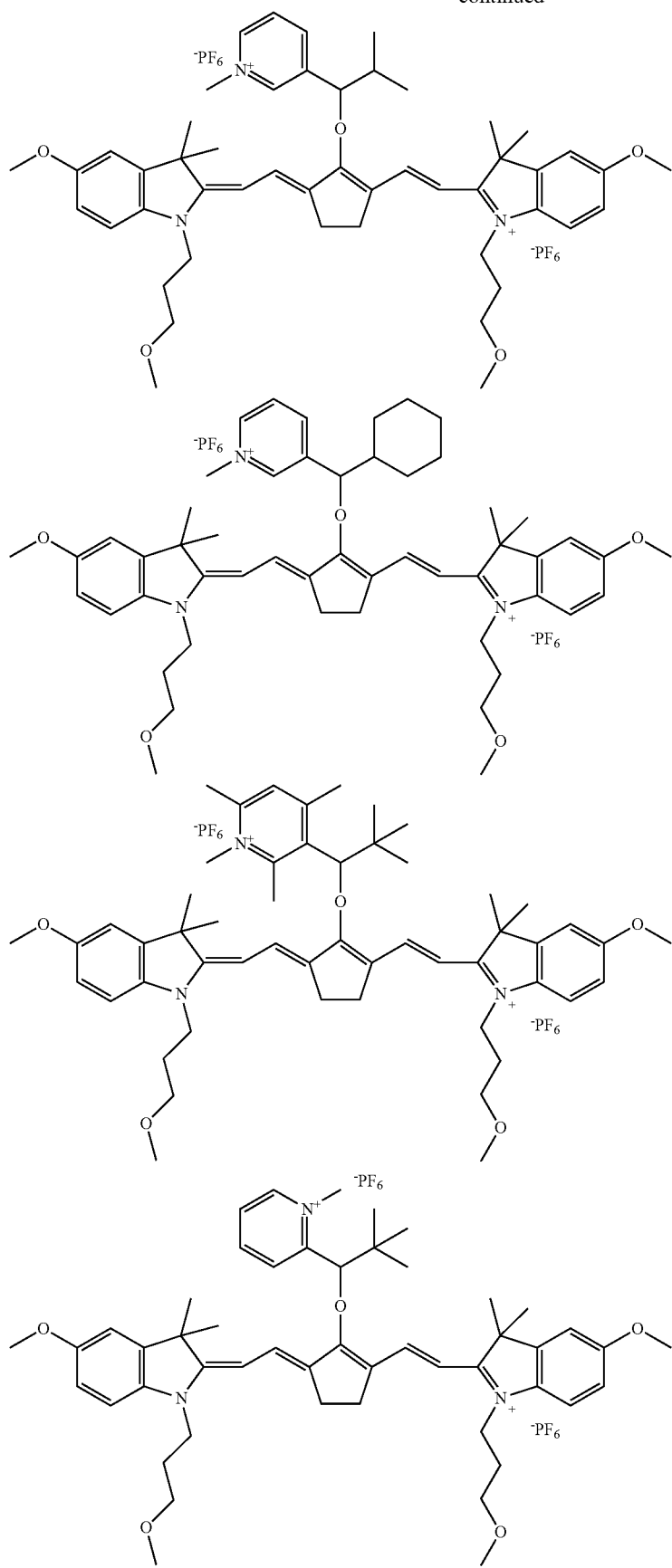

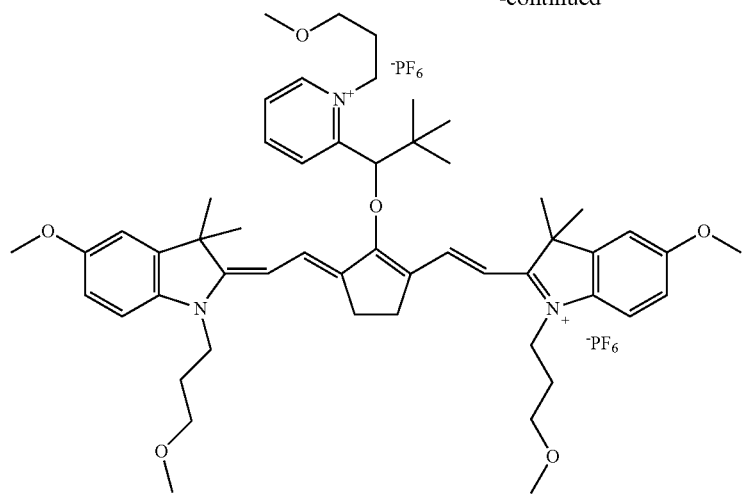
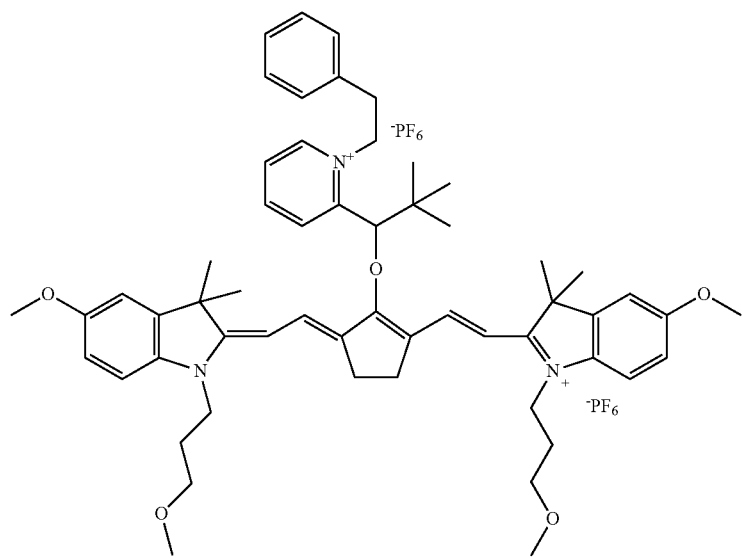
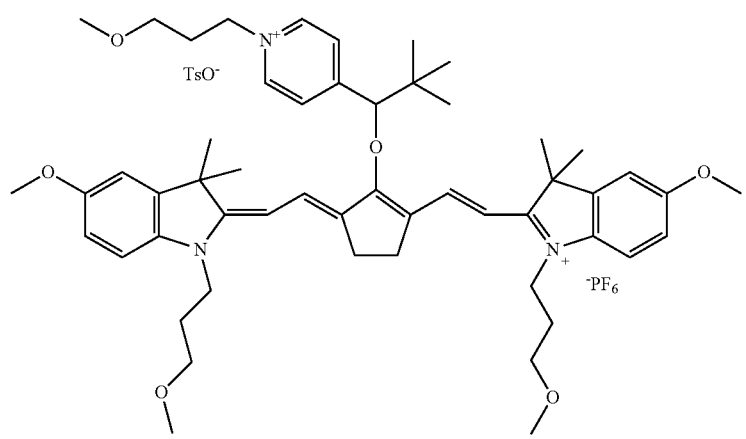

-continued
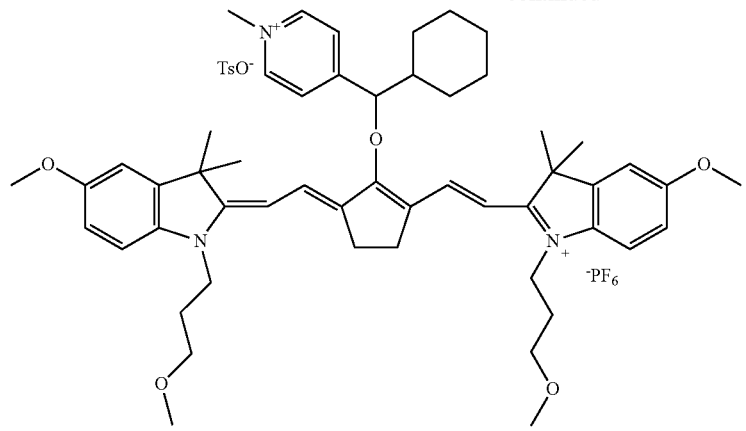
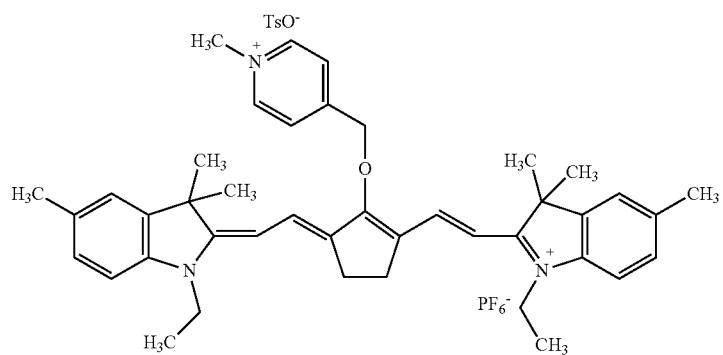
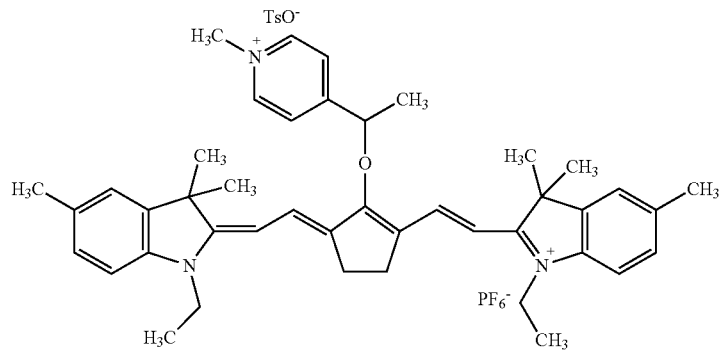
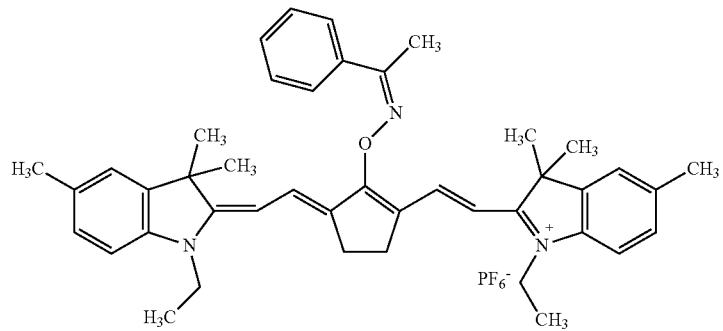

-continued
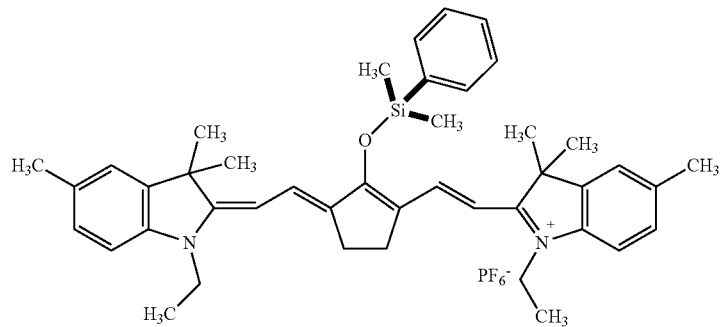
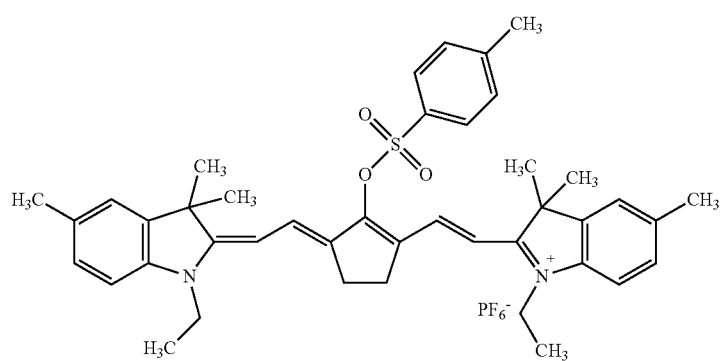
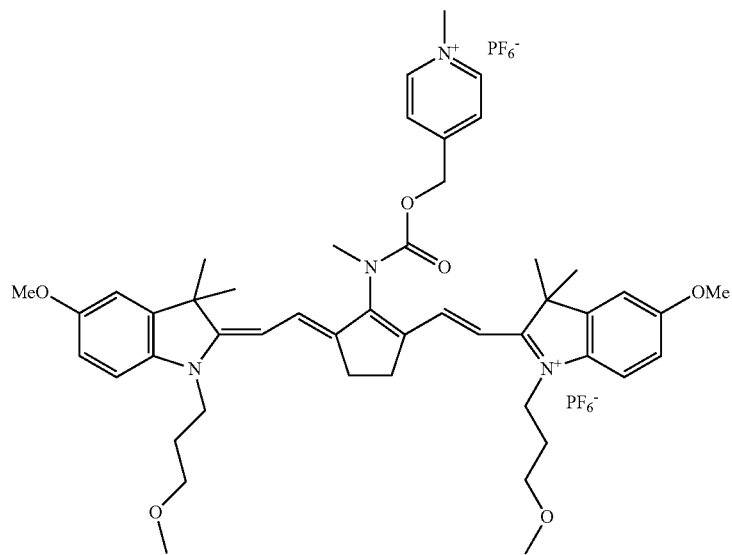

-continued
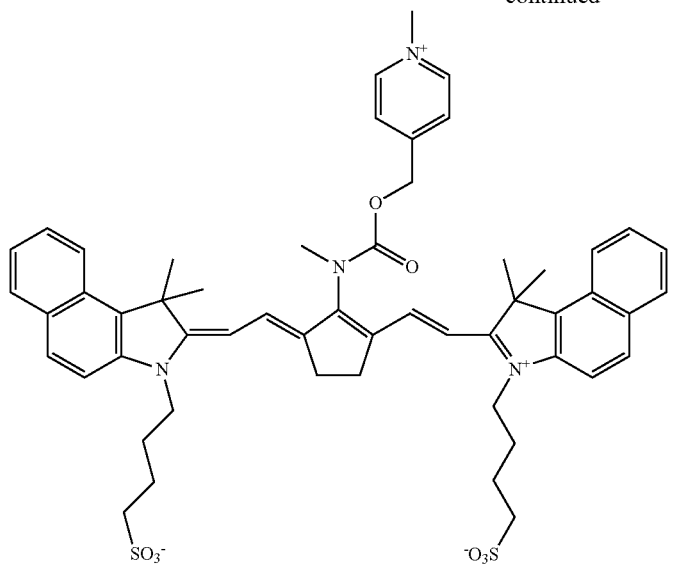
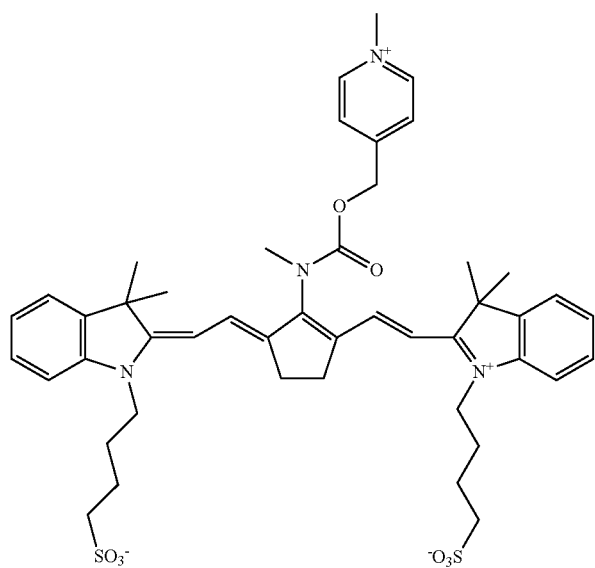
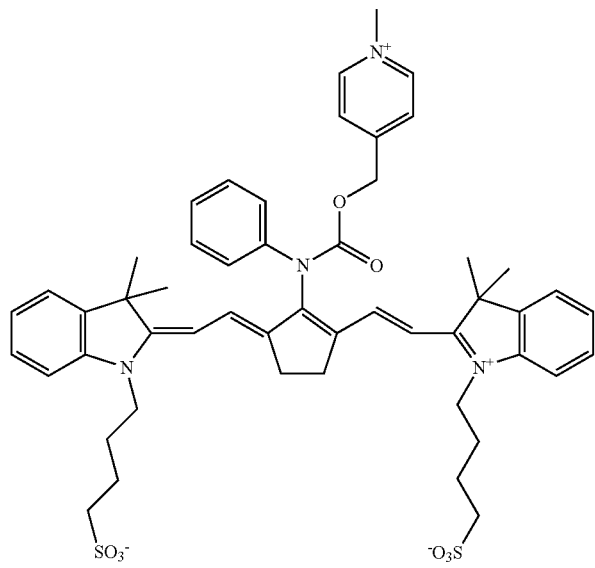

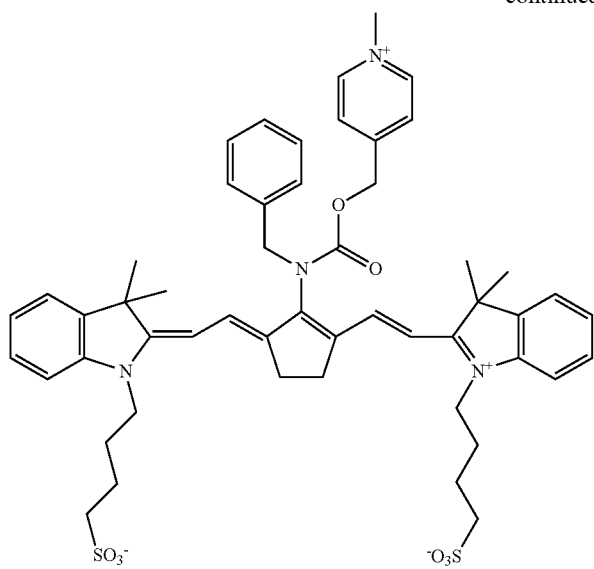
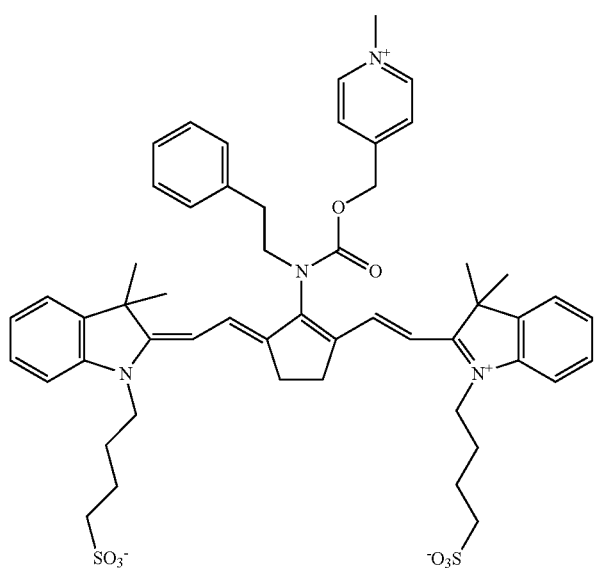
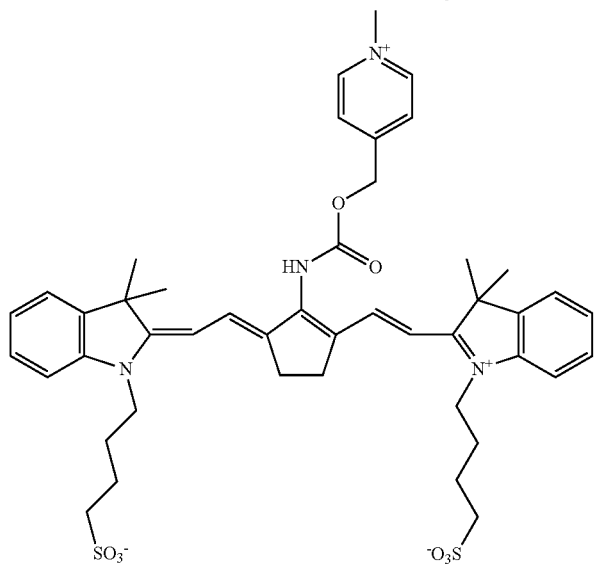

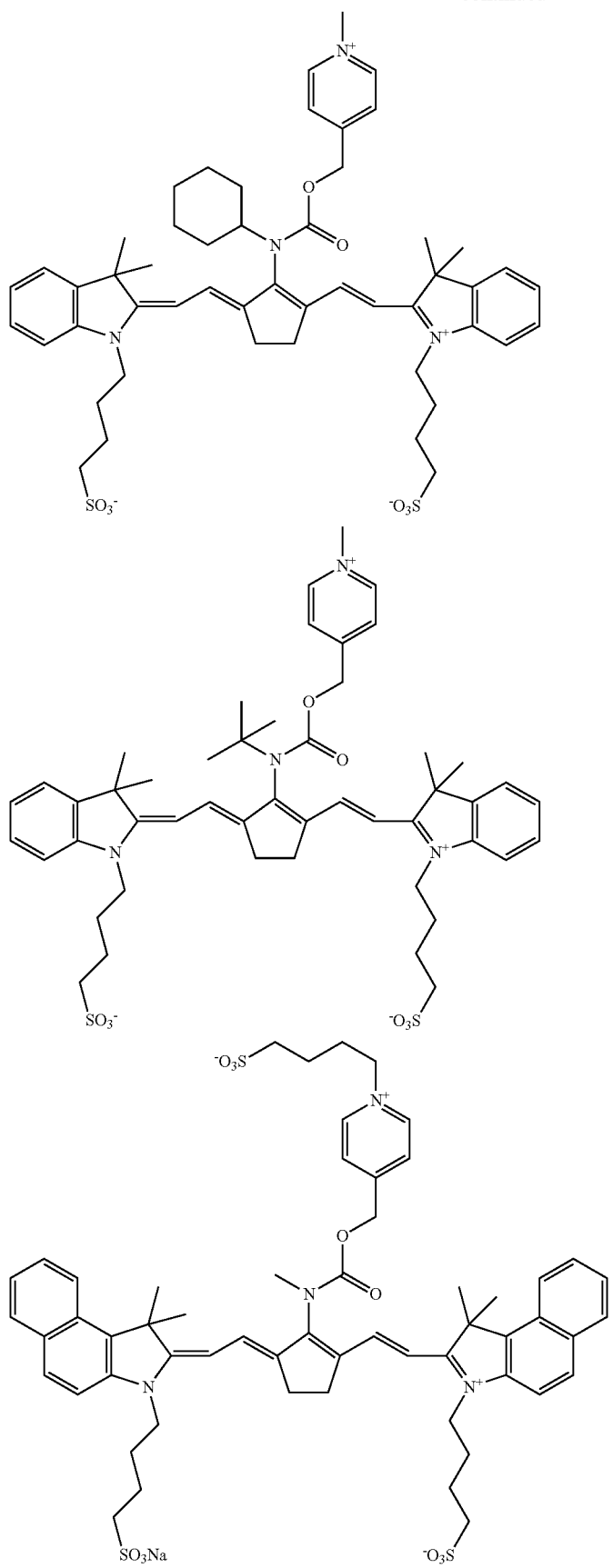

-continued
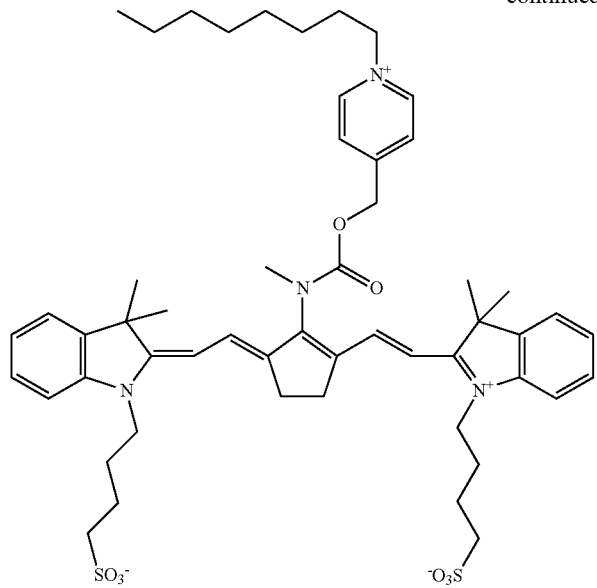
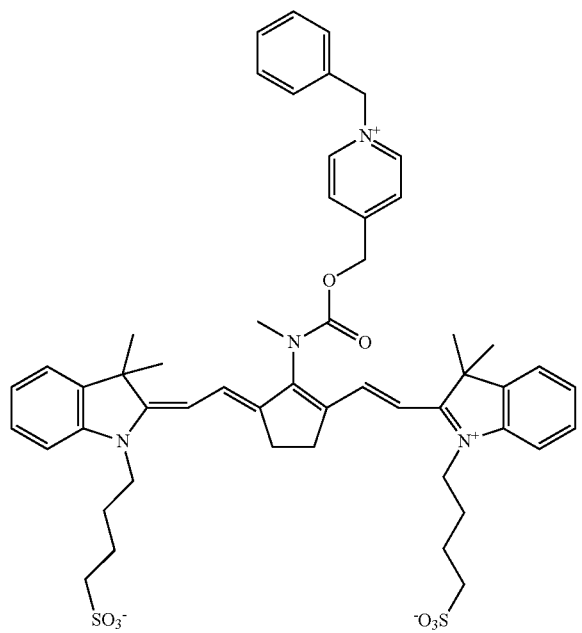

-continued
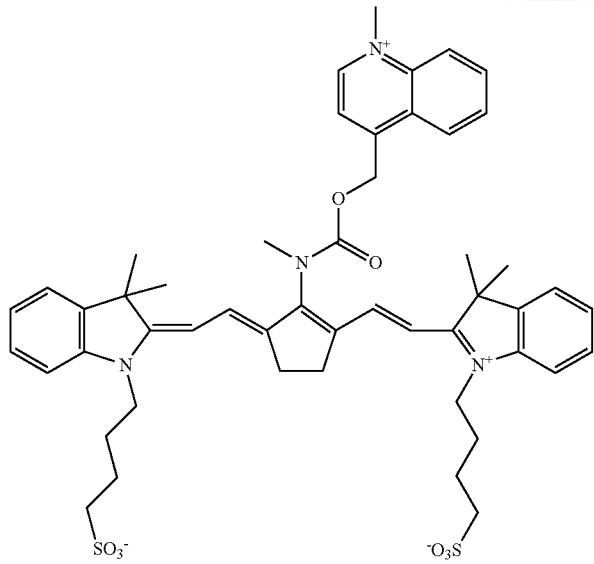
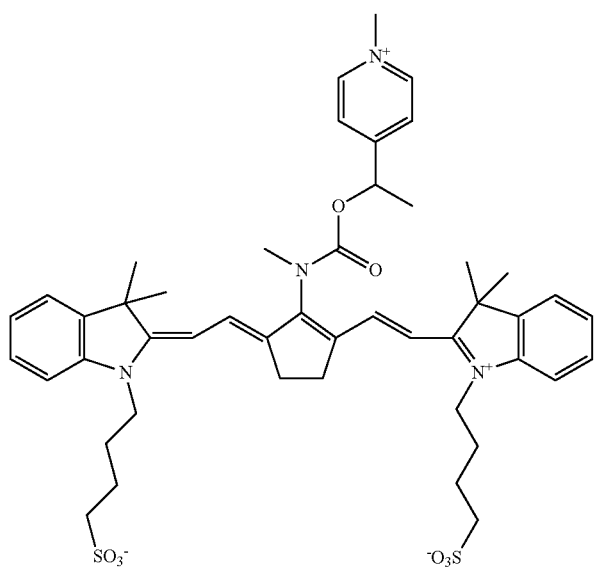
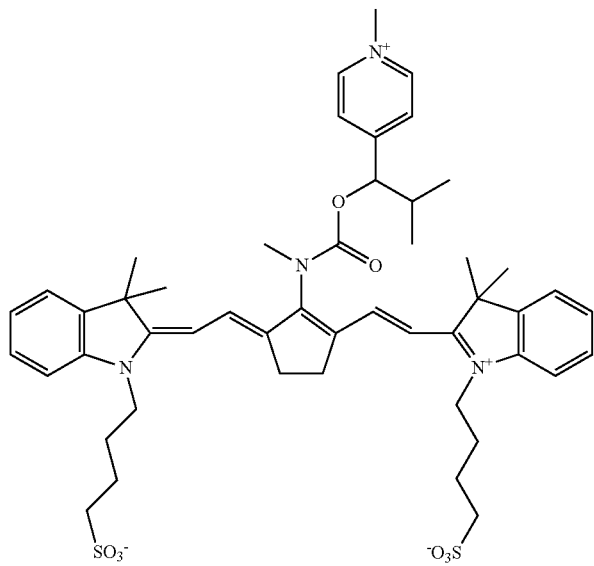

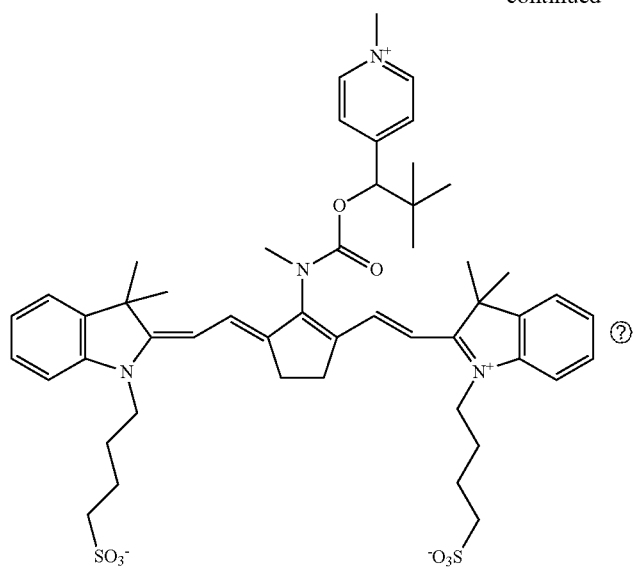
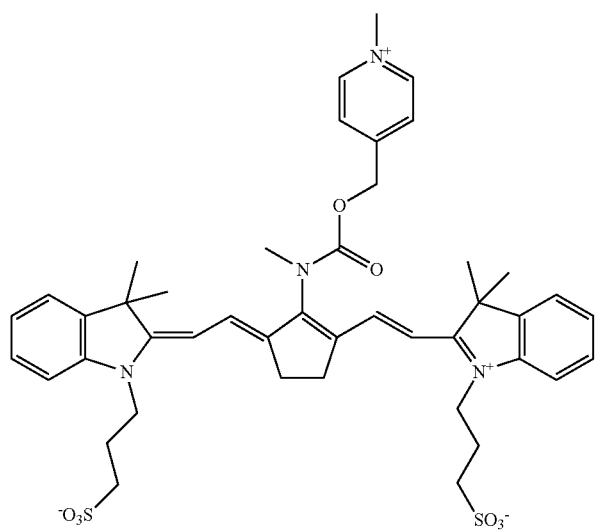
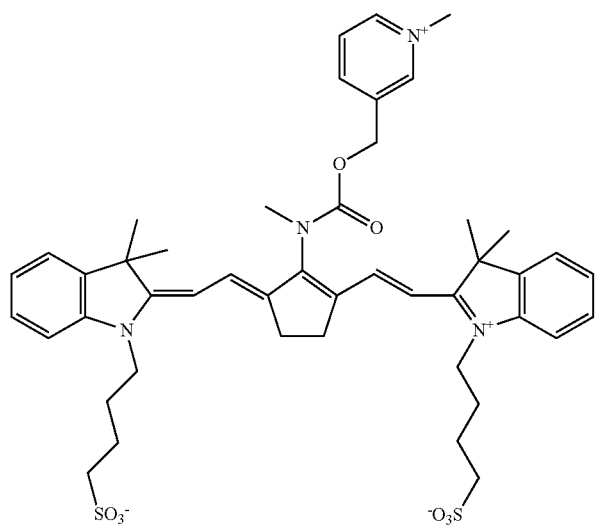

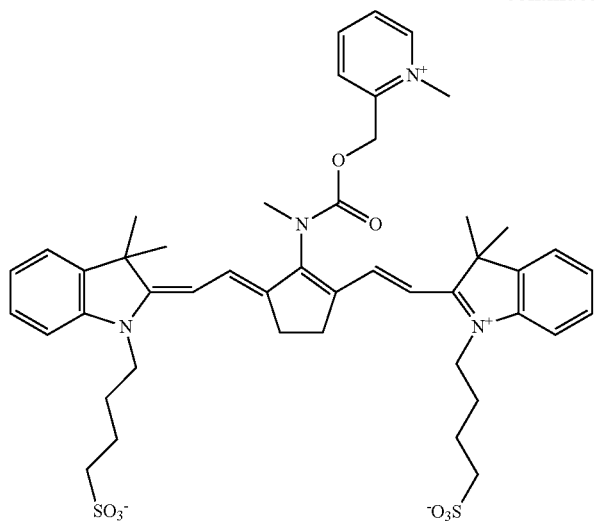
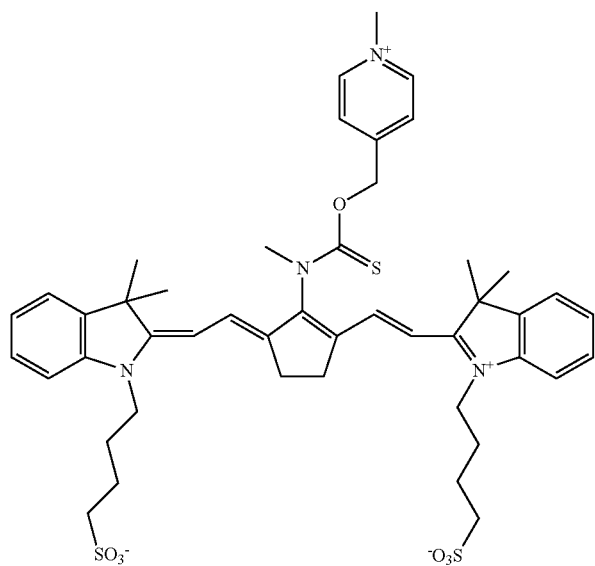
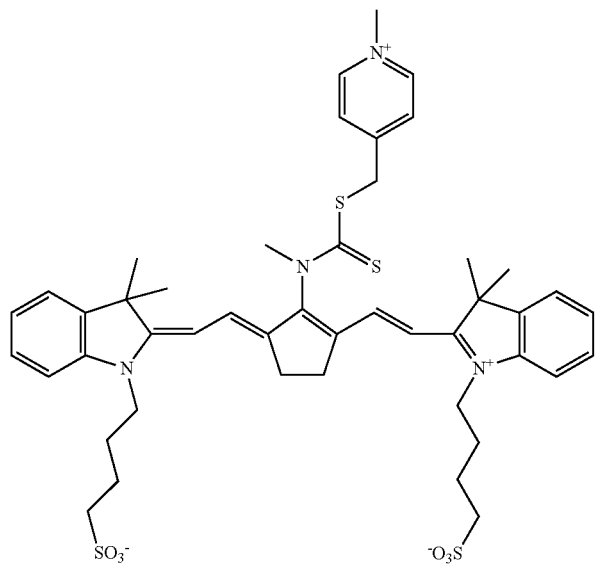

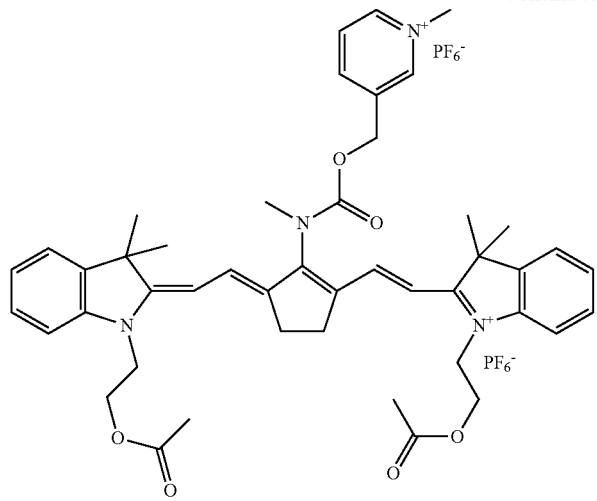
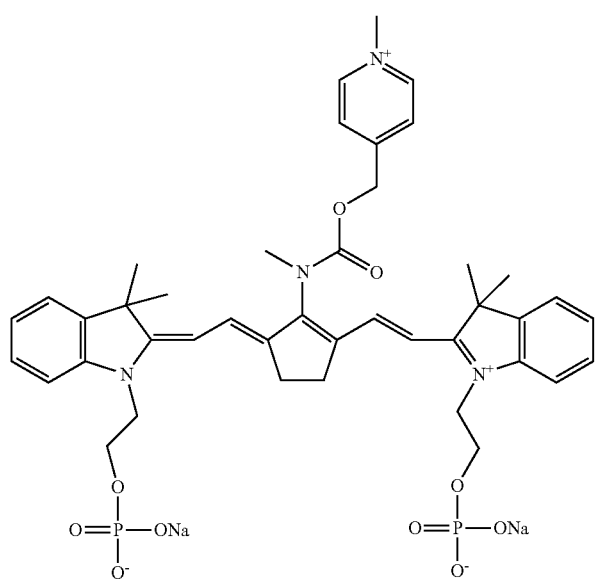
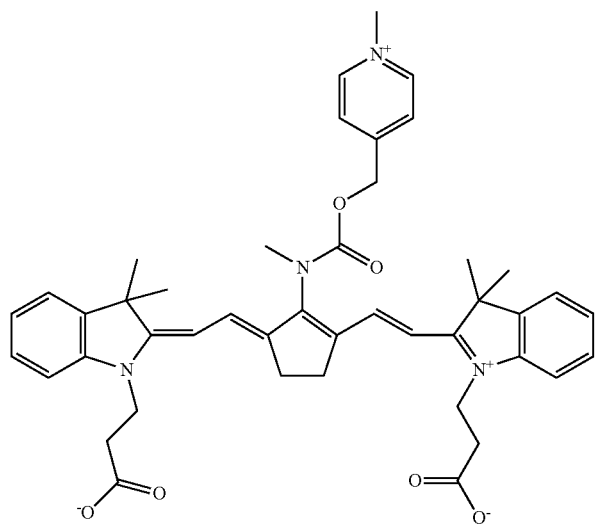

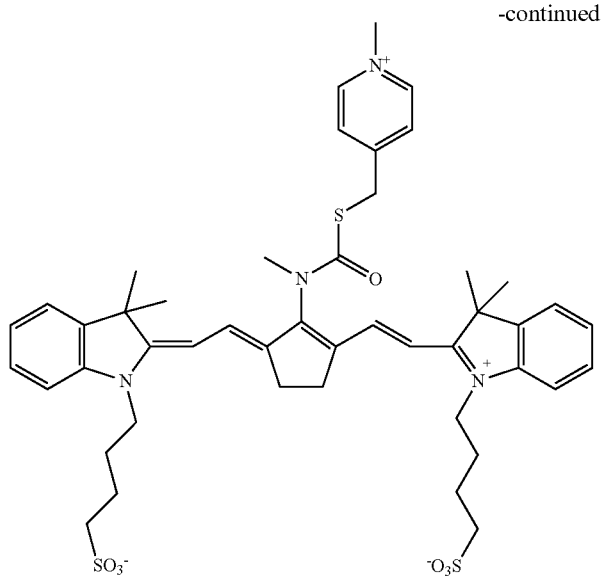
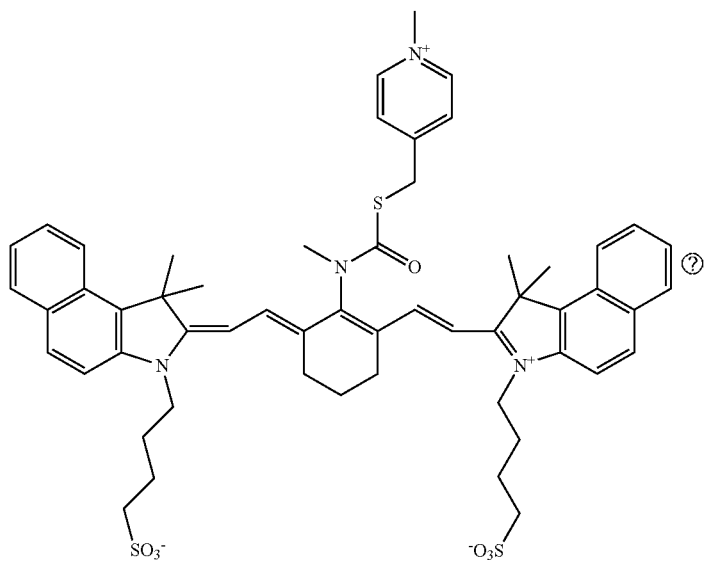
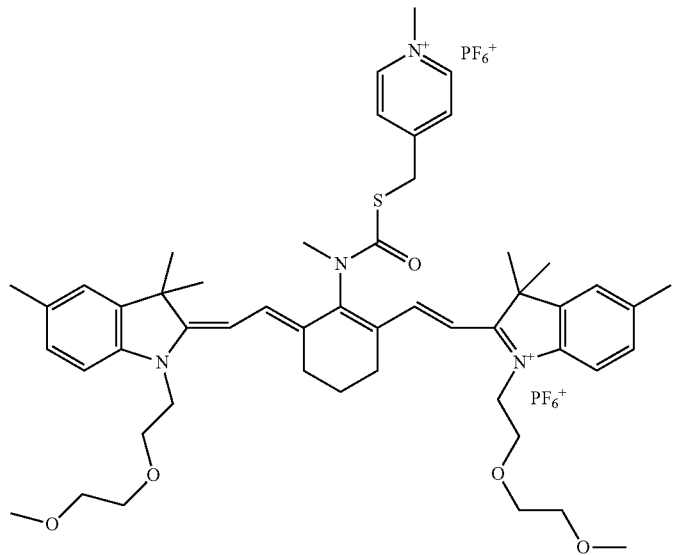

-continued
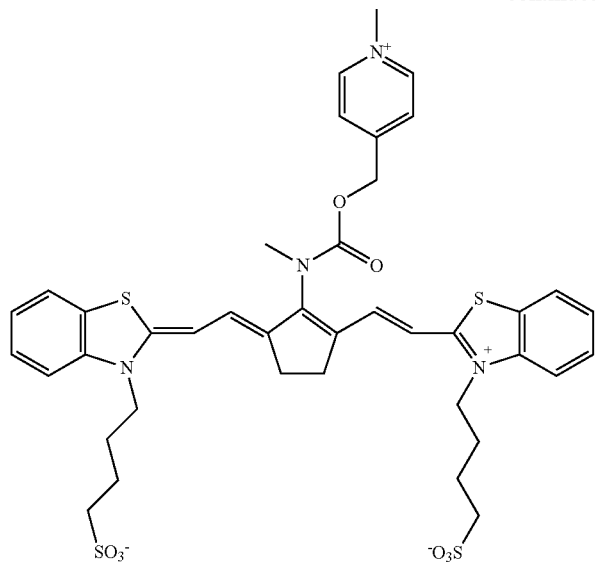
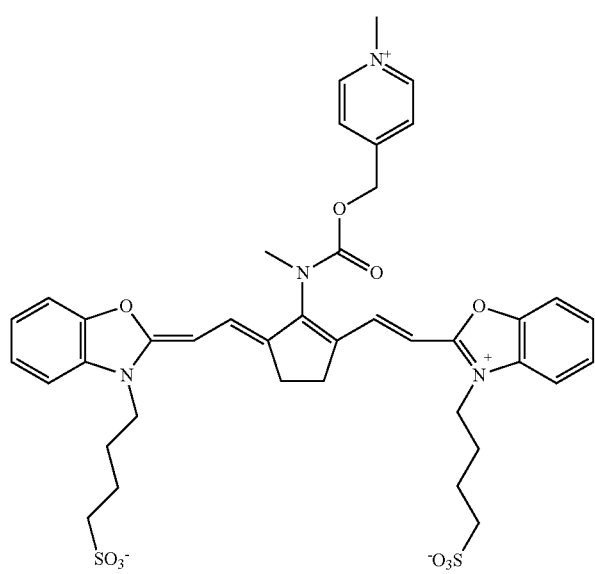
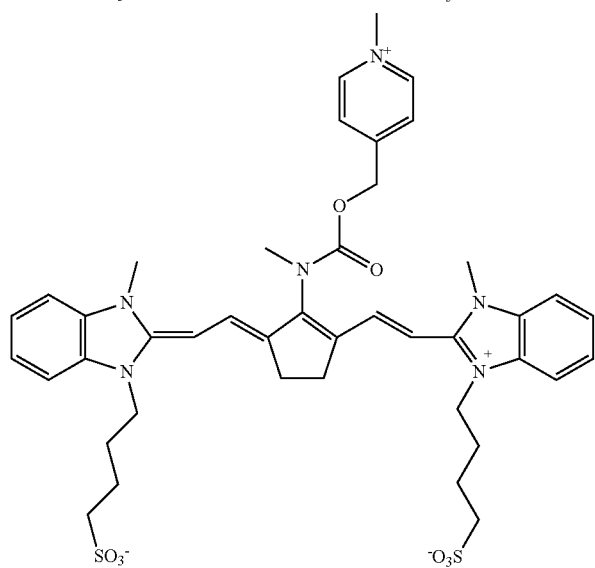

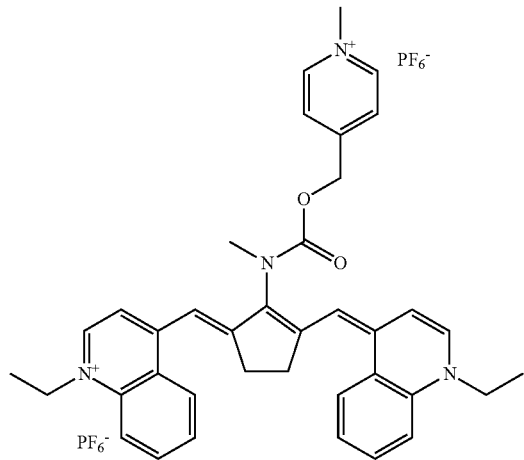
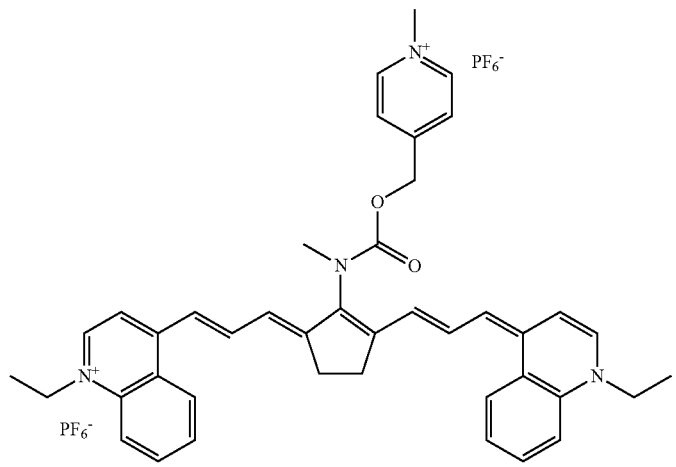
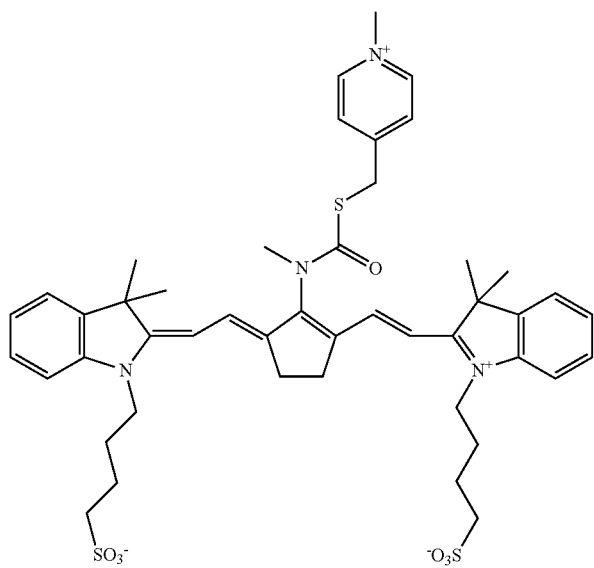

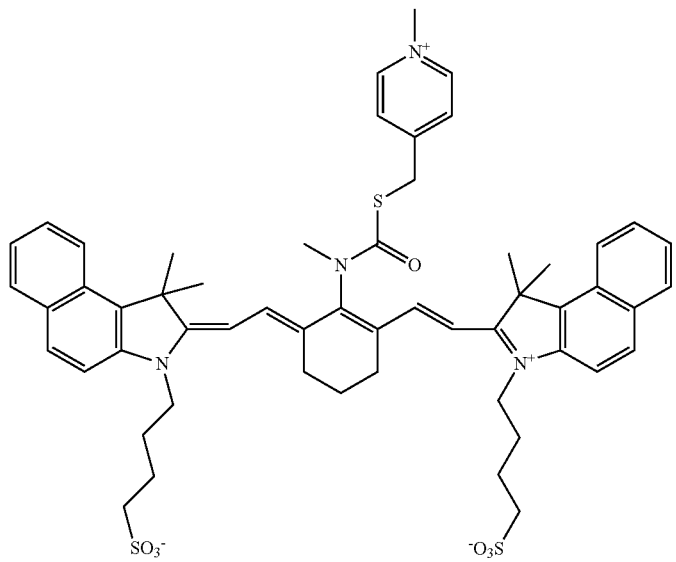
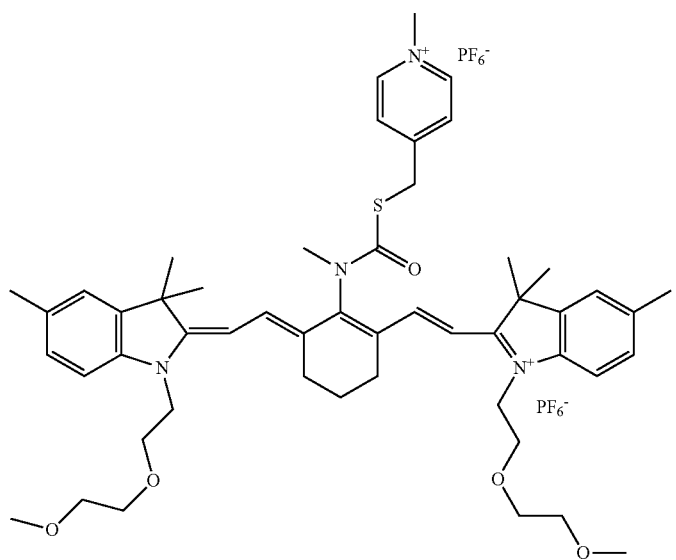
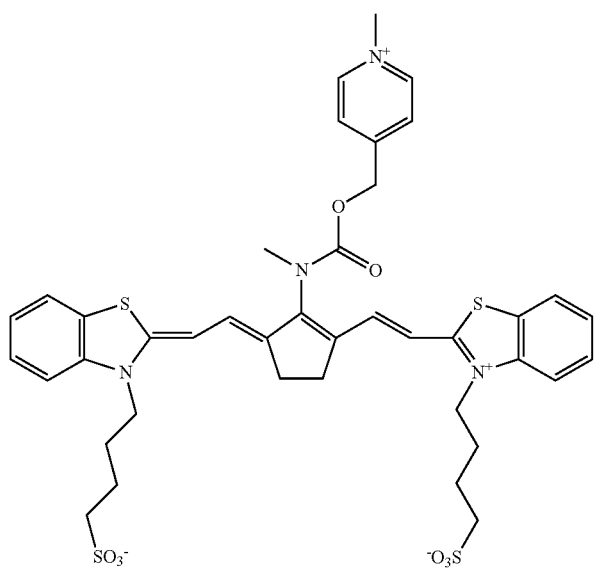

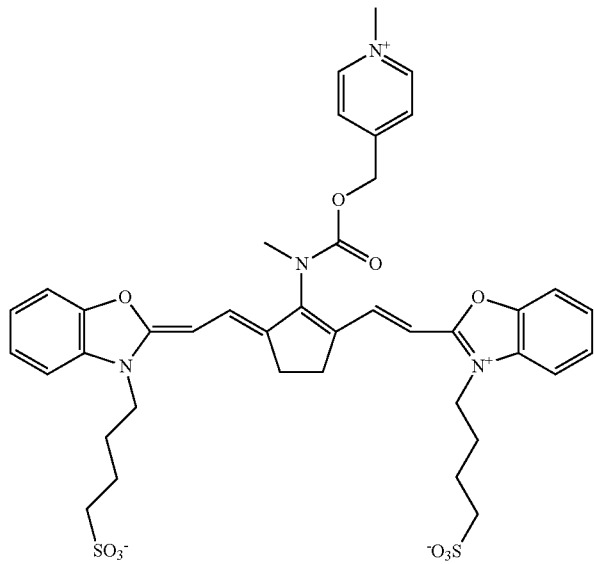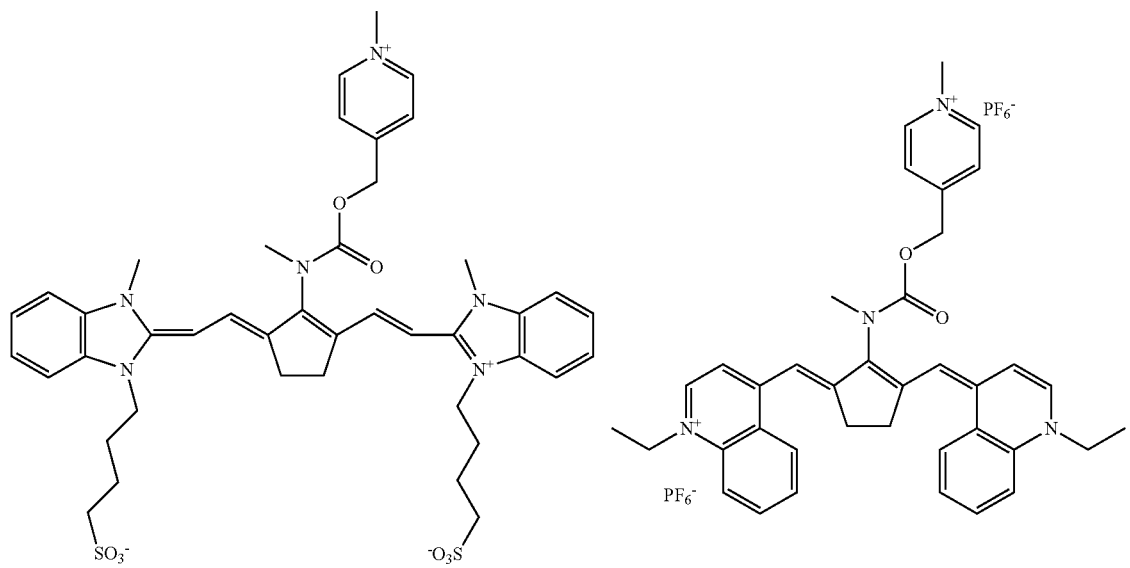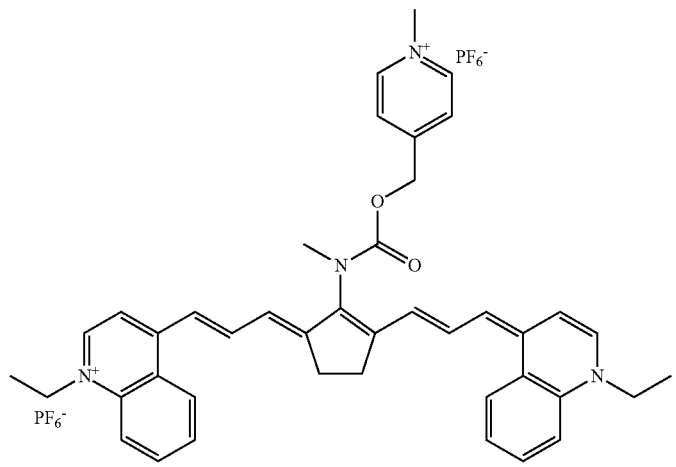

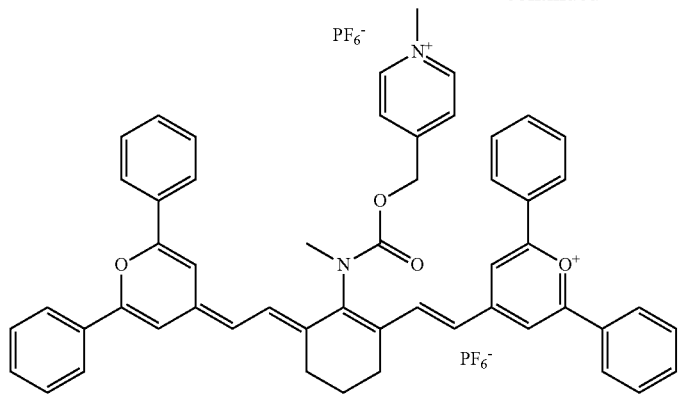
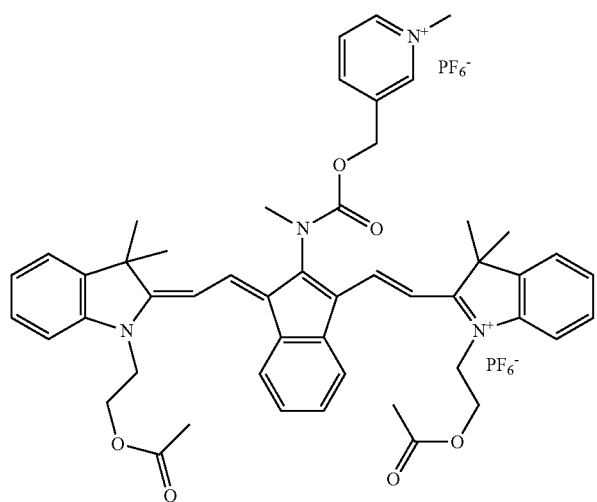
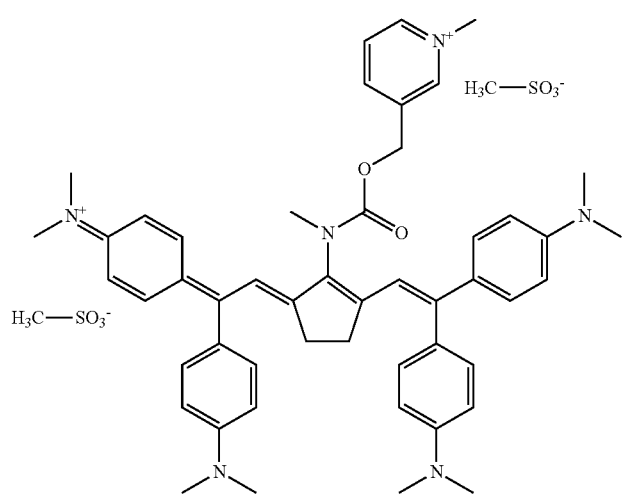

-continued
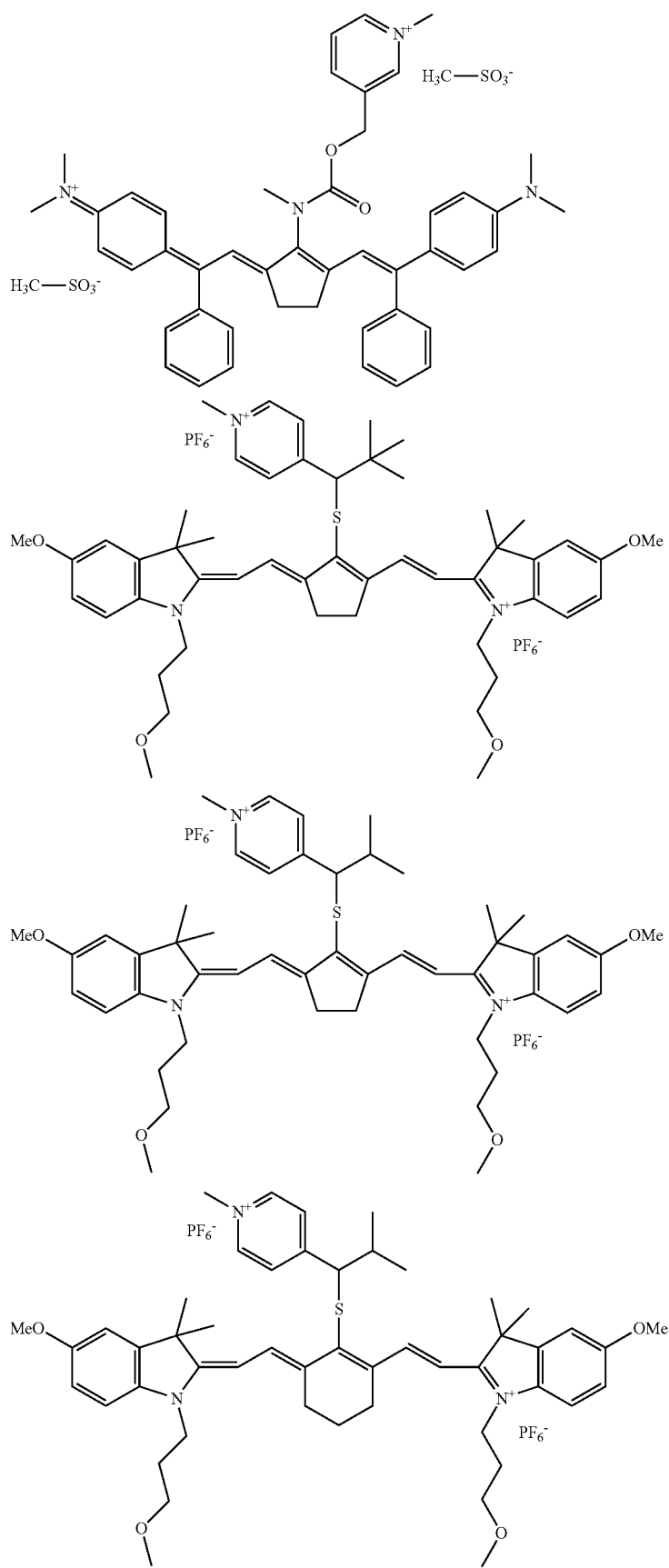

-continued
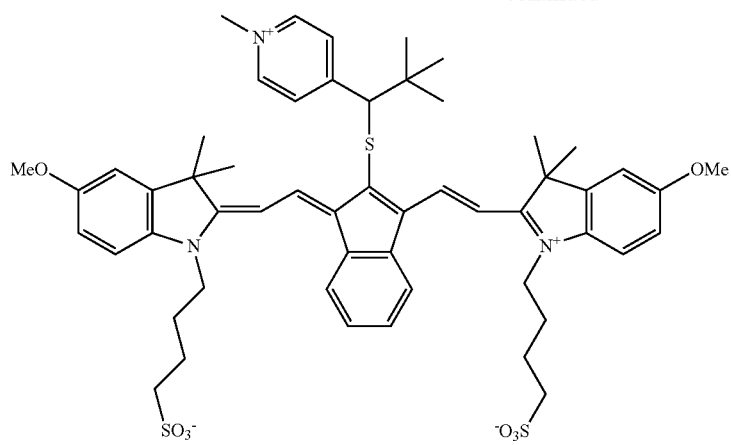
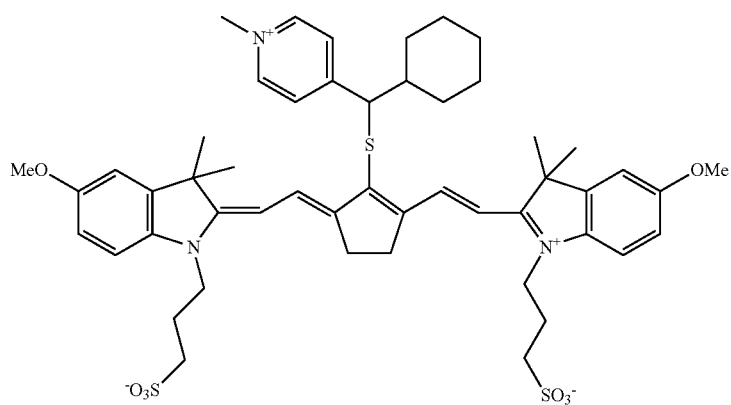
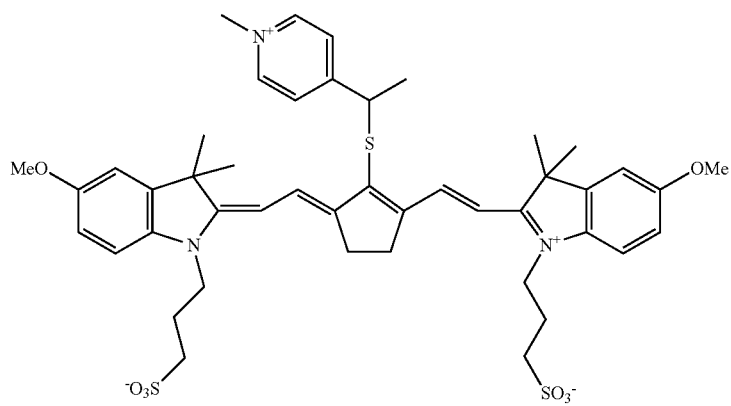
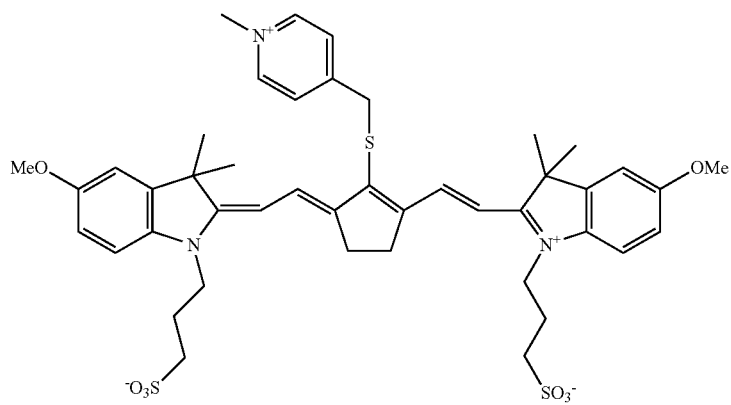

-continued
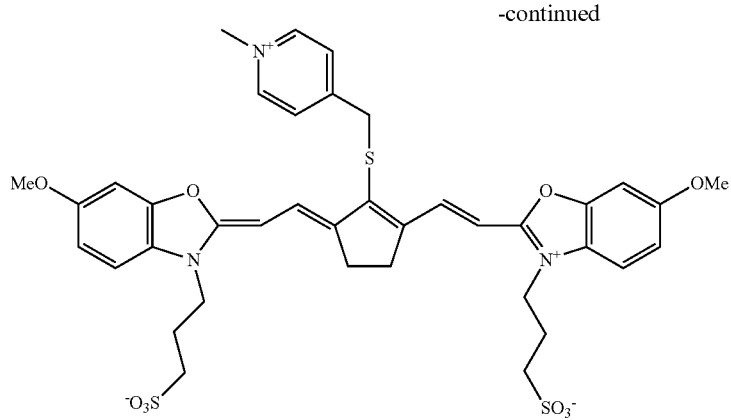
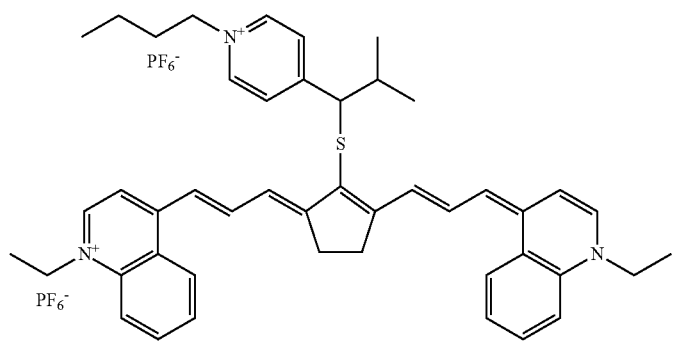
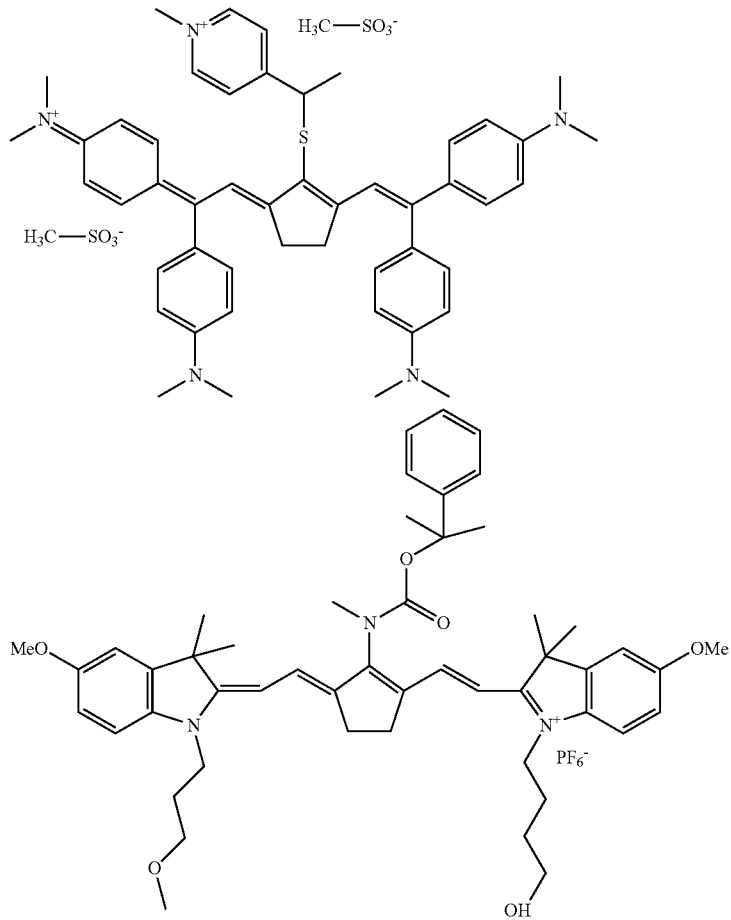

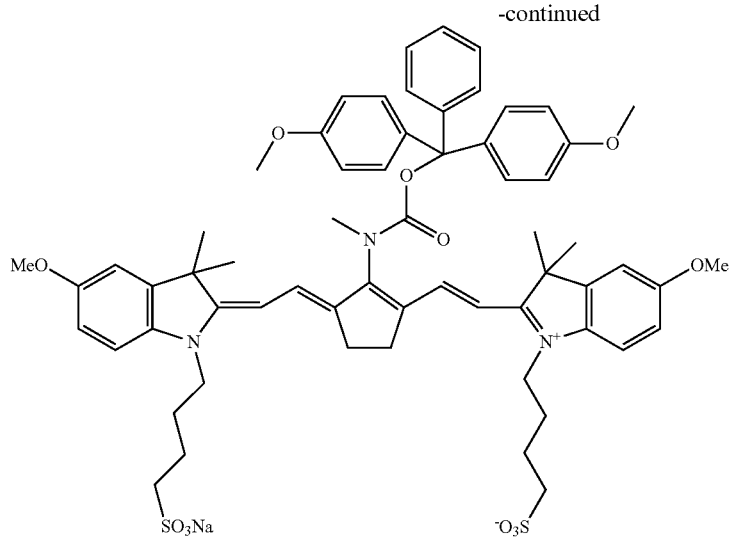
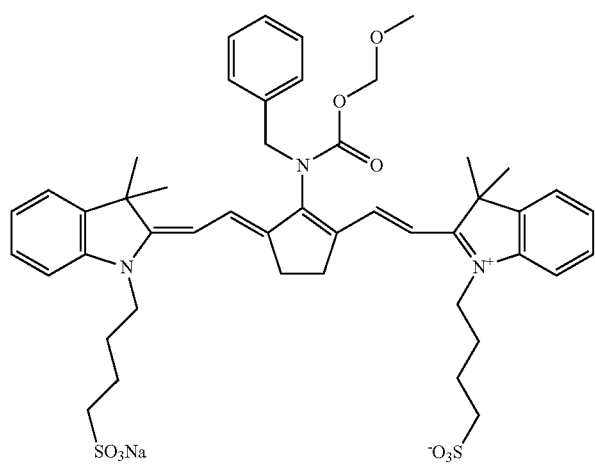
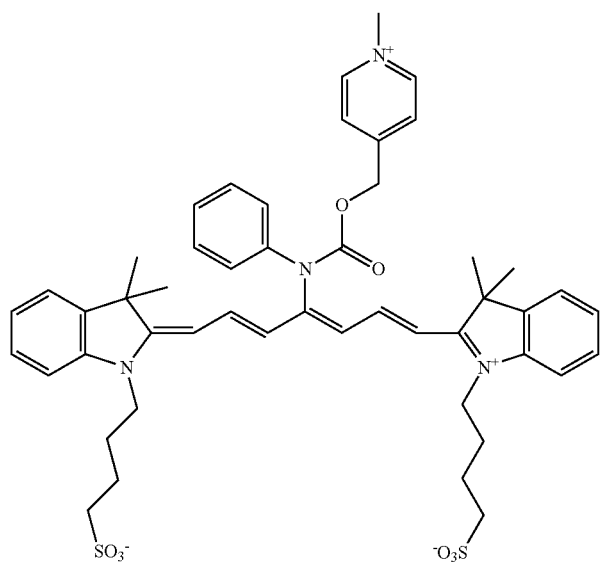

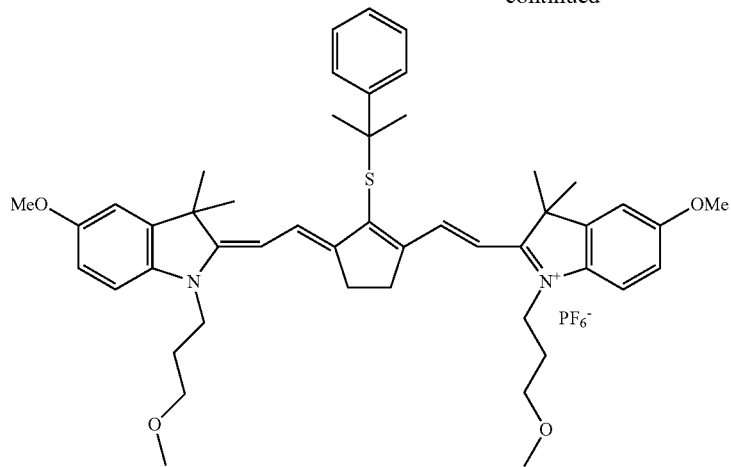
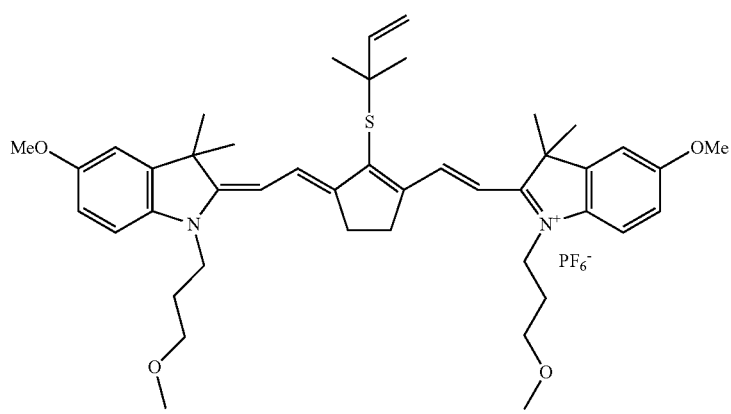
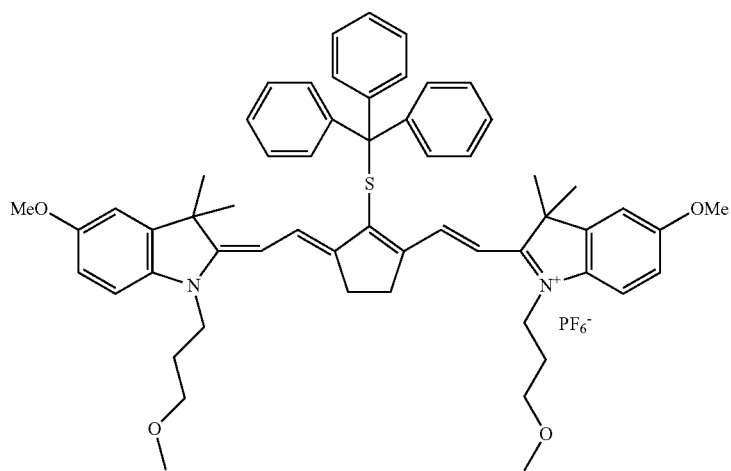

-continued
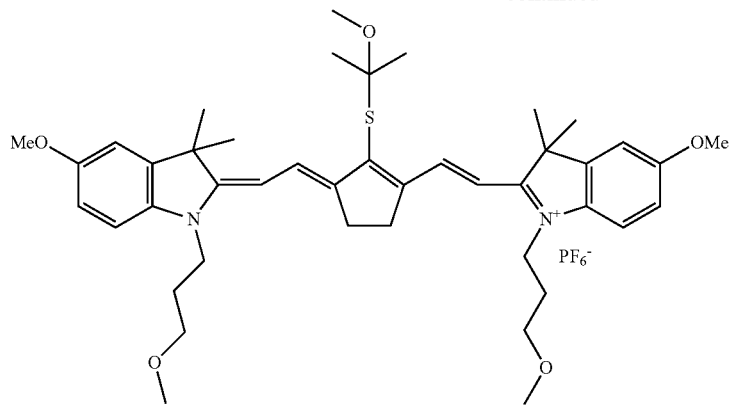
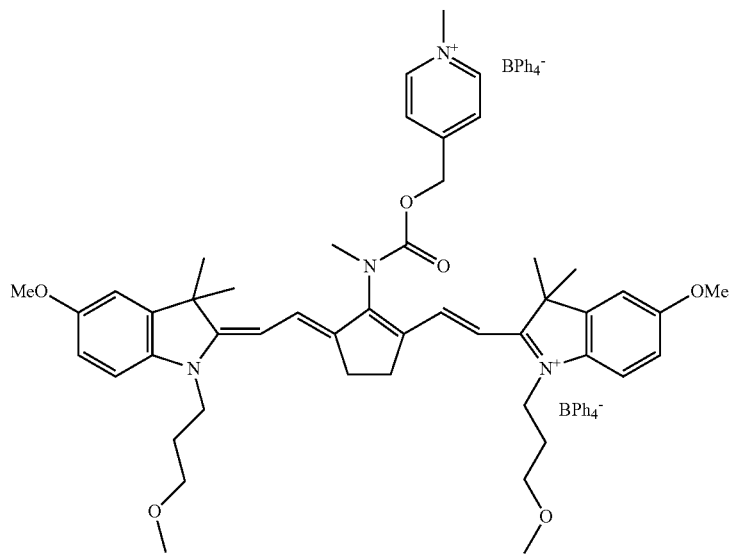
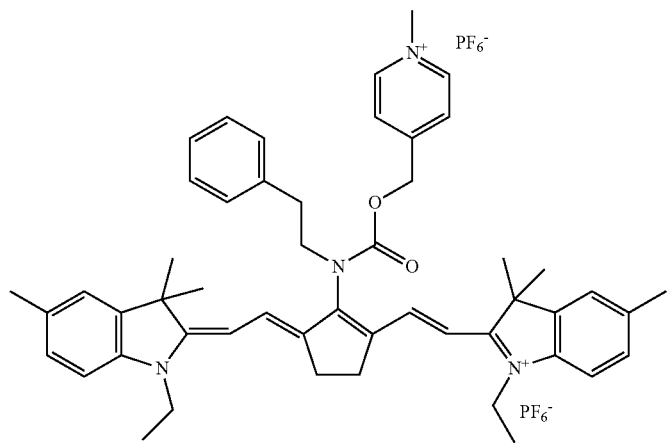

-continued

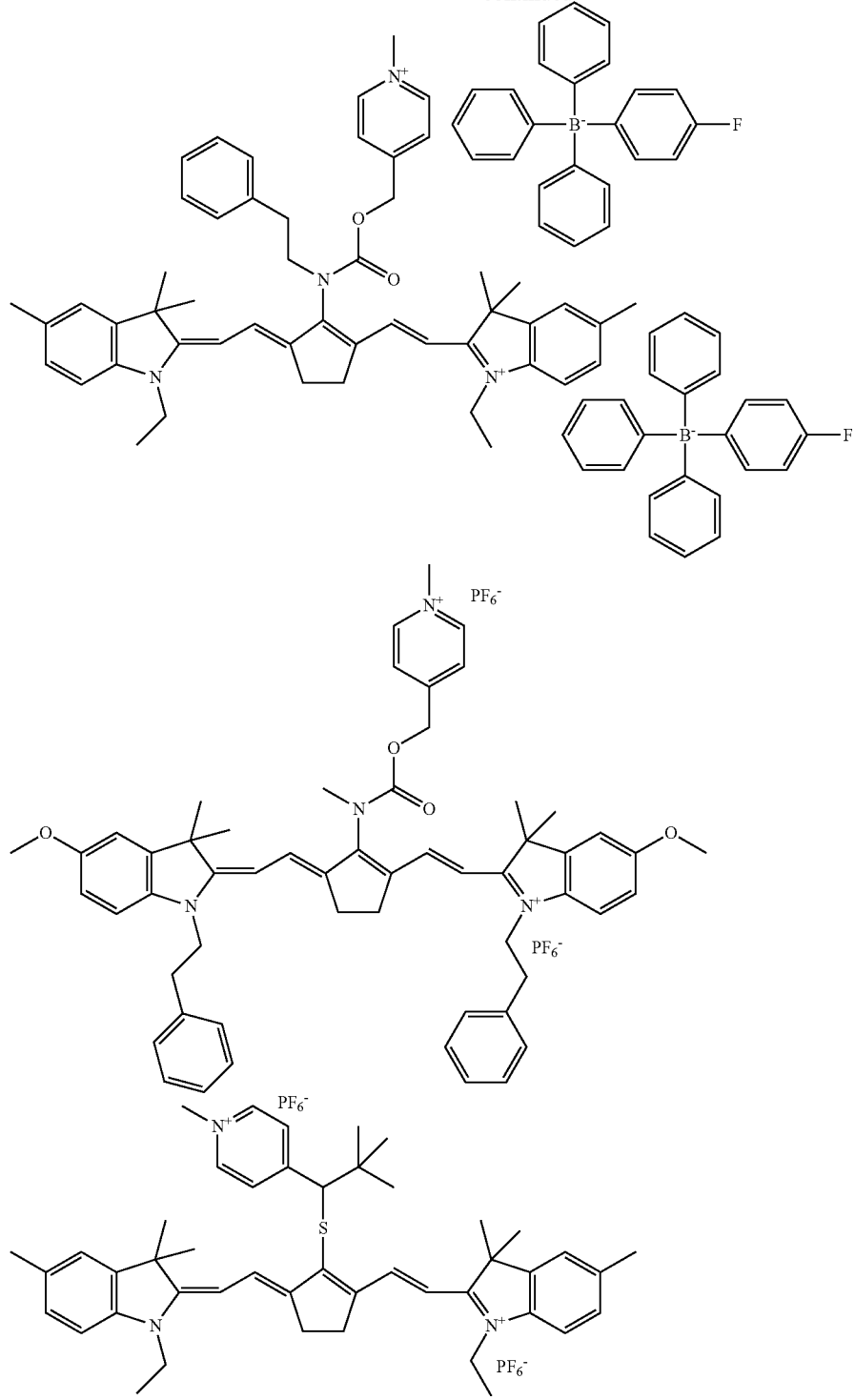

The compound represented by Formula 1 or Formula 2 can be synthesized by applying a well-known method.

The compound represented by Formula 1 can be synthesized according to the following scheme 1 or scheme 2. For example, in the case of a compound in which L is a sulfur atom in Formula 1 and $R^1$ is the group represented by Formula (2-1), a method according to the following scheme 1 is preferably exemplified. In addition, in the case of a compound in which L is —$NR^{10}$— in Formula 1 and $R^1$ that bonds to N is the group represented by Formula (3-1), a method according to the following scheme 2 is preferably exemplified.

In the following schemes 1 and 2, individual signs are the same as the signs in Formula 1, Formula (2-1), and Formula (3-1).

(Scheme 1)

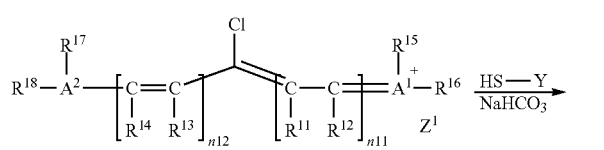 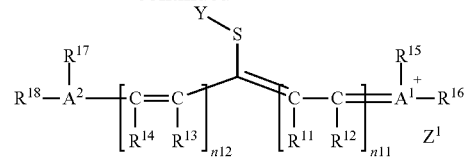

(Scheme 2)

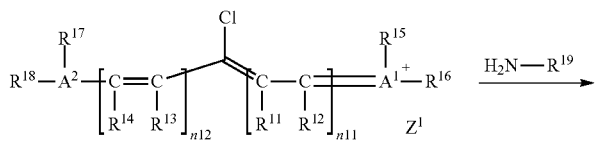

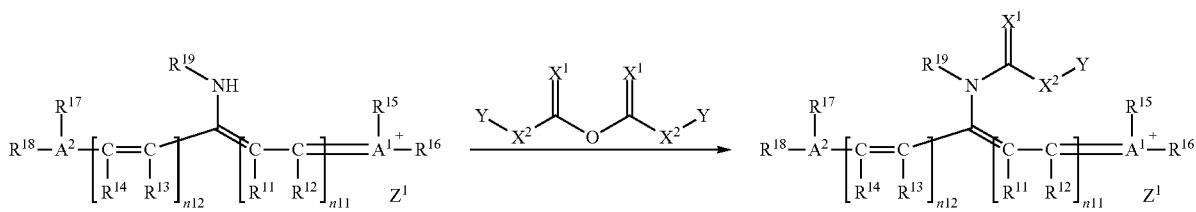

Furthermore, a preferred example of a method for introducing a group represented by any of Formulae (1-1), (1-5), and (1-6) include synthesis schemes represented by Formulae (S1) to (S3). In addition, preferred examples of a method for introducing a group represented by any of Formulae (1-2) to (1-4) include a synthesis scheme represented by Formulae (S4).

In the following formulae, DMAP represents N,N-dimethylamino-4-pyridine, AcONa represents sodium acetate, NEt₃ represents triethylamine, and catecol represents catechol. In addition, R represents a group corresponding to each portion in Formula 2.

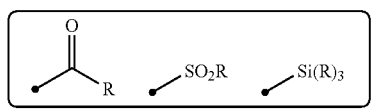

(S1)

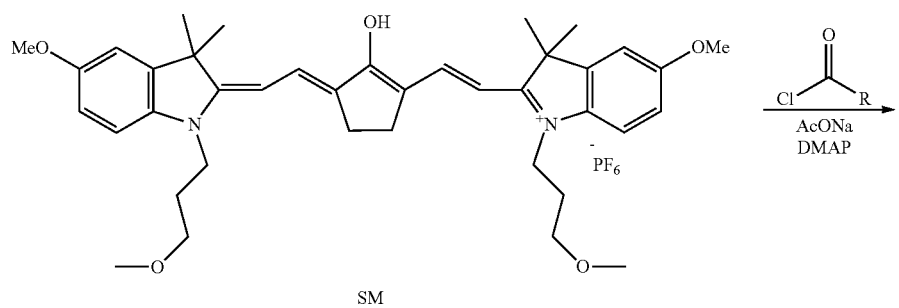

-continued
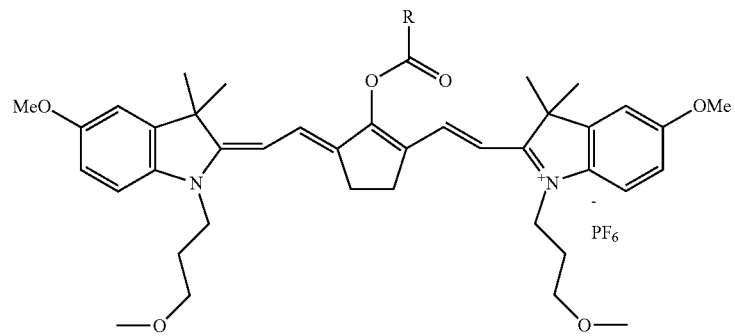
(S2)
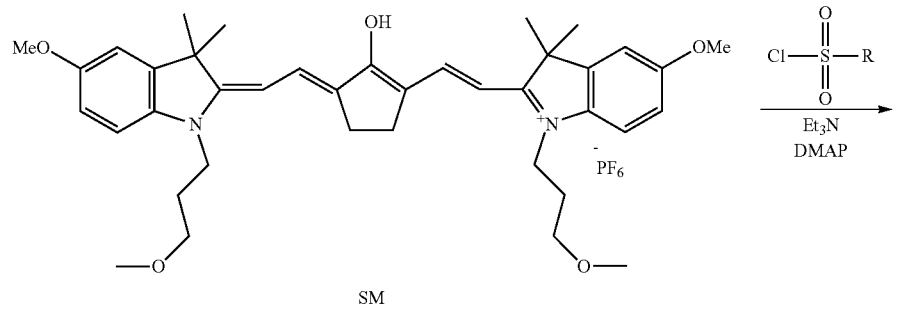
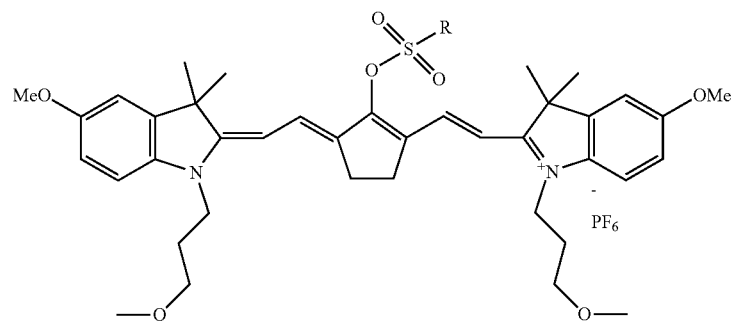
(S3)
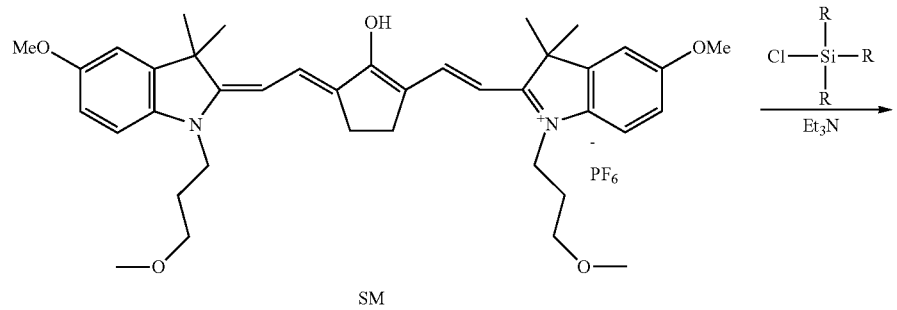
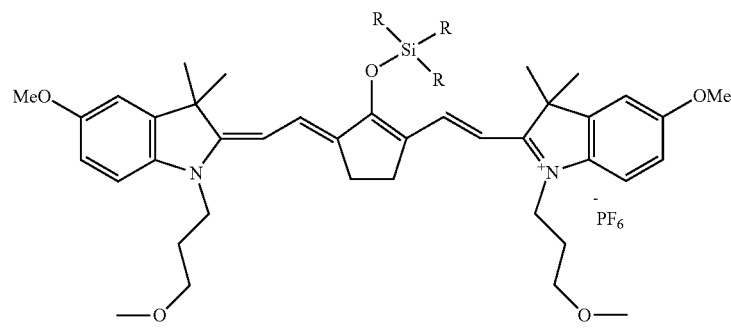
(S3)

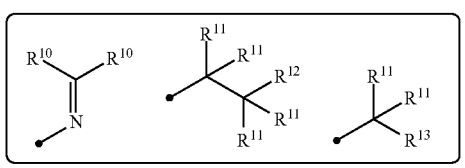

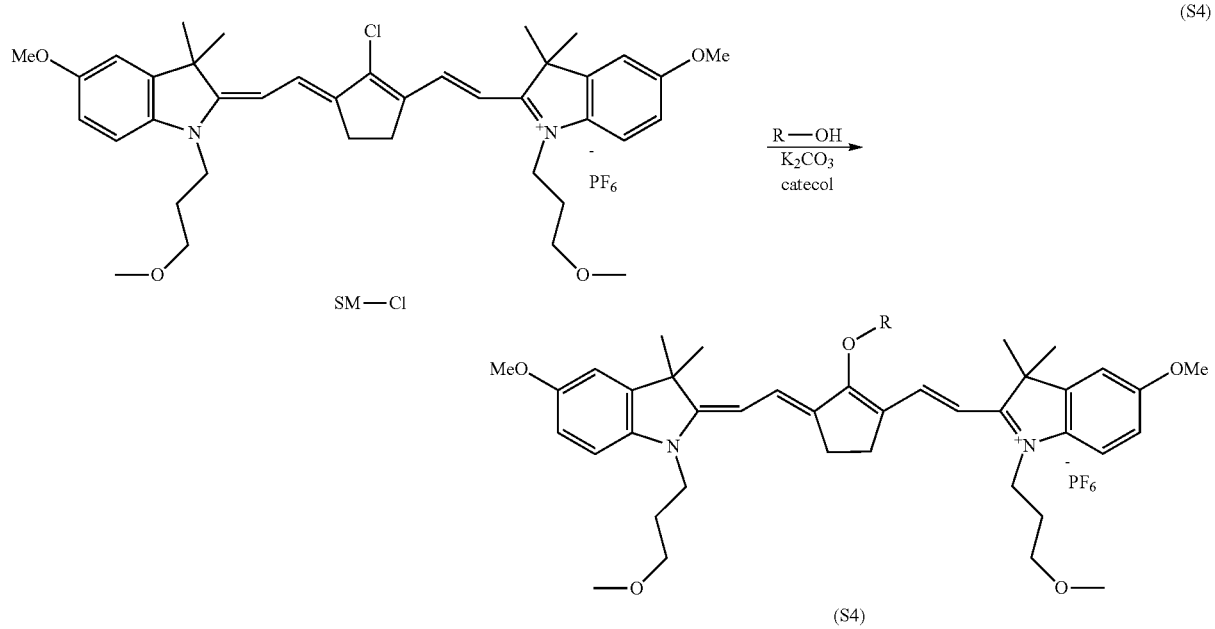

The decomposable infrared absorbing dye may be used singly or two or more decomposable infrared absorbing dyes may be jointly used.

In the image-recording layer in the lithographic printing plate precursor according to the embodiment of the present invention, the content of the decomposable infrared absorbing dye is preferably 0.1% to 95% by mass, more preferably 1% to 50% by mass, and still more preferably 1% to 40% by mass of the total solid content of the image-recording layer.

The decomposable infrared absorbing dye has an excellent infrared-absorbing performance on its own and thus favorably functions as an infrared absorber. Therefore, in the case of using the decomposable infrared absorbing dye in the image-recording layer in the lithographic printing plate precursor, actually, it is not necessary to use an infrared absorber other than the decomposable infrared absorbing dye.

<Color Developer>

The color developer contained in the image-recording layer is a compound that develops color due to exposure to an infrared ray. The color developer is classified on the basis of the difference in color development mechanism into a color developer that develops color by heat (hereinafter, also referred to as "heat color developer") and a color developer that develops color by an acid (hereinafter, also referred to as "acid color developer").

(Heat Color Developer)

The heat color developer is a compound which has a chemical structure that changes by heat generated from the decomposable infrared absorbing dye by exposure to an infrared ray and significantly shifts in the absorption wavelength and thus absorbs light in the visible light range. As the heat color developer, a spiropyran compound, a spirooxazine compound, a spirolactone compound, a spirolactam compound, and the like are exemplified. These compounds also function as an acid-generating agent in a case in which an acid-generating agent coexists.

Specific examples of the compound that functions as the heat color developer will be illustrated below, but the present invention is not limited thereto.

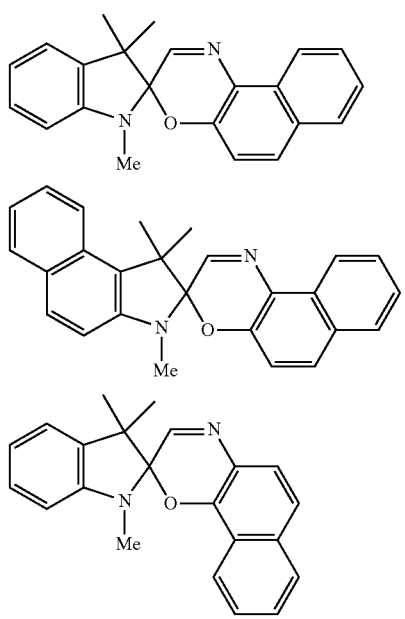

103
-continued
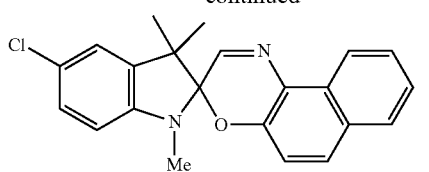
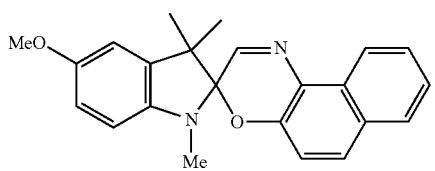
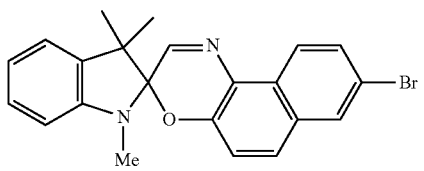
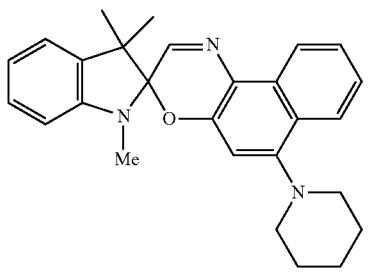
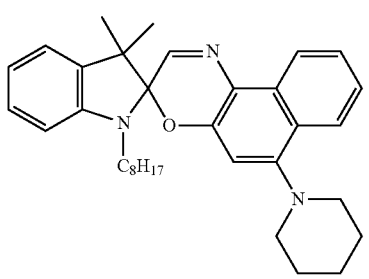
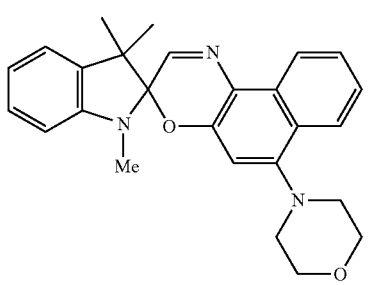
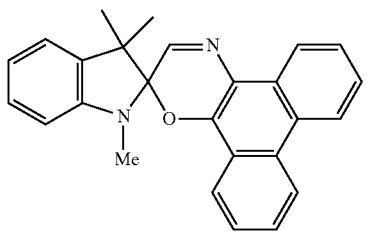
104
-continued
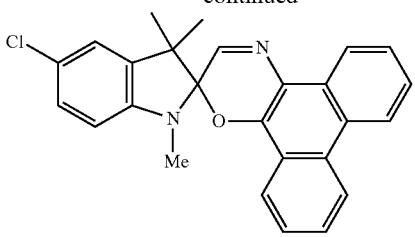
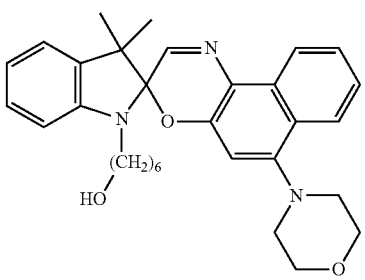
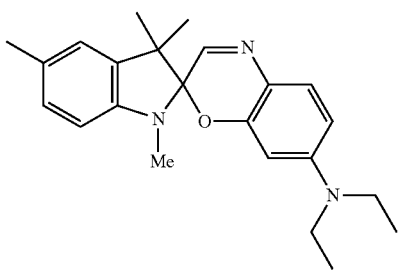
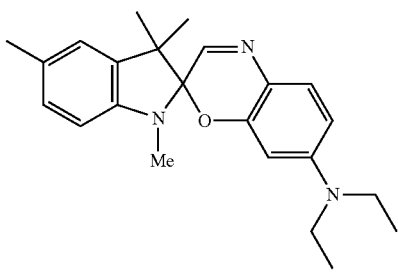
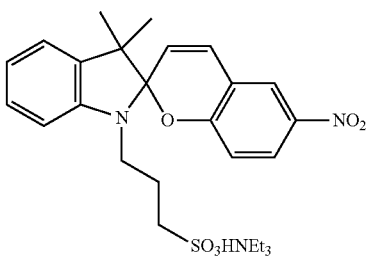
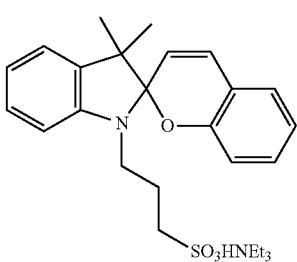

-continued

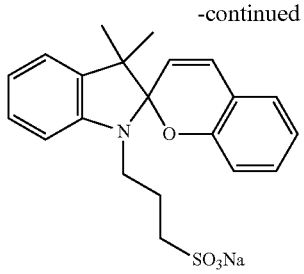

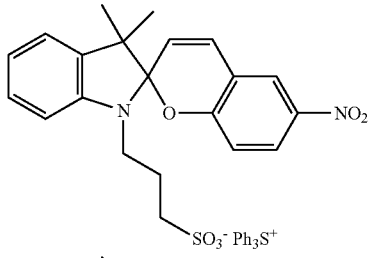

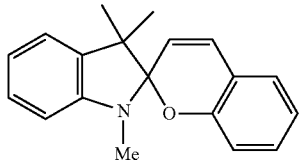

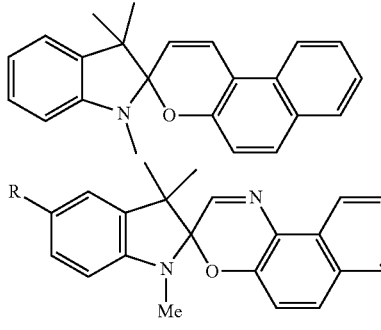

R = Cl
OMe

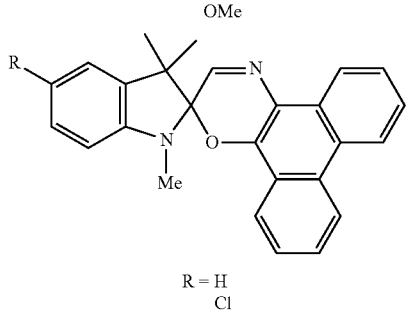

R = H
Cl

Furthermore, the following compounds are also preferably used.

Benzoyl leuco methylene blue, 2-[3,6-bis(diethylamino)]-6-(0-chloroanilino)xanthylbenzoic acid lactam, 2-[3,6-bis(diethylamino)]-9-(0-chloroanilino)xanthylbenzoic acid lactam, 3,3-bis(p-dimethylaminophenyl)-phthalide, 3,3-bis(p-dimethylaminophenyl)-6-dimethylaminophthalide (another name: crystal violet lactone), 3,3-bis(p-dimethylaminophenyl)-6-diethylaminophthalide, 3,3-bis(p-dimethylaminophenyl)-6-chlorophthalide, 3,3-bis(p-dibutylaminophenyl)phthalide, 3-(2-methoxy-4-dimethylaminophenyl)-3-(2-hydroxy-4,5-dichlorophenyl)phthalide, 3-(2-hydroxy-4-dimethylaminophenyl)-3-(2-methoxy-5-chlorophenyl) phthalide, 3-(2-hydroxy-4-dimethoxyaminophenyl)-3-(2-methoxy-5-chlorophenyl)phthalide, 3-(2-hydroxy-4-dimethoxyaminophenyl)-3-(2-methoxy-5-nitrophenyl) phthalide, 3-(2-hydroxy-4-diethylaminophenyl)-3-(2-methoxy-5-methylphenyl)phthalide, 3-(2-methoxy-4-dimethylaminophenyl)-3-(2-hydroxy-4-chloro-5-methoxyphenyephthalide, 3,6-bis(dimethylamino)fluorene spiro(9,3 ')-6'-dimethylaminophthalide, 6'-chloro-8'-methoxy-benzoindolino-spiropyran, 6'-bromo-2'-methoxy-benzoindolino-spyropyran, and the like.

(Acid Color Developer)

The acid color developer is a compound which has a chemical structure that changes by an acid generated from an acid-generating agent by exposure to an infrared ray and significantly shifts in the absorption wavelength and thus absorbs light in the visible light range. As the acid color developer, a spiropyran compound, a spirooxazine compound, a spirolactone compound, a spirolactam compound, and the like are exemplified. The image-recording layer containing the acid color developer and an acid-generating agent is preferred from the viewpoint of color developability.

As the acid color developer, a spirolactone compound represented by Formula 3 is preferably exemplified.

Formula 3

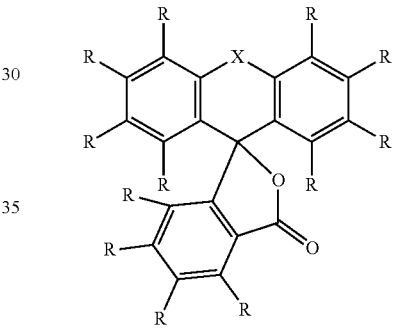

In Formula 3, X represents an oxygen atom, a sulfur atom, or —NR$^{19}$—, and R$^{19}$ represents a hydrogen atom, an alkyl group, or an aryl group. R's each independently represent a hydrogen atom or a monovalent substituent.

In Formula 3, the alkyl group represented by R$^{19}$ is preferably an alkyl group having 1 to 30 carbon atoms, more preferably an alkyl group having 1 to 15 carbon atoms, and still more preferably an alkyl group having 1 to 10 carbon atoms. The alkyl group may be linear or may have a branch or a ring structure.

Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

Among the above-described alkyl groups, a methyl group, an ethyl group, a propyl group, or a butyl group is preferred.

The alkyl group may have a substituent. Examples of the substituent include an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, a group formed of a combination thereof, and the like.

The aryl group represented by $R^{19}$ is preferably an aryl group having 6 to 30 carbon atoms, more preferably an aryl group having 6 to 20 carbon atoms, and still more preferably an aryl group having 6 to 12 carbon atoms.

The aryl group may have a substituent. Examples of the substituent include an alkyl group, an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, a group formed of a combination thereof, and the like.

Specific examples thereof include a phenyl group, a naphthyl group, a p-tolyl group, a p-chlorophenyl group, a p-fluorophenyl group, a p-methoxyphenyl group, a p-dimethylaminophenyl group, a p-methyl thiophenyl group, p-phenylthiophenyl group, and the like.

Among the above-described aryl groups, a phenyl group, a p-methoxyphenyl group, a p-dimethylaminophenyl group, or a naphthyl group is preferred.

As the monovalent substituent represented by R, an alkyl group, an alkoxy group, an aryl group, an aryloxy group, an amino group, an alkylthio group, an arylthio group, a halogen atom, a carboxyl group, a carboxylate group, a sulfo group, a sulfonate group, an alkyloxycarbonyl group, and an aryloxycarbonyl group are preferred. Here, for the alkyl group and the aryl group that are included as the monovalent substituent, it is possible to cite the description of the alkyl group and the aryl group as $R^{19}$.

In Formula 3, X is preferably an oxygen atom from the viewpoint of color development efficiency.

Specific examples of a compound functioning as the acid color developer will be illustrated below, but the present invention is not limited thereto.

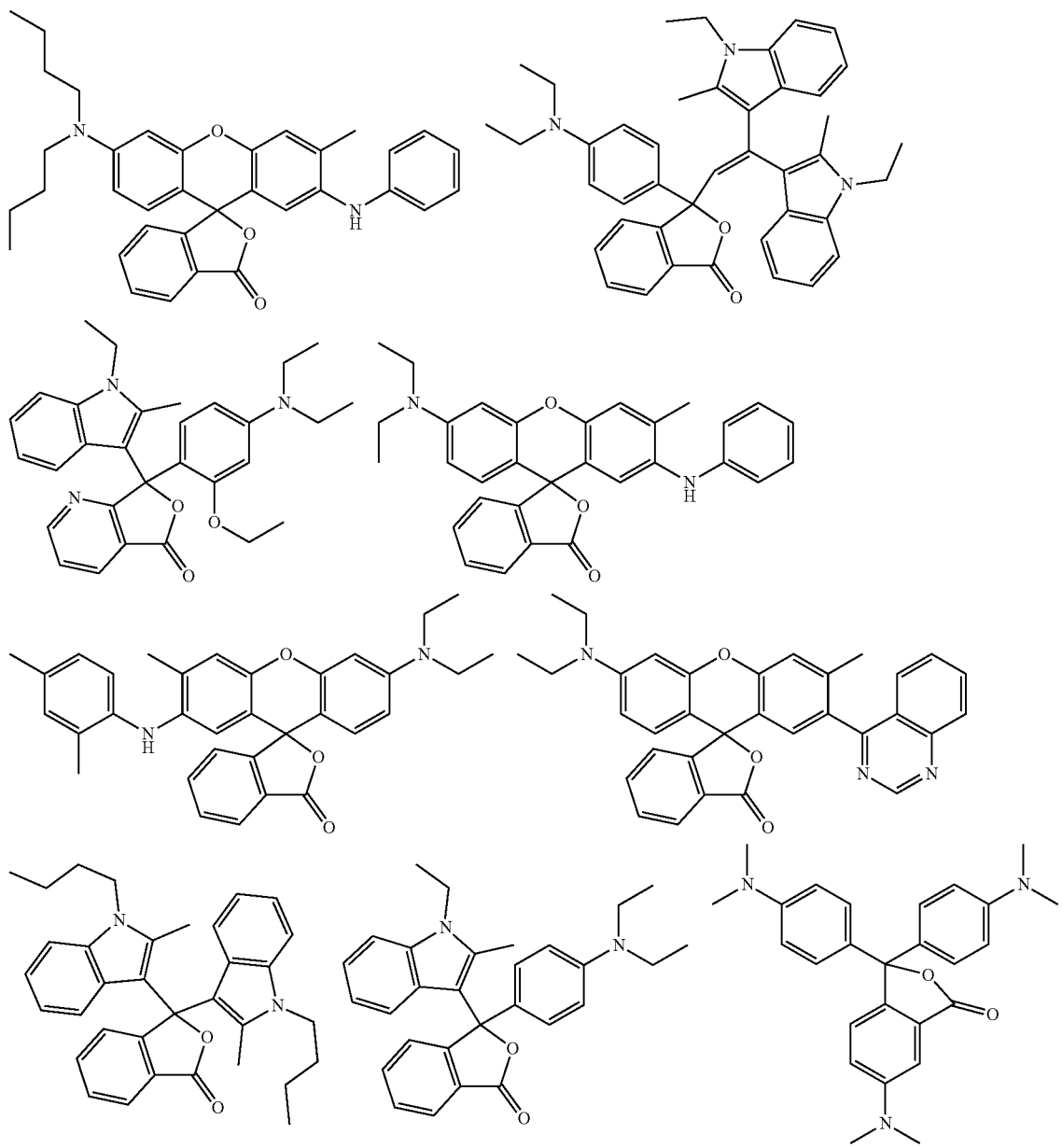

-continued
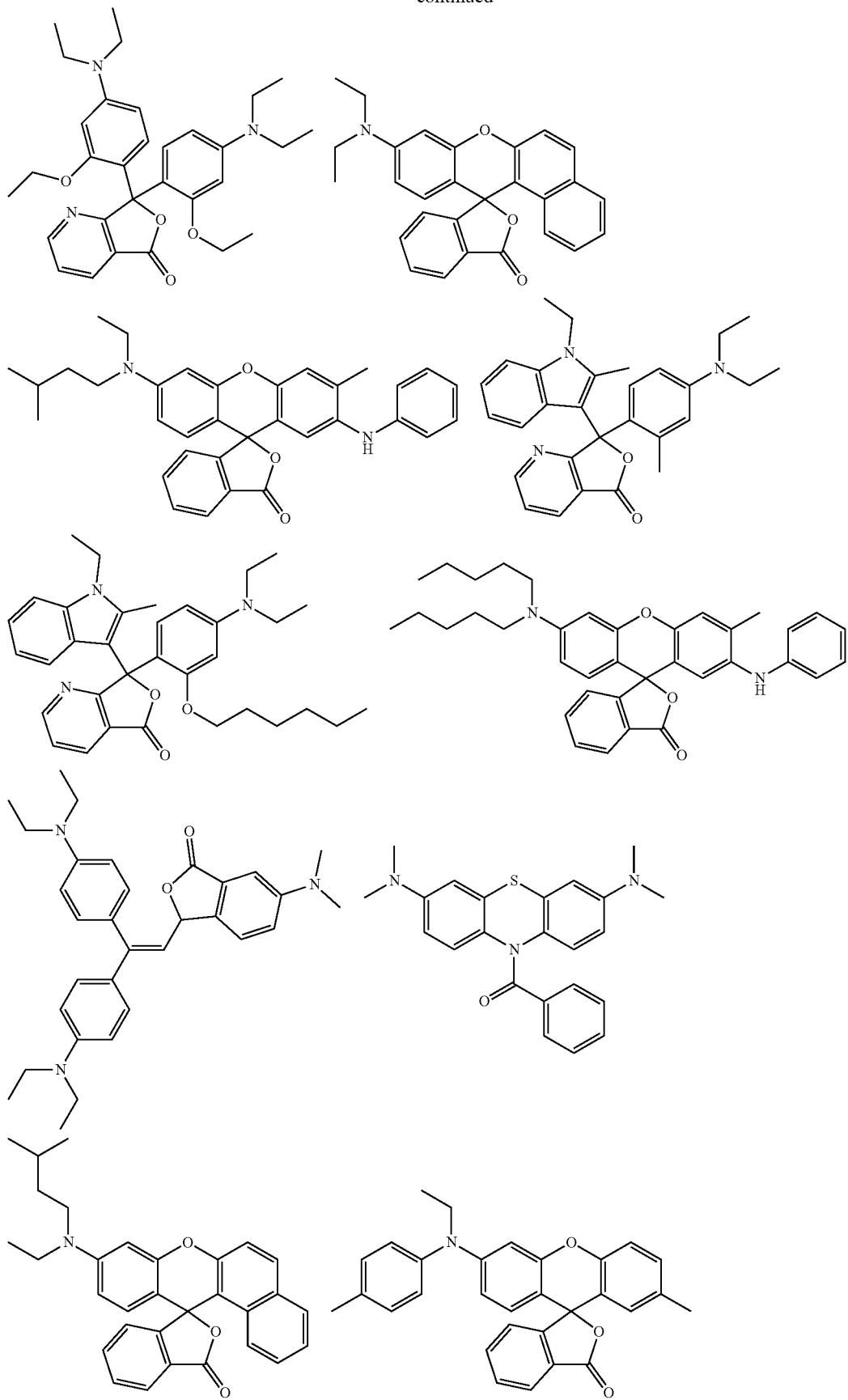

-continued
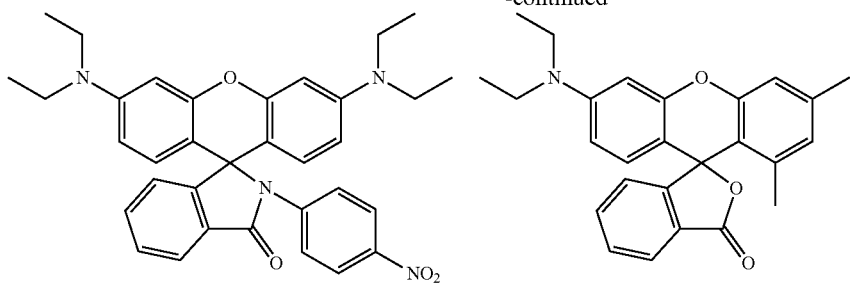
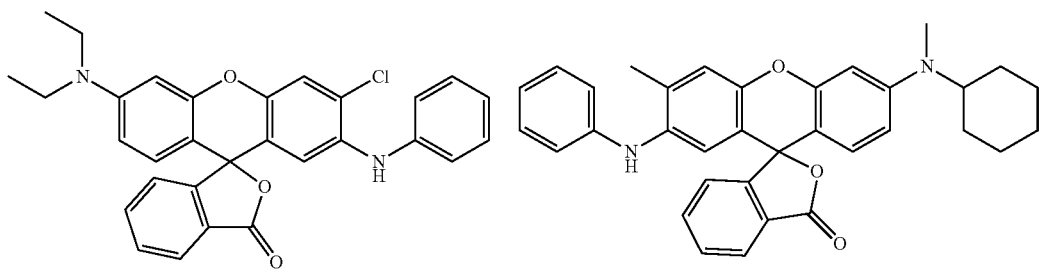
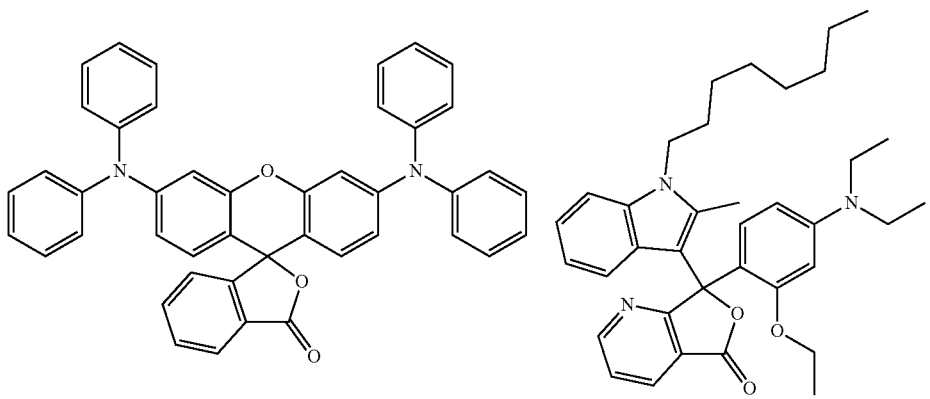
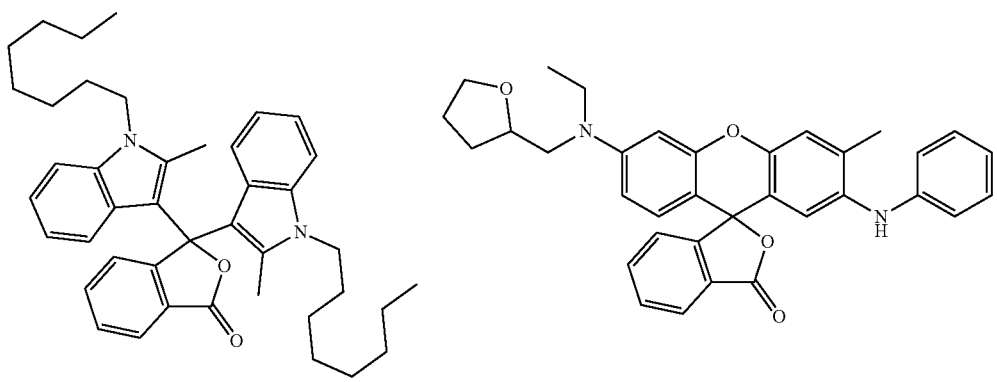
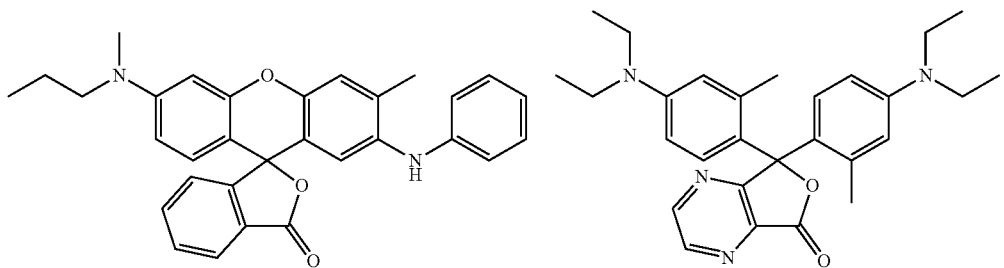

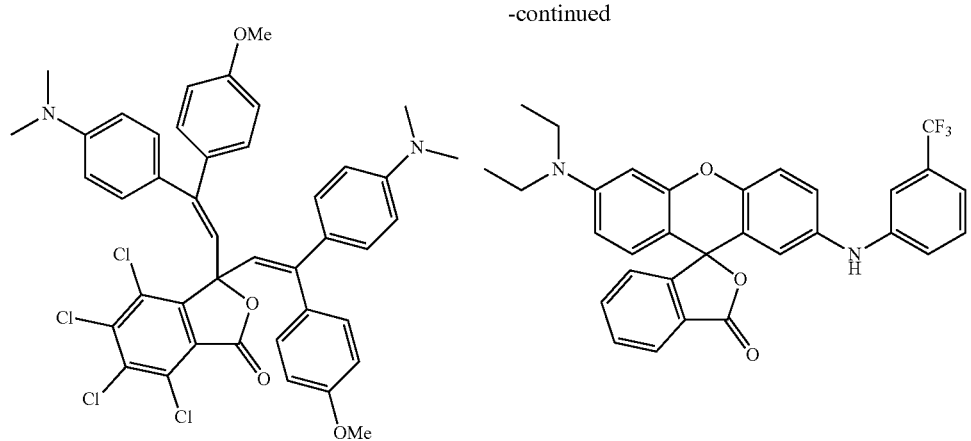
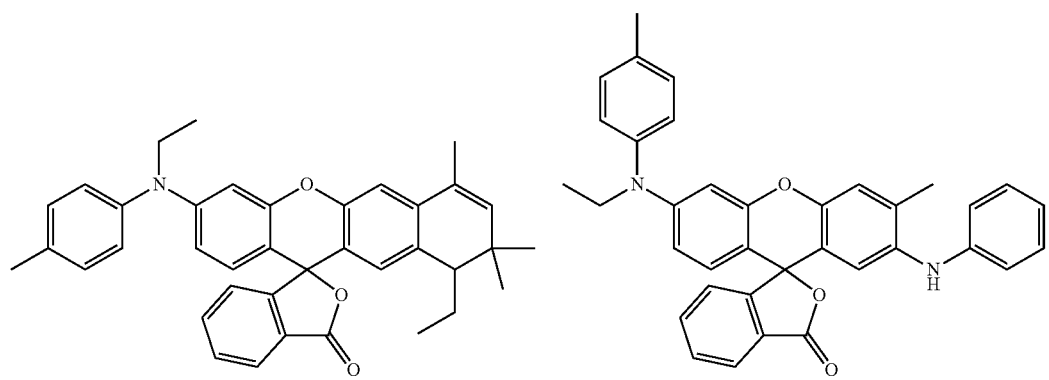
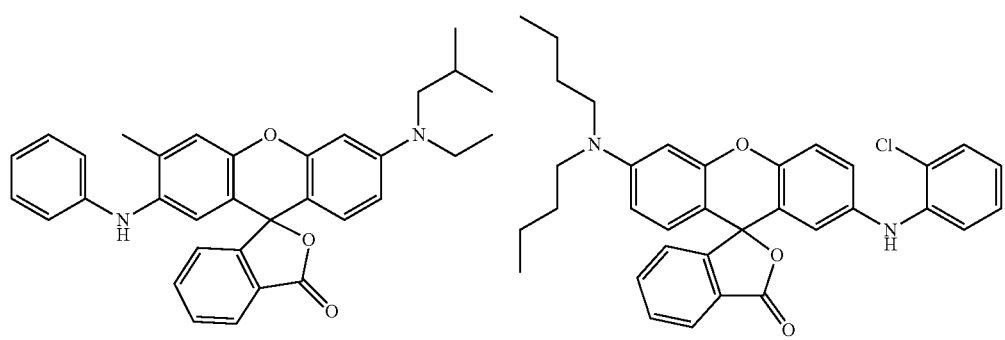
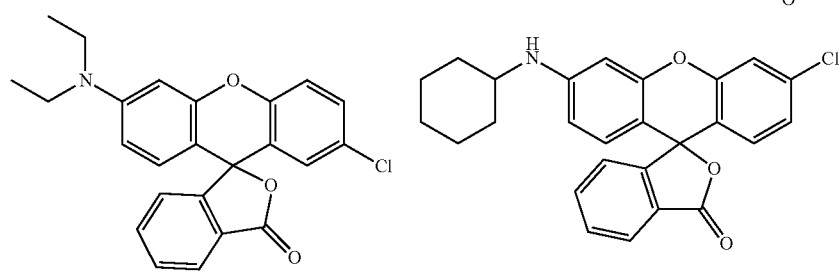
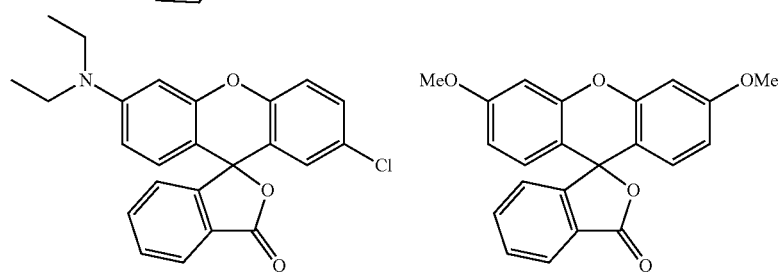

-continued
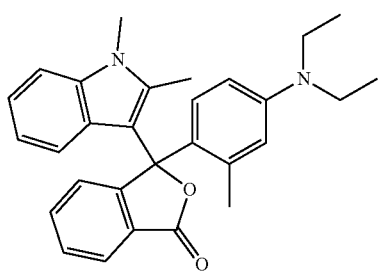
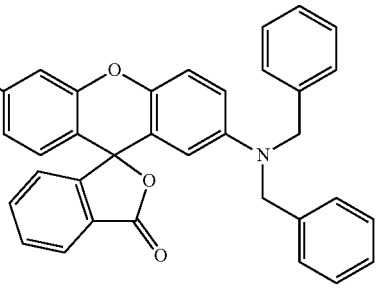
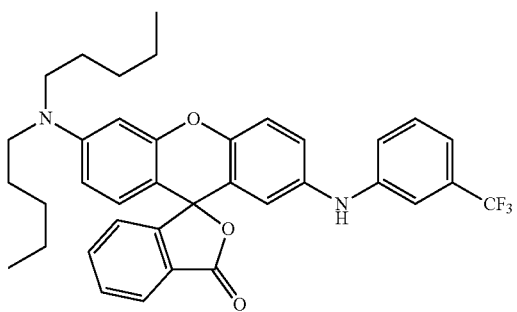
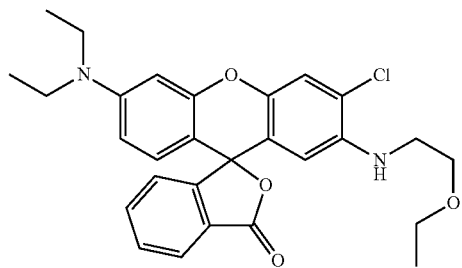
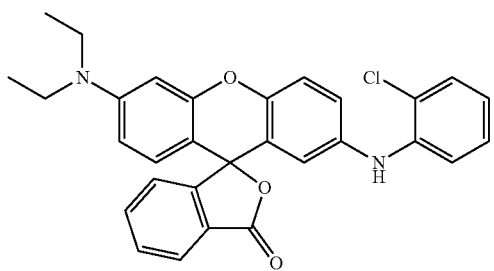
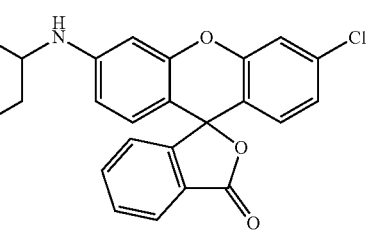
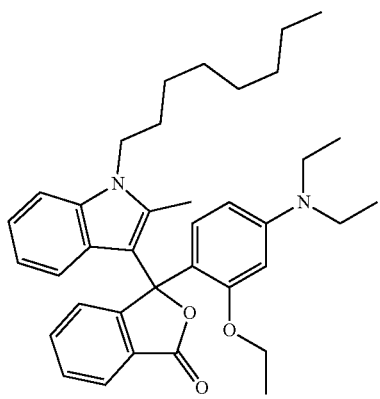
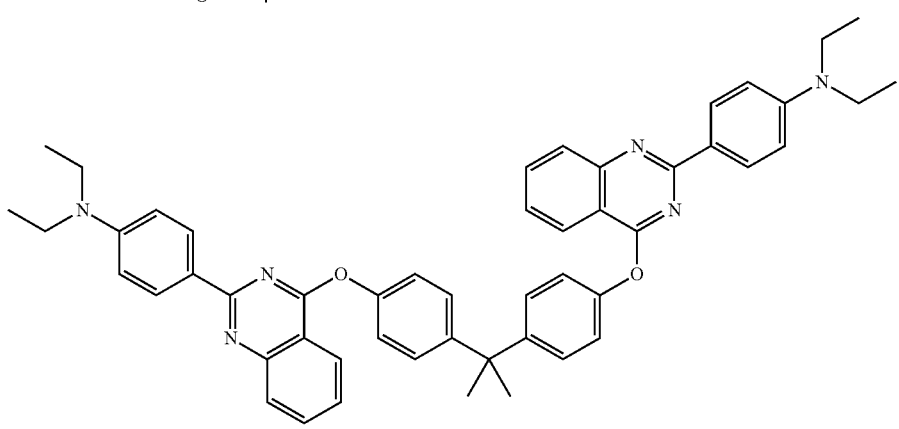

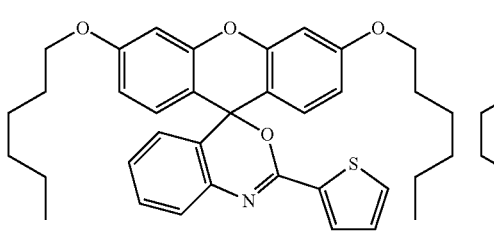
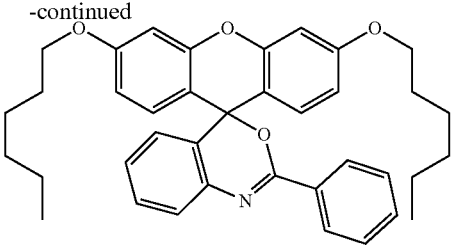

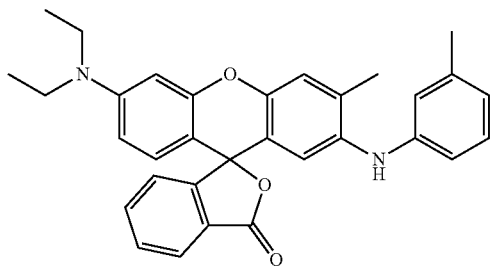
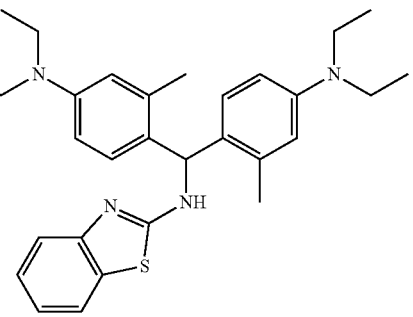

The color developer may be used singly or two or more color developers may be jointly used.

In the image-recording layer in the lithographic printing plate precursor according to the embodiment of the present invention, the content of the color developer is preferably 0.01% to 30% by mass, more preferably 0.05% to 25% by mass, and still more preferably 0.1% to 20% by mass of the total solid content of the image-recording layer.

<Acid-Generating Agent>

The acid-generating agent is a compound that generates an acid to exposure to an infrared ray. As the acid-generating agent, an electron-donating acid-generating agent and an electron-accepting acid-generating agent are exemplified.

From the viewpoint of accelerating the formation of the color developing body of the decomposable infrared absorbing dye, an electron-donating acid-generating agent is preferred.

(Electron-Donating Acid-Generating Agent)

The electron-donating acid-generating agent is a compound that generates an acid by an electron donated by intermolecular electron migration to one electron-removed orbital of the decomposable infrared absorbing dye in a case in which an electron of the decomposable infrared absorbing dye is excited and migrated into the molecule by exposure to an infrared ray.

As the electron-donating acid-generating agent, a borate compound is preferably exemplified.

As the borate compound, a tetraarylborate compound or a monoalkyltriarylborate compound is preferred, from the viewpoint of the stability of the compound, a tetraarylborate compound is more preferred, and a tetraarylborate compound having one or more aryl groups having a halogen atom (a fluorine atom or a chlorine atom) or an electron-attracting group such as a trifluoromethyl group or a cyano group is particularly preferred. As a counter cation that the borate compound has, an alkali metal ion or a tetraalkyl ammonium ion is preferred, and a sodium ion, a potassium ion, or a tetrabutyl ammonium ion is more preferred.

Specific examples of the borate compound will be illustrated below, but the present invention is not limited thereto. In the following compounds, $X_c^+$ represents a monovalent cation and is preferably an alkali metal ion or a tetraalkyl ammonium ion and more preferably an alkali metal ion or a tetrabutyl ammonium ion. In addition, Bu represents an n-butyl group.

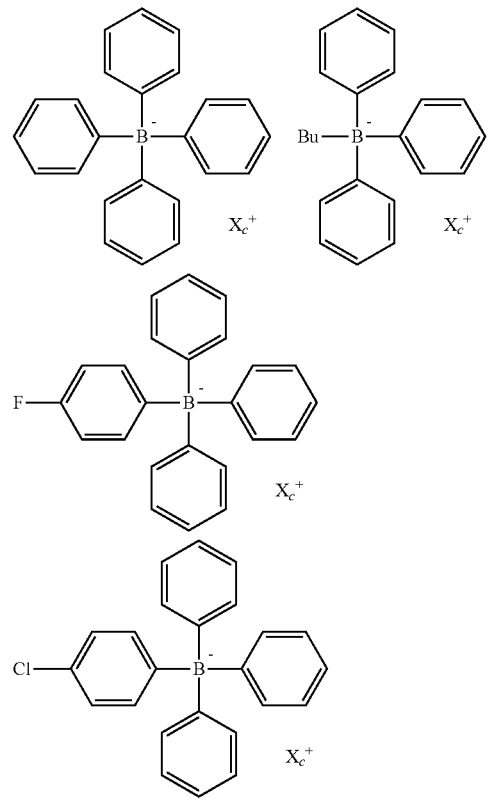

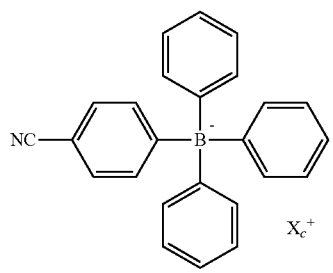
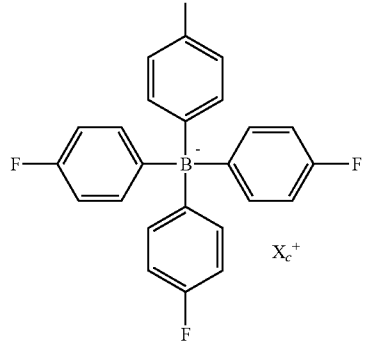
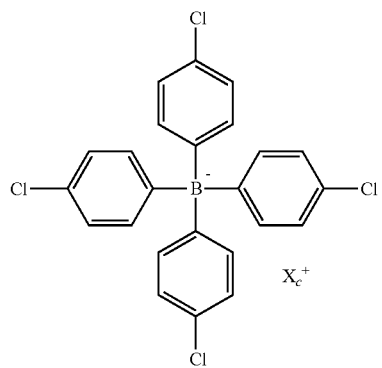
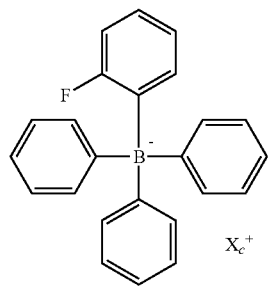
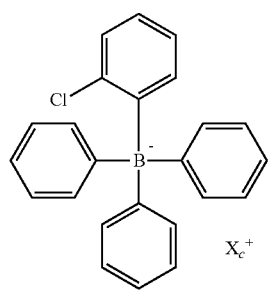
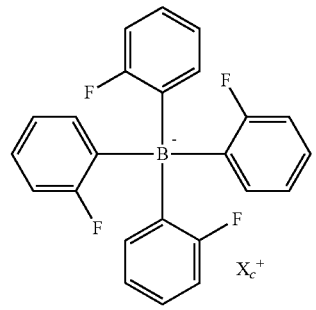
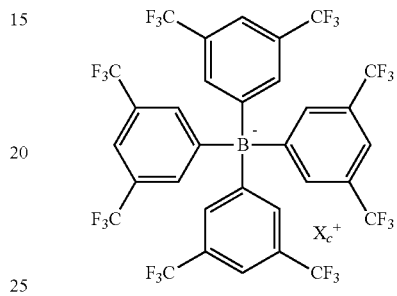
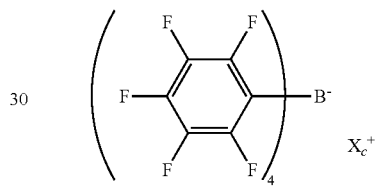
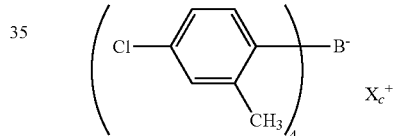
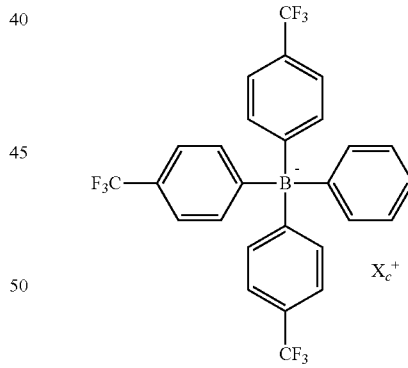
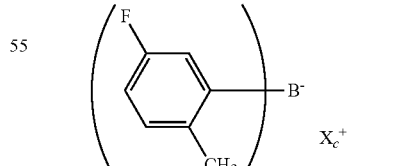
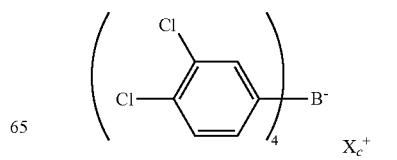

121
-continued
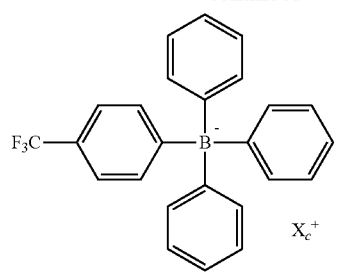
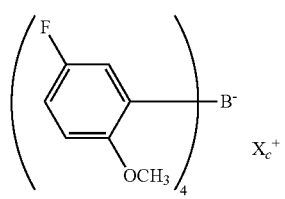
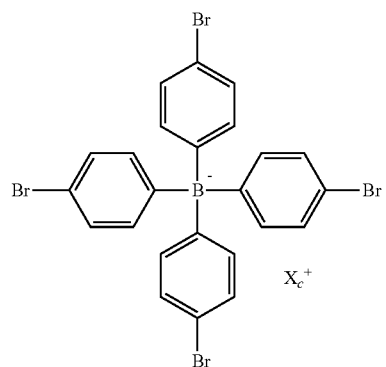
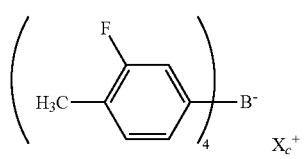
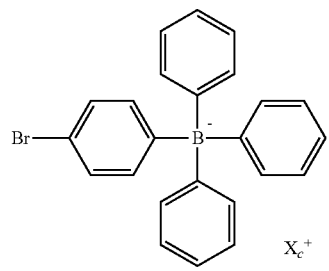
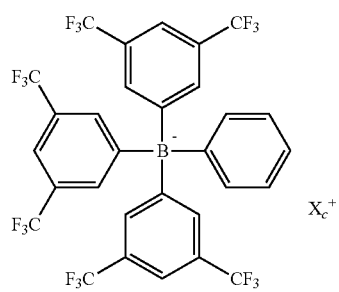
122
-continued
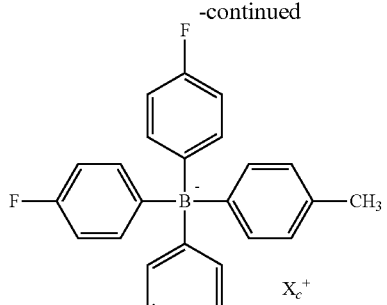
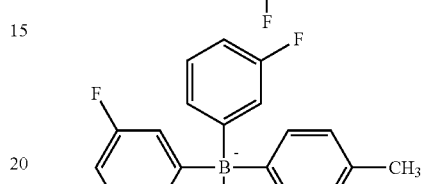
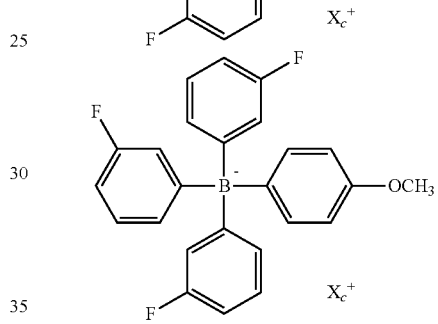
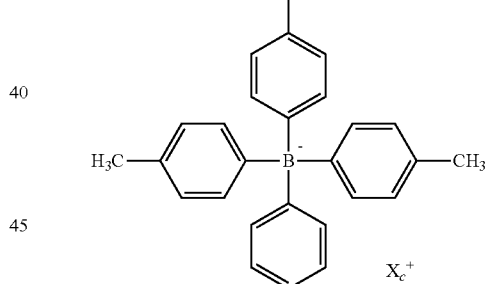
(Electron-Accepting Acid-Generating Agent)
The electron-accepting acid-generating agent is a compound that generates an acid by an electron accepted by intermolecular electron migration in a case in which an electron of the decomposable infrared absorbing dye is excited by exposure to an infrared ray.

Preferred examples of the electron-accepting acid-generating agent include onium salts such as iodonium salts, sulfonium salts, and azinium salts. Iodonium salts and sulfonium salts are particularly preferred. Specific examples of the iodonium salts and the sulfonium salts will be described below, but the present invention is not limited thereto.

Examples of the iodonium salts are preferably diphenyl iodonium salts, particularly preferably diphenyl iodonium salts having an electron-donating group as a substituent, for example, diphenyl iodonium salts substituted with alkyl groups or alkoxyl groups, and preferably asymmetric diphenyl iodonium salts. Specific examples thereof include diphenyliodonium=hexafluorophosphate, 4-methoxyphenyl-4-(2-methylpropyl)phenyliodonium=hexaflu- orophosphate, 4-(2-methylpropyl)phenyl-p-tolyiodonium=hexafluorophosphate, 4-hexyloxyphenyl-2,4,6-trimethoxyphenyl iodonium=hexafluorophosphate, 4-hexyloxyphenyl-2,4-diethoxyphenyl iodonium=tetrafluoroborate, 4-octyloxyphenyl-2,4,6-trimethoxyphenyl iodonium=1-perfluorobutane sulfonate, 4-octyloxyphenyl-2,4,6-trimethoxyphenyliodonium=hexafluorophosphate, and bis(4-tert-butylphenyl)iodonium=hexafluorophosphate.

Examples of the sulfonium salts, triarylsulfonium salts are preferred, triarylsulfonium salts having, particularly, an electron-attracting group as a substituent, for example, triarylsulfonium salts in which at least some of groups on aromatic rings are substituted with halogen atoms are preferred, and triarylsulfonium salts in which the total number of substituted halogen atoms on aromatic rings is four or greater are more preferred. Specific examples thereof include triphenylsulfonium=hexafluorophosphate, triphenylsulfonium=benzoyl formate, bis(4-chlorophenyl)phenylsulfonium=benzoyl formate, bis(4-chlorophenyl)-4-methylphenylsulfonium=tetrafluoroborate, tris(4-chlorophenyl)sulfonium=3,5-bis(methoxycarbonyl)benzenesulfonate, tris(4-chlorophenyl)sulfonium=hexafluorop- hosphate, and tris(2,4-dichlorophenyl)sulfonium=hexa- fluorophosphate.

The acid-generating agent may be used singly or two or more acid-generating agents may be jointly used. In addition, it is also preferable to jointly use the electron-donating acid-generating agent and the electron-accepting acid-generating agent. In such a case, the amount of an acid generated increases, and color developability improves.

In the image-recording layer in the lithographic printing plate precursor according to the embodiment of the present invention, the content of the acid-generating agent is preferably 0.1% to 80% by mass, more preferably 0.5% to 50% by mass, and still more preferably 0.8% to 30% by mass of the total mass of the decomposable infrared absorbing dye, the acid color developer, and the acid-generating agent.

<Polymerizable Compound>

The image-recording layer in the lithographic printing plate precursor according to the embodiment of the present invention preferably contains a polymerizable compound. The polymerizable compound that is used in the image-recording layer may be, for example, a radical polymerizable compound or a cationic polymerizable compound, but is preferably an addition polymerizable compound having at least one ethylenic unsaturated bond (ethylenic unsaturated compound). The ethylenic unsaturated compound is preferably a compound having at least one terminal ethylenic unsaturated bond and more preferably a compound having two or more terminal ethylenic unsaturated bonds. The polymerizable compound may have a chemical form, for example, a monomer, a prepolymer, that is, a dimer, a trimer, or an oligomer, or a mixture thereof.

Examples of the monomer include unsaturated carboxylic acids (for example, acrylic acid, methacrylic acid, itaconic acid, crotonic acid, isocrotonic acid, and maleic acid), esters thereof, and amides thereof. Esters of unsaturated carboxylic acids and polyhydric amine compounds and amides of unsaturated carboxylic acids and polyhydric alcohol compounds are preferably used. In addition, addition reaction products between unsaturated carboxylic acid esters or amides having nucleophilic substituents such as hydroxy groups, amino groups, or mercapto groups and monofunctional or polyfunctional isocyanates or epoxies, dehydration condensation reaction products with monofunctional or polyfunctional carboxylic acids, and the like are also preferably used. In addition, addition reaction products between unsaturated carboxylic acid esters or amides having electrophilic substituents such as isocyanate groups and epoxy groups and monofunctional or polyfunctional alcohols, amines, or thiols, furthermore, substitution reaction products between unsaturated carboxylic acid esters or amides having dissociable substituents such as halogen atoms and tosyloxy groups and monofunctional or polyfunctional alcohols, amines, or thiols are also preferred. In addition, as additional examples, compound groups obtained by substituting the unsaturated carboxylic acids with unsaturated phosphonic acids, styrene, vinyl ethers, or the like can also be used. These compounds are described in JP2006-508380A, JP2002-287344A, JP2008-256850A, JP2001-342222A, JP1997-179296A (JP-H09-179296A), JP1997-179297A (JP-H09-179297A), JP1997-179298A (JP-H09-179298A), JP2004-294935A, JP2006-243493A, JP2002-275129A, JP2003-064130A, JP2003-280187A, JP1998-333321A (JP-H10-333321A), and the like.

As specific examples of monomers of esters of polyhydric alcohol compounds and unsaturated carboxylic acids, there are acrylic acid esters include ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO)-modified triacrylate, polyester acrylate oligomers, and the like. As methacrylic acid esters, there are tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl] dimethyl methane, bis[p-(methacryloxyethoxy)phenyl] dimethyl methane, and the like. In addition, as specific examples of monomers of amides of polyhydric amine compounds and unsaturated carboxylic acids, there are methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, xylylene bismethacrylamide, and the like.

In addition, urethane-based addition polymerizable compounds produced using an addition reaction between an isocyanate and a hydroxy group are also preferred, and specific examples thereof include vinyl urethane compounds having two or more polymerizable vinyl groups in one molecule obtained by adding vinyl monomers having a hydroxy group represented by Formula (M) to a polyisocyanate compound having two or more isocyanate groups in one molecule which is described in, for example, JP1973-041708B (JP-S48-041708B).

$$CH_2=C(R^{M4})COOCH_2CH(R^{M5})OH \quad (M)$$

In Formula (M), each of $R^{M4}$ and $R^{M5}$ independently represents a hydrogen atom or a methyl group.

In addition, urethane acrylates described in JP1976-037193A (JP-S51-037193A), JP1990-32293B (JP-H02-32293B), JP1990-16765B (JP-H02-16765B), JP2003-344997A, and JP2006-065210A, urethane compounds having ethylene oxide-based skeletons described in JP1983-49860B (JP-S58-49860B), JP1981-17654B (JP-S56-17654B), JP1987-39417B (JP-S62-39417B), JP 1987-39418B (JP-S62-39418B), JP2000-250211A, and JP2007-094138A, and urethane compounds having hydrophilic groups described in U.S. Pat. No. 7,153,632B, JP1996-505958A (JP-H08-505958A), JP2007-293221A, and JP2007-293223A are also preferred.

The details of the structures of the polymerizable compound and the method for using the polymerizable compound such as whether to use the polymerizable compound singly or jointly and the amount of the polymerizable compound added can be randomly set in consideration of the applications and the like of the final lithographic printing plate precursor.

The content of the polymerizable compound is preferably 1% to 50% by mass, more preferably 3% to 30% by mass, and still more preferably 5% to 20% by mass of the total solid content of the image-recording layer.

<Polymer Particle>

The image-recording layer in the lithographic printing plate precursor according to the embodiment of the present invention preferably contains a polymer particle. The polymer particle is preferably a polymer particle capable of converting the image-recording layer to be hydrophobic in the case of being irradiated with heat. The polymer particle is preferably at least one selected from a hydrophobic thermoplastic polymer particle, a thermally reactive polymer particle, a polymer particle having a polymerizable group, a microcapsule including a hydrophobic compound, and a micro gel (crosslinking polymer particle). Among these, a polymer particle having a polymerizable group and a micro gel are preferred.

Preferred examples of the hydrophobic thermoplastic polymer particle include hydrophobic thermoplastic polymer particles described in Research Disclosure No. 33303 of January 1992 and the specifications of JP1997-123387A (JP-H09-123387A), JP1997-131850A (JP-H09-131850A), JP1997-171249A (JP-H09-171249A), JP1997-171250A (JP-H09-171250A), and EP931647B.

Specific examples of polymers that constitute the hydrophobic thermoplastic polymer particle include homopolymers or copolymers of monomers of ethylene, styrene, vinyl chloride, methyl acrylate, ethyl acrylate, methyl methacrylate, ethyl methacrylate, vinylidene chloride, acrylonitrile, vinylcarbazole, acrylates or methacrylates having polyalkylene structures, and the like and mixtures thereof. Preferred examples thereof include copolymers having polystyrene, styrene, and acrylonitrile and methyl polymethacrylate. The average particle diameter of the hydrophobic thermoplastic polymer particles is preferably 0.01 μm to 2.0 μm.

Examples of the thermally reactive polymer particle include a polymer particle having a thermally reactive group. A polymer particle having a thermally reactive group forms a hydrophobilized region through crosslinking by thermal reactions and changes in functional groups at this time.

The thermally reactive group in the polymer particle having a thermally reactive group may be a functional group that causes any reactions as long as chemical bonds are formed, but are preferably polymerizable groups. Preferred examples thereof include ethylenic unsaturated groups that cause radical polymerization reactions (for example, acryloyl groups, methacryloyl groups, vinyl groups, allyl groups, and the like), cationic polymerizable groups (for example, vinyl groups, vinyloxy groups, epoxy groups, oxetanyl groups, and the like), isocyanato groups that cause addition reactions or blocked bodies thereof, epoxy groups, vinyloxy groups, functional groups having active hydrogen atoms that are reaction partners thereof (for example, amino groups, hydroxy groups, carboxy groups, and the like), carboxy groups that cause condensation reactions, hydroxy groups or amino groups that are reaction partners, acid anhydrides that cause ring-opening addition reactions, amino groups or hydroxy groups which are reaction partners, and the like.

Examples of the microcapsules include microcapsules including all or part of the constituent components of the image-recording layer as described in JP2001-277740A and JP2001-277742A. The constituent components of the image-recording layer can also be added outside the microcapsules. A preferred aspect of the image-recording layer including the microcapsules is an image-recording layer including hydrophobic constituent components in the microcapsules and including hydrophilic constituent components outside the microcapsules.

A micro gel (crosslinking polymer particle) is capable of containing some of the constituent components of the image-recording layer in at least one of the inside or surface thereof. Particularly, an aspect of micro capsules that have radical polymerizable groups on the surfaces and thus turn into reactive micro gels is preferred from the viewpoint of image-forming sensitivity or printing resistance.

In order to put the constituent components of the image-recording layer into microcapsules or micro gels, well-known methods can be used.

The average particle diameter of the microcapsules or the micro gels is preferably 0.01 to 3.0 μm, more preferably 0.05 to 2.0 μm, and particularly preferably 0.10 to 1.0 μm. Within this range, favorable resolution and temporal stability can be obtained.

The content of the polymer particle is preferably 5% to 90% by mass of the total solid content of the image-recording layer.

<Binder Polymer>

The image-recording layer in the lithographic printing plate precursor according to the embodiment of the present invention preferably contains a binder polymer. As the binder polymer that is used in the image-recording layer, a polymer having a film property is preferred, and a well-known binder polymer that is used in the image-recording layer in the lithographic printing plate precursor can be preferably used. Particularly, as the binder polymer, a (meth) acrylic resin, a polyvinyl acetal resin, and a polyurethane resin are preferred.

As an example, a binder polymer that is used in an on-machine development-type lithographic printing plate precursor (hereinafter, also referred to as the binder polymer for on-machine development) will be described in detail.

The binder polymer for on-machine development is preferably a binder polymer having an alkylene oxide chain. The binder polymer having an alkylene oxide chain may have a poly(alkylene oxide) portion in the main chain or a side chain. In addition, the binder polymer may be a graft polymer having a poly(alkylene oxide) in a side chain or a block copolymer of a block constituted of a repeating unit containing poly(alkylene oxide) and a block constituted of a repeating unit not containing (alkylene oxide).

In a case in which the binder polymer has a poly(alkylene oxide) portion in the main chain, a polyurethane resin is preferred. Examples of a polymer in the main chain in a case in which the binder polymer has a poly(alkylene oxide) portion in a side chain include a (meth)acrylic resin, a polyvinyl acetal resin, a polyurethane resin, a polyurea resin, a polyimide resin, a polyamide resin, an epoxy resin, a polystyrene resin, a novolac-type phenolic resin, a polyester resin, synthetic rubber, and natural rubber, and a (meth)acrylic resin is particularly preferred.

The alkylene oxide is preferably an alkylene oxide having 2 to 6 carbon atoms and particularly preferably an ethylene oxide or a propylene oxide.

The repeating number of the alkylene oxide in the poly (alkylene oxide) portion is preferably 2 to 120, more preferably 2 to 70, and still more preferably 2 to 50.

In a case in which the repeating number of the alkylene oxide is 120 or smaller, there is no case in which printing resistance is degraded due to both friction and an ink-receiving property, which is preferable.

The poly(alkylene oxide) portion is preferably included in a structure represented by Formula (AO) as the side chain of the binder polymer and more preferably included in the structure represented by Formula (AO) as a side chain of the (meth)acrylic resin.

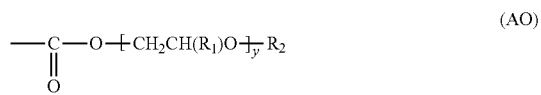

(AO)

In Formula (AO), y represents 2 to 120, $R_1$ represents a hydrogen atom or an alkyl group, and $R_2$ represents a hydrogen atom or a monovalent organic group.

The monovalent organic group is preferably an alkyl group having 1 to 6 carbon atoms, and examples thereof include a methyl group, an ethyl group, an n-propyl group, an isopropyl group, an n-butyl group, a sec-butyl group, an isobutyl group, a tert-butyl group, an n-pentyl group, an isopentyl group, a neopentyl group, an n-hexyl group, an isohexyl group, a 1,1-dimethyl butyl group, a 2,2-dimethyl butyl group, a cyclopentyl group, and cyclohexyl group.

In Formula (AO), y is preferably 2 to 70 and more preferably 2 to 50. $R_1$ is preferably a hydrogen atom or a methyl group and particularly preferably a hydrogen atom. $R_2$ is particularly preferably a hydrogen atom or a methyl group.

In order to improve the membrane hardness of image areas, the binder polymer may have a crosslinking property. In order to impart a crosslinking property to the polymer, it is necessary to introduce a crosslinking functional group such as an ethylenic unsaturated bond to the main chain or a side chain of the polymer. The crosslinking functional group may be introduced by means of copolymerization or may be introduced by a polymer reaction.

Examples of the polymer having an ethylenic unsaturated bond in the main chain of the molecules include poly-1,4-butadiene, poly-1,4-isoprene, and the like.

Examples of the polymer having an ethylenic unsaturated bond in a side chain of the molecules include polymers of an ester or amide of acrylic acid or methacrylic acid in which a residue (R of —COOR or —CONHR) of the ester or the amide has an ethylenic unsaturated bond.

Examples of the residue (the above-described R) having an ethylenic unsaturated bond include —$(CH_2)_n$—$CR^{1A}$=$CR^{2A}R^{3A}$, —$(CH_2O)_n$$CH_2CR^{1A}$=$CR^{2A}R^{3A}$, —$(CH_2CH_2O)_n$$CH_2CR^{1A}$=$CR^{2A}R^{3A}$, —$(CH_2)_n$NH—CO—O—$CH_2CR^{1A}$=$CR^{2A}C^{3A}$, —$(CH_2)_n$—O—CO—CR and —$(CH_2CH_2O)_2$—X (in the formulae, $R^{41}$ to $R^{43}$ each independently represents a hydrogen atom, a halogen atom, an alkyl group having 1 to 20 carbon atoms, an aryl group, an alkoxy group, or an aryloxy group, and $R^{41}$ and $R^{42}$ or $R^{43}$ may bond to each other to form a ring. n represents an integer of 1 to 10. X represents a dicyclopentadienyl residue.).

Specific examples of the ester residue include —$CH_2CH$=$CH_2$, —$CH_2CH_2O$—$CH_2CH$=$CH_2$, —$CH_2C(CH_3)$=$CH_2$, —$CH_2CH$=$CH$—$C_6H_5$, —$CH_2CH_2OCOCH$=$CH$—$C_6H_5$, —$CH_2CH_2$—NHCOO—$CH_2CH$=$CH_2$, and —$CH_2CH_2O$—X (in the formula, X represents a dicyclopentadienyl residue.).

Specific examples of the amide residue include —$CH_2CH$=$CH_2$, —$CH_2CH_2$—Y (in the formula, Y represents a cyclohexene residue.), and —$CH_2CH_2$—OCO—$CH$=$CH_2$.

The binder polymer having a crosslinking property is cured as described below. For example, a free radical (a polymerization-initiating radical or a radical growing in the polymerization process of a polymerizable compound) is added to the crosslinking functional group and is addition-polymerized between the polymers directly or through a polymerization chain of the polymerizable compound, thereby forming a crosslinking between polymer molecules. Alternatively, an atom in the polymer (for example, a hydrogen atom on a carbon atom adjacent to the functional crosslinking group) is removed by a free radical, polymer radicals are generated, and the polymer radicals bond to each other, thereby forming and curing a crosslinking between polymer molecules.

The content of the crosslinking group in the binder polymer (the content of an unsaturated double bond that can be radical-polymerized by means of iodimetry) is preferably 0.1 to 10.0 mmol, more preferably 1.0 to 7.0 mmol, and particularly preferably 2.0 to 5.5 mmol per gram of the binder polymer from the viewpoint of a favorable sensitivity and favorable storage stability.

Hereinafter, specific examples 1 to 11 of the binder polymer for on-machine development will be illustrated, but the present invention is not limited thereto. In the following exemplary compounds, numeric values shown together with individual repeating units (numeric values shown together with main chain repeating units) represent the molar percentages of the repeating units. The numeric value shown together with the repeating unit of a side chain represents the repeating number of the repeating portions. In addition, Me represents a methyl group; Et represents an ethyl group, and Ph represents a phenyl group.

(1)

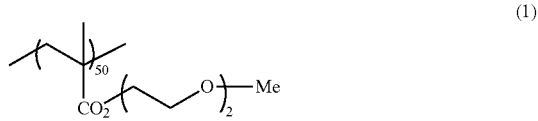

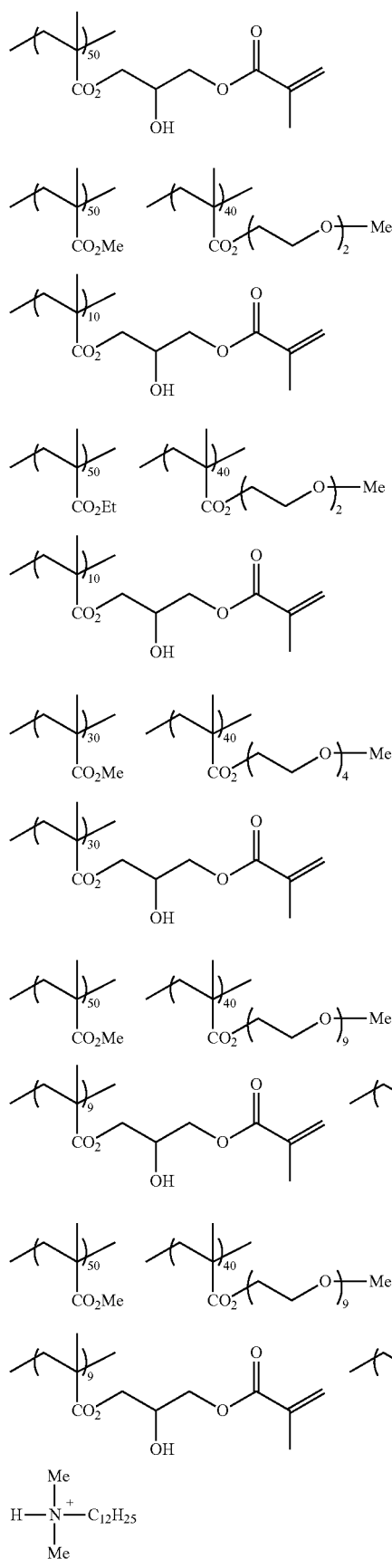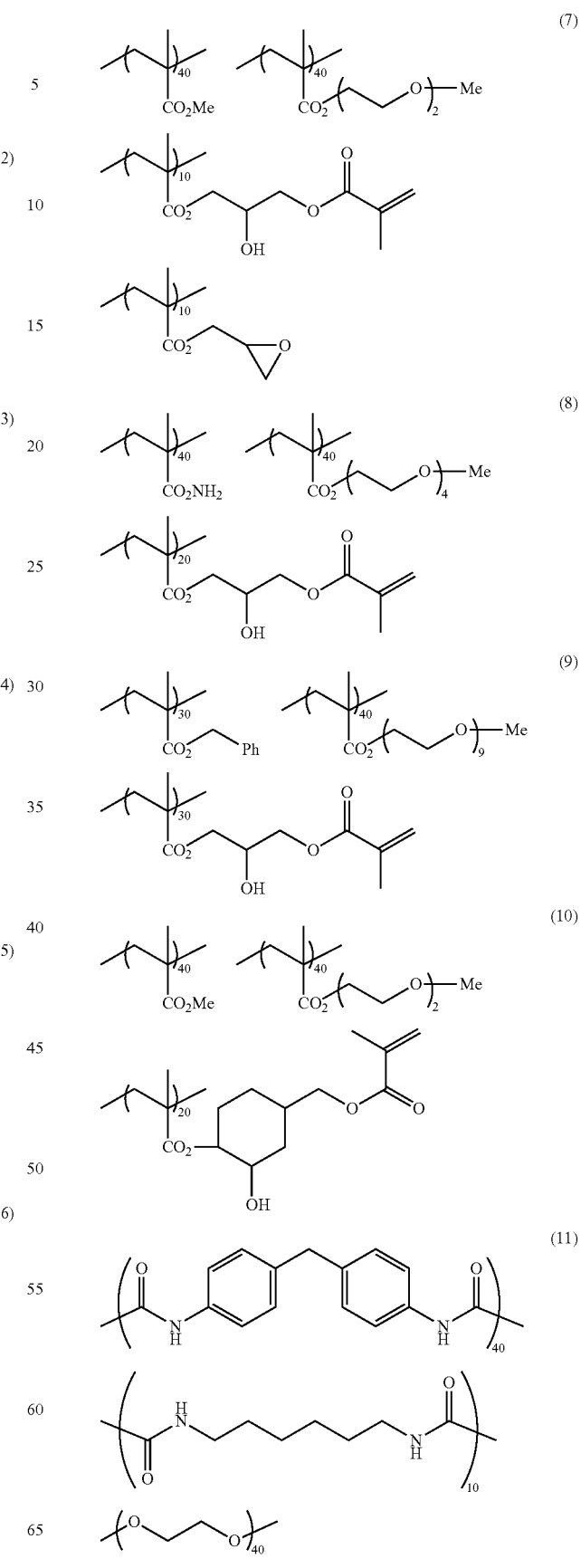

-continued

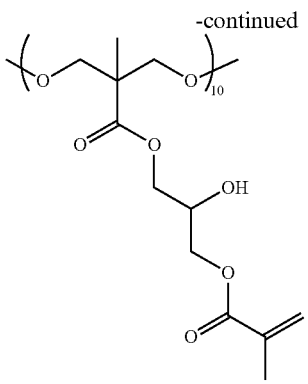

Regarding the molecular weight of the binder polymer, the mass average molecular weight (Mw) as a polystyrene equivalent value obtained by a GPC method is preferably 2,000 or more, more preferably 5,000 or more, and still more preferably 10,000 to 300,000.

It is possible to jointly use hydrophilic polymers such as polyacrylic acid and polyvinyl alcohol described in JP2008-195018A as necessary. In addition, it is also possible to jointly use a lipophilic polymer and a hydrophilic polymer.

In the image-recording layer in the lithographic printing plate precursor according to the embodiment of the present invention, the binder polymer may be used singly or two or more binder polymers may be jointly used.

A random amount of the binder polymer can be added to the image-recording layer. The content of the binder polymer is preferably 1% to 90% by mass and more preferably 5% to 80% by mass of the total solid content of the image-recording layer.

The image-recording layer in the lithographic printing plate precursor according to the embodiment of the present invention may contain, in addition to the above-described components, furthermore, a low-molecular-weight hydrophilic compound, a sensitization agent, and other components.

(Low-Molecular-Weight Hydrophilic Compound)

In order to improve on-machine developability without degrading printing resistance, the image-recording layer may include a low-molecular-weight hydrophilic compound. The low-molecular-weight hydrophilic compound is preferably a compound having a molecular weight of smaller than 1,000, more preferably a compound having a molecular weight of smaller than 800, and still more preferably a compound having a molecular weight of smaller than 500.

As the low-molecular-weight hydrophilic compound, examples of water-soluble organic compounds include glycols such as ethylene glycol, diethylene glycol, triethylene glycol, propylene glycol, dipropylene glycol, and tripropylene glycol and ethers or ester derivative thereof, polyols such as glycerin, pentaerythritol, and tris(2-hydroxyethyl) isocyanurate, organic amines such as triethanolamine, diethanolamine, and monoethanolamine and salts thereof, organic sulfonic acids such as alkyl sulfonic acid, toluenesulfonic acid, and benzenesulfonic acid and salts thereof, organic sulfamic acids such as alkyl sulfamate and salts thereof, organic sulfuric acids such as alkyl sulfates and alkyl ether sulfates and salts thereof, organic phosphonic acids such as phenylphosphonic acid and salts thereof, organic carboxylic acids such as tartaric acid, oxalic acid, citric acid, malic acid, lactic acid, gluconic acid, and amino acid and salts thereof, betaines, and the like.

As the low-molecular-weight hydrophilic compound, it is preferable to add at least one selected from polyols, organic sulfates, organic sulfonates, and betaines.

Specific examples of the organic sulfonates include alkyl sulfonates such as sodium n-butyl sulfonate, sodium n-hexyl sulfonate, sodium 2-ethylhexyl sulfonate, sodium cyclohexyl sulfonate, and sodium n-octyl sulfonate; alkyl sulfonates having ethylene oxide chains such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, sodium 5,8,11,14-tetraoxatetracosane-1-sulfonate; aryl sulfonates such as sodium benzene sulfonate, sodium p-toluenesulfonate, sodium p-hydroxybenzene sulfonate, sodium p-styrene sulfonate, sodium dimethyl isophthalate-5-sulfonate, sodium 1-naphthyl sulfonate, sodium 4-hydroxynaphthylsulfonate, sodium 1,5-naphthalene disulfonate, and trisodium 1,3,6-naphthalene trisulfonate; compounds described in Paragraphs 0026 to 0031 of JP2007-276454A and Paragraphs 0020 to 0047 of JP2009-154525A; and the like. The salts may be potassium salts or lithium salts.

Examples of the organic sulfates include sulfates of alkyls, alkenyls, alkynyls, aryls, or heterocyclic monoethers such as polyethylene oxides. The number of ethylene oxide units is preferably 1 to 4, and the salts are preferably sodium salts, potassium salts, or lithium salts. Specific examples thereof include compounds described in Paragraphs 0034 to 0038 of JP2007-276454A.

The betaines are preferably compounds in which the number of carbon atoms in hydrocarbon substituents into nitrogen atoms is 1 to 5, and specific examples thereof include trimethyl ammonium acetate, dimethyl propyl ammonium acetate, 3-hydroxy-4-trimethyl ammonio butyrate, 4-(1-pyridinio) butyrate, 1-hydroxyethyl-1-imidazolio acetate, trimethyl ammonium methanesulfonate, dimethyl propyl ammonium methanesulfonate, 3-trimethylammonio-1-propane sulfonate, 3-(1-pyridinio)-1-propane sulfonate, and the like.

Since the low-molecular-weight hydrophilic compound has a small structure in hydrophobic portions and barely has surfactant actions, there are no cases in which dampening water permeates exposed portions (image areas) in the image-recording layer and thus the hydrophobic properties or membrane hardness of the image areas degrade, and it is possible to favorably maintain the ink-receiving properties or printing resistance of the image-recording layer.

The low-molecular-weight hydrophilic compound may be used singly or two or more low-molecular-weight hydrophilic compounds may be jointly used.

The content of the low-molecular-weight hydrophilic compound is preferably 0.5% to 20% by mass, more preferably 1% to 15% by mass, and still more preferably 2% to 10% by mass of the total solid content of the image-recording layer.

(Sensitization Agent)

In order to improve ink-absorbing properties, the image-recording layer may contain a sensitization agent such as a phosphonium compound, a nitrogen-containing low-molecular-weight compound, or an ammonium group-containing polymer. Particularly, in a case in which an inorganic lamellar compound is added to the protective layer, these compounds function as surface coating agents for the inorganic lamellar compound and are capable of suppressing the ink-absorbing properties from being degraded in the middle of printing due to the inorganic lamellar compound.

Among these, a phosphonium compound, a nitrogen-containing low-molecular-weight compound, and an ammonium group-containing polymer are preferably jointly used as the sensitization agent, and a phosphonium compound, quaternary ammonium salts, and an ammonium group-containing polymer are more preferably jointly used.

Examples of a preferred phosphonium compound include phosphonium compounds described in JP2006-297907A and JP2007-050660A. Specific examples thereof include tetrabutylphosphonium iodide, butyltriphenylphosphonium bromide, tetraphenylphosphonium bromide, 1,4-bis(triphenylphosphonio)butane=di(hexafluorophosphate), 1,7-bis(triphenylphosphonio)heptane=sulfate, 1,9-bis(triphenylphosphonio)nonane=naphthalene-2,7-disulfonate, and the like.

Examples of the nitrogen-containing low-molecular-weight compound include amine salts and quaternary ammonium salts. In addition, examples thereof include imidazolinium salts, benzo imidazolinium salts, pyridinium salts, and quinolinium salts. Among these, quaternary ammonium salts and pyridinium salts are preferred. Specific examples thereof include tetramethylammonium=hexafluorophosphate, tetrabutylammonium=hexafluorophosphate, dodecyltrimethylammonium=p-toluene sulfonate, benzyltriethylammonium=hexafluorophosphate, benzyldimethyloctylammonium=hexafluorophosphate, benzyldimethylhyldodecylammonium=hexafluorophosphate, compounds described in Paragraphs 0021 to 0037 of JP2008-284858A and Paragraphs 0030 to 0057 of JP2009-090645A, and the like.

The ammonium group-containing polymer needs to have an ammonium group in the structure, and polymers including 5% by mol to 80% by mol of (meth)acrylate having ammonium groups in side chains as copolymerization components are preferred. Specific examples thereof include polymers described in Paragraphs 0089 to 0105 of JP2009-208458A.

In the ammonium group-containing polymer, the value of the reducing specific viscosity (unit: ml/g) obtained according to the measurement method described in JP2009-208458A is preferably 5 to 120, more preferably 10 to 110, and particularly preferably 15 to 100. In a case in which the reducing specific viscosity is converted to the mass average molecular weight (Mw), the mass average molar mass is preferably 10,000 to 150,000, more preferably 17,000 to 140,000, and particularly preferably 20,000 to 130,000.

Hereinafter, specific examples of the ammonium group-containing polymer will be described.

(1) 2-(Trimethylammonio)ethyl methacrylate=p-toluenesulfonate/3,6-dioxaheptyl methacrylate copolymer (molar ratio: 10/90, Mw: 45,000)

(2) 2-(Trimethylammonio)ethyl methacrylate=hexafluorophosphate/3,6-dioxaheptyl methacrylate copolymer (molar ratio: 20/80, Mw: 60,000)

(3) 2-(Ethyldimethylammonio)ethyl methacrylate=p-toluenesulfonate/hexyl methacrylate copolymer (molar ratio: 30/70, Mw: 45,000)

(4) 2-(Trimethylammonio)ethyl methacrylate=hexafluorophosphate/2-ethylhexyl methacrylate copolymer (molar ratio: 20/80, Mw: 60,000)

(5) 2-(Trimethylammonio)ethyl methacrylate=methylsulfate/hexyl methacrylate copolymer (molar ratio: 40/60, Mw: 70,000)

(6) 2-(Butyldimethylammonio)ethyl methacrylate=hexafluorophosphate/3,6-dioxaheptyl methacrylate copolymer (molar ratio: 25/75, Mw: 65,000)

(7) 2-(Butyldimethylammonio)ethyl acrylate=haxafluorophosphate/3,6-dioxaheptyl methacrylate copolymer (molar ratio: 20/80, Mw: 65,000)

(8) 2-(Butyldimethylammonio)ethyl methacrylate=13-ethyl-5,8,11-trioxa-1-heptadecanesulfonate/3,6-dioxaheptyl methacrylate copolymer (molar ratio: 20/80, Mw: 75,000)

(9) 2-(Butyldimethylammonio)ethyl methacrylate=haxafluorophosphate/3,6-dioxaheptyl methacrylate/2-hydroxy-3-methacryloyloxypropyl methacrylate copolymer (molar ratio: 15/80/5, Mw: 65,000)

The content of the sensitization agent is preferably 0.01% to 30.0% by mass, more preferably 0.1% to 15.0% by mass, and still more preferably 1% to 10% by mass of the total solid content in the image-recording layer.

(Other Components)

Furthermore, to the image-recording layer, as other components, it is possible to add a surfactant, a polymerization inhibitor, a higher fatty acid derivative, a plasticizer, an inorganic particle, an inorganic lamellar compound, and the like. Specifically, it is possible to refer to the description in Paragraphs 0114 to 0159 of JP2008-284817A.

The lithographic printing plate precursor according to the embodiment of the present invention is capable of providing a lithographic printing plate having high printing resistance without jointly using a chain transfer agent such as a thiol compound in the image-recording layer.

In the related art, the chain transfer agent such as a thiol compound is added to the image-recording layer in order to accelerate a polymerization reaction. For example, the compound having a specific structure which generates a color developing body described in WO2016/027886A has an action of impairing radical polymerization and thus needs to be jointly used with a chain transfer agent such as a thiol compound in order to accelerate a curing reaction in an image-exposed portion in the image-recording layer and provide a lithographic printing plate having sufficient printing resistance. However, it has been clarified that the image-recording layer containing the chain transfer agent together with a compound having a specific structure which generates a color developing body has a problem with the aging stability that degrades by the decomposition over time of a component included in the image-recording layer, for example, the chain transfer agent.

The lithographic printing plate precursor according to the embodiment of the present invention not including the chain transfer agent such as a thiol compound in the image-recording layer has a characteristic of being excellent in terms of aging stability.

<Formation of Image-Recording Layer>

The image-recording layer in the lithographic printing plate precursor according to the embodiment of the present invention is formed by, for example, as described in Paragraphs 0142 and 0143 of JP2008-195018A, dispersing or dissolving the necessary components described above in a well-known solvent so as to prepare a coating fluid, applying the coating fluid onto a support using a well-known method such as bar coating, and drying the coating fluid. The coating amount (solid content) of the image-recording layer after application and drying varies depending on applications, but is, generally, preferably 0.3 to 3.0 g/m$^2$. In a case in which the coating amount is in this range, a favorable sensitivity and favorable membrane characteristics of the image-recording layer can be obtained.

[Undercoat Layer]

The lithographic printing plate precursor according to the embodiment of the present invention preferably has an undercoat layer (in some cases, referred to as the interlayer)

between the image-recording layer and the support. The undercoat layer strengthens adhesiveness between the support and the image-recording layer in exposed portions and facilitates peeling the support and the image-recording layer in non-exposed portions, and thus the undercoat layer contributes to improving developability without impairing printing resistance. In addition, in the case of exposure using infrared lasers, the undercoat layer functions as an adiabatic layer and thus has an effect of preventing the sensitivity from being degraded due to the diffusion of heat generated by exposure in the support.

Examples of compounds that can be used for the undercoat layer include polymers having adsorbent groups that can be adsorbed to the surface of the support and hydrophilic groups. In order to improve adhesiveness to the image-recording layer, polymers having adsorbent groups and hydrophilic groups and further having crosslinking groups are preferred. The compounds that can be used for the undercoat layer may be low-molecular-weight compounds or polymers. The compounds that can be used for the undercoat layer may be used in a mixed form of two or more kinds as necessary.

In a case in which the compounds that are used for the undercoat layer are polymers, copolymers of monomers having adsorbent groups, monomers having hydrophilic groups, and monomers having crosslinking groups are preferred.

The adsorbent groups that can be adsorbed to the surface of the support are preferably phenolic hydroxy groups, carboxy groups, $-PO_3H_2$, $-OPO_3H_2$, $-CONHSO_2-$, $-SO_2NHSO_2-$, $-COCH_2COCH_3$. The hydrophilic groups are preferably sulfo groups or salts thereof and salts of carboxy groups. The crosslinking groups are preferably acrylic groups, methacryl groups, acrylamide groups, methacrylamide groups, allyl groups, and the like.

The polymers may have crosslinking groups introduced due to the formation of salts between polar substituents of the polymers and compounds having substituents having opposite charges of the above-described polar substituents and ethylenic unsaturated bonds and may be further copolymerized with monomers other than the above-described monomers, preferably, hydrophilic monomers.

Specifically, preferred examples thereof include silane coupling agents having ethylenic double bond reactive groups that are capable of addition polymerization described in JP1998-282679A (JP-H10-282679A) and phosphorus compounds having ethylenic double bond reactive groups described in JP1990-304441A (JP-H02-304441A). Low-molecular-weight or high-molecular-weight compounds having crosslinking groups (preferably ethylenic unsaturated bond groups), functional groups that interact with the surface of the support, and hydrophilic groups described in JP2005-238816A, JP2005-125749A, JP2006-239867A, and JP2006-215263A are also preferably used.

More preferred examples thereof include high-molecular-weight polymers having adsorbent groups that can be adsorbed to the surface of the support, hydrophilic groups, and crosslinking groups described in JP2005-125749A and JP2006-188038A.

The content of ethylenic unsaturated bond groups in the polymer that is used in the undercoat layer is preferably 0.1 to 10.0 mmol and more preferably 0.2 to 5.5 mmol per gram of the polymer.

The mass average molecular weight (Mw) of the polymer that is used in the undercoat layer is preferably 5,000 or higher and more preferably 10,000 to 300,000.

In addition to the above-described compounds for the undercoat layer, the undercoat layer may also include a chelating agent, secondary or tertiary amines, a polymerization inhibitor, compounds having amino groups or functional groups having a polymerization-inhibiting function and groups that interact with the surfaces of supports (for example, 1,4-diazabicyclo[2.2.2]octane (DABCO), 2,3,5,6-tetrahydroxy-p-quinone, chloranil, sulfophthalic acid, hydroxyethyl ethylene diamine triacetic acid, dihydroxyethyl ethylenediamine diacetic acid, hydroxyethyl iminodiacetic acid, and the like), and the like in order to prevent contamination over time.

The undercoat layer is formed using well-known coating methods. The coating amount (solid content) of the undercoat layer is preferably 0.1 to 100 mg/m$^2$ and more preferably 1 to 30 mg/m$^2$.

<Protective Layer>

The lithographic printing plate precursor according to the embodiment of the present invention preferably has a protective layer (in some cases, also referred to as the overcoat layer) on the image-recording layer. The protective layer has a function of suppressing image formation-impairing reactions caused by the shielding of oxygen and additionally has a function of preventing the generation of damage in the image-recording layer and abrasion prevention during exposure using high-illuminance lasers.

Protective layers having the above-described characteristics are described in, for example, the specification of U.S. Pat. No. 3,458,311A and JP1980-049729B (JP-S55-049729B). As poor oxygen-transmissible polymers that can be used for the protective layer, it is possible to appropriately select and use any one of water-soluble polymers and water-insoluble polymers, and, if necessary, it is also possible to use two or more polymers in a mixed form. Specific examples thereof include polyvinyl alcohols, modified polyvinyl alcohols, polyvinyl pyrrolidone, water-soluble cellulose derivatives, poly(meth)acrylonitrile, and the like.

As the modified polyvinyl alcohols, acid-modified polyvinyl alcohols having carboxy groups or sulfo groups are preferably used. Specific examples thereof include modified-polyvinyl alcohols described in JP2005-250216A and JP2006-259137A.

The protective layer preferably includes inorganic lamellar compounds in order to enhance oxygen-shielding properties. The inorganic lamellar compound refers to a particle having thin flat plate shapes, and examples thereof include mica groups such as natural mica and synthetic mica, talc represented by Formula 3MgO.4SiO.H$_2$O, taeniolite, montmorillonite, saponite, hectorite, zirconium phosphate, and the like.

The inorganic lamellar compounds that can be preferably used are mica compounds. Examples of mica compounds include mica groups such as natural mica and synthetic mica represented by Formula: A(B, C)$_{2-5}$D$_4$O$_{10}$(OH, F, O)$_2$ [here, A is any of K, Na, and Ca, B and C are any of Fe (II), Fe (III), Mn, Al, Mg, and V, and D is Si or Al.].

In the mica groups, examples of natural mica include white mica, soda mica, gold mica, black mica, and lepidolite. Examples of synthetic mica include non-swelling mica such as fluorphlogopite KMg$_3$(AlSi$_3$O10)F$_2$, potassium tetrasilic mica KMg$_{2.5}$(Si$_4$O$_{10}$)F$_2$, and, Na tetrasilylic mica NaMg$_{25}$(Si$_4$O$_{10}$)F$_2$, swelling mica such as Na or Li taeniolite (Na, Li)Mg$_2$Li(Si$_4$O$_{10}$)F$_2$, montmorillonite-based Na or Li hectorite (Na, Li)$_{1/8}$Mg$_{2/5}$Li$_{1/8}$(Si$_4$O$_{10}$)F$_2$, and the like. Furthermore, synthetic smectite is also useful.

In the present invention, among the above-described mica compounds, fluorine-based swelling mica is particularly useful. That is, swelling synthetic mica has a laminate structure consisting of unit crystal lattice layers having a thickness of approximately 10 angstroms to 15 angstroms, and metal atoms in lattices are more actively substituted than in any other clay minerals. As a result, positive charges are deficient in the lattice layers, and cations such as $Li^+$, $Na^+$, $Ca^{2+}$, and $Mg^{2+}$ are adsorbed between the layers in order to compensate for the deficiency. Cations interposed between the layers are referred to as exchangeable cations and are exchangeable with various cations. Particularly, in a case in which the cations between the layers are $Li^+$ and $Na^+$, the ionic radii are small, and thus the bonds between lamellar crystal lattices are weak, and mica is significantly swollen by water. In a case in which shear is applied in this state, mica easily cleavages and forms a stable sol in water. The above-described tendency of swelling synthetic mica is strong, and the swelling synthetic mica is particularly preferably used.

From the viewpoint of diffusion control, regarding the shapes of the mica compounds, the thickness is preferably thin, and the planar size is preferably large as long as the smoothness and active light ray-transmitting properties of coated surfaces are not impaired. Therefore, the aspect ratio is preferably 20 or higher, more preferably 100 or higher, and particularly preferably 200 or higher. The aspect ratio is the ratio of the long diameter to the thickness of a particle and can be measured from projection views obtained from the microphotograph of the particle. As the aspect ratio increases, the obtained effect becomes stronger.

Regarding the particle diameters of the mica compound, the average long diameter thereof is preferably 0.3 to 20 μm, more preferably 0.5 to 10 μm, and particularly preferably 1 to 5 μm. The average thickness of the particles is preferably 0.1 μm or smaller, more preferably 0.05 μm or smaller, and particularly preferably 0.01 μm or smaller. Specifically, for example, in the case of swelling synthetic mica which is a typical compound, a preferred aspect has a thickness of approximately 1 to 50 nm and a surface size (long diameter) of approximately 1 to 20 μm.

The content of the inorganic lamellar compound is preferably 0% to 60% by mass and more preferably 3% to 50% by mass of the total solid content of the protective layer. Even in a case in which multiple kinds of inorganic lamellar compounds are jointly used, the total amount of the inorganic lamellar compounds is preferably the above-described content. In a case in which the total amount is in the above-described range, the oxygen-shielding properties improve, and a favorable sensitivity can be obtained. In addition, the degradation of the ink-absorbing properties can be prevented.

The protective layer may include well-known additives such as a plasticizer for imparting flexibility, a surfactant for improving coating properties, and an inorganic fine particle for controlling sliding properties on the surface. In addition, the sensitization agent described in the section of the image-recording layer may be added to the protective layer.

The protective layer is formed using a well-known coating method. The coating amount of the protective layer (solid content) is preferably 0.01 to 10 $g/m^2$, more preferably 0.02 to 3 $g/m^2$, and particularly preferably 0.02 to 1 $g/m^2$.

[Support]

A support in the lithographic printing plate precursor according to the embodiment of the present invention can be appropriately selected from well-known supports for a lithographic printing plate precursor and used. The support is preferably an aluminum plate which has been roughened using a well-known method and anode-oxidized.

On the aluminum plate, as necessary, enlargement processes or sealing processes of micropores in anode oxide films described in JP2001-253181A and JP2001-322365A, surface hydrophilization processes using alkali metal silicate as described in the specifications of US2,714,066A, US3,181,461A, US3,280,734A, and US3,902,734A, and surface hydrophilization processes using polyvinyl phosphate or the like as described in the specifications of US3,276,868A, US4,153,461A, and US4,689,272A may be appropriately selected and carried out.

In the support, the center line average roughness is preferably 0.10 to 1.2 μm.

The support may have, as necessary, a backcoat layer including an organic polymer compound described in JP1993-045885A (JP-H05-045885A) or an alkoxy compound of silicon described in JP1994-035174A (JP-H06-035174A) on the surface opposite to the image-recording layer.

[Method for Producing Lithographic Printing Plate]

A method for producing a lithographic printing plate according to the embodiment of the present invention preferably includes a step of image-exposing the lithographic printing plate precursor according to the embodiment of the present invention (exposure step), and a step of removing a non-exposed portion of the image-recording layer using at least one of printing ink or dampening water on a printer for the lithographic printing plate precursor that has been image-exposed (on-machine development step).

[Exposure Step]

Image exposure is preferably carried out using a method in which digital data are scanned and exposed using an infrared laser or the like.

The wavelength of the exposure light source is preferably 750 nm to 1,400 nm. The light source having a wavelength of 750 nm to 1,400 nm is preferably a solid-state laser or a semiconductor laser that radiates infrared rays. The exposure mechanism may be any one of in-plane drum methods, external surface drum methods, flat head methods, and the like.

The exposure step can be carried out using platesetters or the like and well-known methods. In addition, exposure may be carried out on a printer using a printer including an exposure device after the lithographic printing plate precursor is mounted on the printer.

[On-Machine Development Step]

In the on-machine development step, in a case in which printing is initiated by supplying printing ink and dampening water on the printer without carrying out any development processes on the lithographic printing plate precursor that has been exposed in an image pattern, non-exposed portions on the lithographic printing plate precursor are removed at the initial stage of printing, and accordingly, the hydrophilic surface of the support is exposed, and non-image areas are formed. As the printing ink and the dampening water, well-known printing ink and dampening water for lithographic printing are used. Any of printing ink and dampening water may be first supplied to the surface of the lithographic printing plate precursor, but it is preferable to first supply printing ink from the viewpoint of preventing contamination by the components of the image-recording layer from which dampening water is removed.

In the above-described manner, the lithographic printing plate precursor is on-machine-developed on an off-set printer and is used as it is for printing a number of pieces of paper.

The method for producing a lithographic printing plate according to the embodiment of the present invention may also include other well-known steps in addition to the above-described steps. Examples of other steps include a plate-inspecting step of checking a position, a direction, or the like of a lithographic printing plate precursor before each step, or a checking step of checking a printed image after an on-machine development step.

The lithographic printing plate precursor according to the embodiment of the present invention can be used to produce lithographic printing plates by means of a development process in which a development fluid is used by appropriately selecting the binder polymer and the like which are the constituent components of the image-recording layer. Examples of the development process in which a development fluid is used include an aspect in which a development fluid having a high pH of 14 or less which includes an alkaline agent is used (also referred to as alkali development) and an aspect in which a development fluid having a pH of approximately 2 to 11 which contains a surfactant and/or a water-soluble polymer compound is used (also referred to as simple development). The alkali development and the simple development can be carried out using a well-known method.

EXAMPLES

Hereinafter, the present invention will be described in detail using examples, but the present invention is not limited thereto. Meanwhile, for polymer compounds, unless particularly otherwise described, the molecular weight refers to the mass average molecular weight (Mw) converted to a polystyrene equivalent value by the gel permeation chromatography (GPC) method, and the ratio of a repeating unit refers to the molar percentage. In addition, "parts" and "%" indicates "parts by mass" and "% by mass" unless particularly otherwise described.

Examples 1 to 12 and Comparative Examples 1 to 3

<Production of Support>

In order to remove rolling oil on the surface of a 0.3 mm-thick aluminum plate (material JIS A 1050), a defatting process was carried out thereon using an aqueous solution of 10% by mass of sodium aluminate at 50° C. for 30 seconds, and then, the surface of the aluminum plate was grained using three implanted nylon brushes having hair diameters of 0.3 mm and a suspension of pumice having a median diameter of 25 μm and water (specific gravity: 1.1 g/cm$^3$) and well washed with water. The aluminum plate was etched by being immersed in an aqueous solution of 25% by mass of sodium hydroxide at 45° C. for nine seconds, was washed with water, then, was further immersed in an aqueous solution of 20% by mass of nitric acid at 60° C. for 20 seconds, and was washed with water. The etched amount of the grained surface was approximately 3 g/m$^2$.

Next, an electrochemical roughening process was continuously carried out thereon using alternating-current voltage of 60 Hz. An electrolytic solution was an aqueous solution of 1% by mass of nitric acid (including 0.5% by mass of aluminum ions), and the liquid temperature was 50° C. The electrochemical roughening process was carried out thereon using an alternating current source waveform in which the time TP taken for the current value to reach the peak from zero was 0.8 msec, a duty ratio of 1:1, a trapezoidal square-wave alternating current, and a carbon electrode as an opposite electrode. As an auxiliary anode, ferrite was used. The current density was 30 A/dm$^2$ in terms of the peak value of the current, and 5% of the current coming from the power supply was divided into the auxiliary anode. Regarding the quantity of electricity during nitric acid electrolysis, the quantity of electricity was 175 C/dm$^2$ in a case in which the aluminum plate served as the anode. After that, the plate was washed with water by means of spraying.

Subsequently, an electrochemical roughening process was carried out thereon using the same method as nitric acid electrolysis in an aqueous solution of 0.5% by mass of hydrochloric acid (including 0.5% by mass of aluminum ions) and an electrolytic solution having a liquid temperature of 50° C. under a condition of the quantity of electricity of 50 C/dm$^2$ in a case in which the aluminum plate served as the anode, and then, the plate was washed with water by means of spraying.

Next, 2.5 g/m$^2$ of a direct current anode oxide film was formed on the aluminum plate at a current density of 15 A/dm$^2$ using an aqueous solution of 15% by mass of sulfuric acid (including 0.5% by mass of aluminum ions) as an electrolytic solution, and then water washing and drying were carried out thereon, thereby producing a support A. The average pore diameter of the surface layer of the anode oxide film (surface average pore diameter) was 10 nm.

The pore diameter of the surface layer of the anode oxide film was measured using a method in which the surface was observed an ultrahigh resolution SEM (Hitachi S-900) at a relatively low acceleration voltage of 12 V at a magnification of 150,000 times without carrying out a deposition process or the like for imparting conductive properties, 50 pores were randomly extracted, and the average value was obtained. The standard deviation was ±10% or less.

After that, in order to ensure the hydrophilicity of a non-image area, a silicate process was carried out on the support A using an aqueous solution of 2.5% by mass of No. 3 sodium silicate at 60° C. for ten seconds, and then the support was washed with water, thereby producing a support B. The attached amount of Si was 10 mg/m$^2$. The center line average roughness (Ra) of the support B was measured using a needle having a diameter of 2 μm and was found to be 0.51 μm.

A support C was produced in the same manner as in the method for producing the support A except for the fact that, in the production of the support A, the electrolytic solution in the formation of the direct current anode oxide film was changed to an aqueous solution of 22% by mass of phosphoric acid. The average pore diameter of the surface layer of the anode oxide film (surface average pore diameter) was measured using the same method as described above and found out to be 25 nm.

After that, a silicate process was carried out on the support C using an aqueous solution of 2.5% by mass of No. 3 sodium silicate at 60° C. for 10 seconds in order to ensure the hydrophilicity of a non-image area and then washed with water, thereby producing a support D. The amount of Si attached was 10 mg/m$^2$. The center line average roughness (Ra) of the support D was measured using a needle having a diameter of 2 μm and found out to be 0.52 μm.

<Formation of Undercoat Layer>

A coating fluid for an undercoat layer (1) having the following composition was applied onto a support so that the dried coating amount reached 20 mg/m$^2$, thereby forming an undercoat layer.

<Coating Fluid for Undercoat Layer (1)>

| | |
|---|---|
| Polymer (P-1) [the following structure]: | 0.18 g |
| Hydroxyethyl iminodiacetic acid: | 0.10 g |
| Methanol: | 55.24 g |
| Water: | 6.15 g |

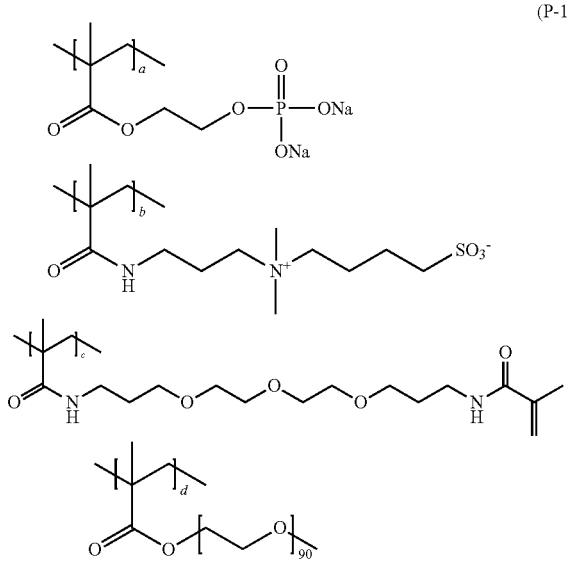

a/b/c/d/ = 14.2/71.8/9.0/5.0 (% by wt)
a/b/c/d/ = 19.0/72.8/7.8/0.4 (% by mol)
Mass average molecular weight = 200,000

A method for synthesizing the polymer P-1 will be described below.

(Synthesis of Monomer M-1)

ANCAMINE 1922A (diethylene glycol di(aminopropyl) ether, manufactured by Air Products) (200 g, 0.91 mol), distilled water (435 g), and methanol (410 g) were added to a 3 L three-neck flask and cooled to 5° C. Next, lienzoic acid (222.5 g, 1.82 mol) and 4-hydroxy-2,2,6,6-tetramethylpiperidine-1-oxyl (4-OH-TEMPO) (25 mg, 0.15 mmol) were added thereto, and a methacrylic anhydride (280 g, 1.82 mmol) was added dropwise thereto so that the inner temperature of the reaction liquid reached 10° C. or lower. The reaction liquid was stirred at 5° C. for six hours and, subsequently, stirred at 25° C. for 12 hours, and then phosphoric acid (70 g) was added thereto so as to adjust the pH to 3.3. The reaction liquid was moved to a 10 L stainless steel beaker, ethyl acetate (3.7 L), methyl-tert butyl ether (MTBE) (1.5 L), and distilled water (0.65 L) were added thereto, and the components were strongly stirred and then left to stand. The upper layer (organic layer) was disposed of, then, ethyl acetate (1.8 L) was added thereto, the components were strongly stirred and then left to stand, and the upper layer was disposed of. Furthermore, ethyl acetate (1.5 L) was added thereto, the components were strongly stirred and then left to stand, and the upper layer was disposed of. Next, MTBE (1.6 L) was added thereto, the components were strongly stirred and then left to stand, and the upper layer was disposed of. 4-OH-TEMPO (62.5 mg, 0.36 mmol) was added to the obtained aqueous solution, thereby obtaining an aqueous solution of a monomer M-1 (1.2 kg, 20.1% by mass in terms of the solid content).

(Purification of Monomer M-2)

LIGHT ESTER P-1M (2-methacryloyloxyethyl acid phosphate, manufactured by Kyoeisha Chemical Co., Ltd.) (420 g), diethylene glycol dibutyl ether (1,050 g), and distilled water (1,050 g) were added to a separating funnel, strongly stirred, and then left to stand. The upper layer was disposed of, diethylene glycol dibutyl ether (1,050 g) was added thereto, and the components were strongly stirred and then left to stand. The upper layer was disposed of, thereby obtaining an aqueous solution of a monomer M-2 (1.3 kg, 10.5% by mass in terms of the solid content).

(Synthesis of Polymer P-1)

Distilled water (600.6 g), the aqueous solution of the monomer M-1 (33.1 g), and a monomer M-3 described below (46.1 g) were added to a 3 L three-neck flask and heated to 55° C. in a nitrogen atmosphere. Next, a dropwise addition liquid 1 described below was added dropwise thereto for two hours, the components were stirred for 30 minutes, then, VA-046B (manufactured by Wako Pure Chemical Industries Ltd.) (3.9 g) was added thereto, and the components were heated to 80° C. and stirred for 1.5 hours. The reaction liquid was returned to room temperature, and then an aqueous solution of 30% by mass of sodium hydroxide (175 g) was added thereto, thereby adjusting the pH to 8.3. Next, 4-OH-TEMPO (152.2 mg) was added thereto, and the components were heated to 53° C. A methacrylic anhydride (66.0 g) was added thereto, and the components were stirred at 53° C. for three hours. The components were returned to room temperature, then, the reaction liquid was moved to a 10 L stainless steel beaker, MTBE (1,800 g) was added thereto, the components were strongly stirred and then left to stand, and the upper layer was disposed of. A washing operation using MTBE (1,800 g) was further repeated twice in the same manner, and then distilled water (1,700 g) and 4-OH-TEMPO (212 mg) were added to the obtained water layer, thereby obtaining a polymer P-1 (4.1 kg, 11.0% in terms of the solid content) as a homogeneous solution. The mass average molecular weight (Mw) converted to a polyethylene glycol equivalent value by the gel permeation chromatography (GPC) method was 200,000.

Dropwise Addition Liquid (1)

| | |
|---|---|
| The aqueous solution of the monomer M-1: | 132.4 g |
| The aqueous solution of the monomer M-2: | 376.9 g |
| Monomer M-3 [the following structure]: | 184.3 g |
| BREMMER PME 4000 (manufactured by NOF Corporation): | 15.3 g |
| VA-046B (manufactured by Wako Pure Chemical Industries Ltd.): | 3.9 g |
| Distilled water: | 717.4 g |

BREMMER PME 4000: Methoxy polyethylene glycol methacrylate (the number of the oxyethylene unit repeated: 90)

VA-046B: 2,2'-Azobis [2-(2-imidazolin-2-yl)propane] disulfate dihydrate

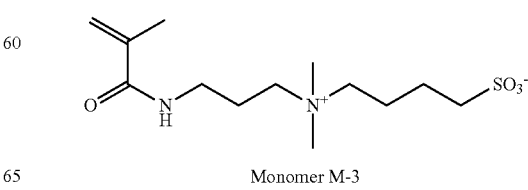

Monomer M-3

<Formation of Image-Recording Layer A>

A coating fluid for an image-recording layer (1) having the following composition was applied onto the undercoat layer by means of bar coating and was dried in an oven at 100° C. for 60 seconds, thereby forming an image-recording layer having a dried coating amount of 1.0 g/m².

The coating fluid for the image-recording layer (1) was prepared by mixing and stirring the following photosensitive liquid (1) and a micro gel liquid immediately before the coating. Meanwhile, in a case in which the compound A-22 according to the present invention was used, the compound A-22 included a borate salt portion in the structure, and thus a borate compound TPB was not added thereto.

<Photosensitive Liquid (1)>

| | |
|---|---|
| Binder polymer (1) [the following structure] | 0.240 g |
| Decomposable infrared absorbing dye (shown in Table 1) | 0.046 g |
| Color developer (shown in Table 1) | 0.040 g |
| Acid-generating agent (1) (shown in Table 1) Amount shown in Table 1 | |
| Acid-generating agent (2) (shown in Table 1) Amount shown in Table 1 | |
| Polymerizable compound | 0.192 g |
|   Tris(acryloyloxyethyl)isocyanurate | |
|   (NK ester A-9300, manufactured by Shin-Nakamura Chemical Co., Ltd.) | |
| Low-molecular-weight hydrophilic compound | 0.062 g |
|   Tris(2-hydroxyethyl)isocyanurate | |
| Low-molecular-weight hydrophilic compound (1) (the following structure) | 0.050 g |
| Sensitization agent | 0.055 g |
|   Phosphonium compound (1) [the following structure] | |
| Sensitization agent | 0.018 g |
|   Benzyl-dimethyl-octylammonium•PF₆ salt | |
| Sensitization agent | 0.035 g |
|   Ammonium group-containing polymer (1) | |
|   [the following structure, reducing specific viscosity of 44 ml/g] | |
| Fluorine-based surfactant (1) (the following structure) | 0.008 g |
| 2-Butanone | 1.091 g |
| 1-Methoxy-2-propanol | 8.609 g |
| <Micro gel liquid> | |
| Micro gel (1) | 2.640 g |
| Distilled water | 2.425 g |

The structures of the binder polymer (1), the low-molecular-weight hydrophilic compound (1), the phosphonium compound (1), the ammonium group-containing polymer (1), and the fluorine-based surfactant (1) which were used for the photosensitive liquid (1) will be illustrated below.

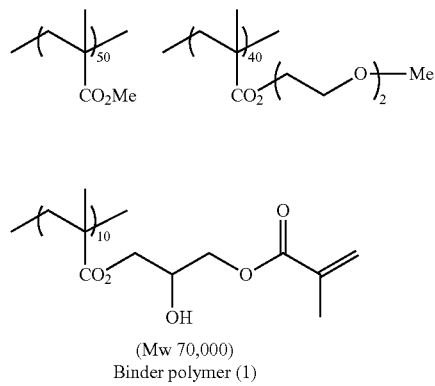

(Mw 70,000)
Binder polymer (1)

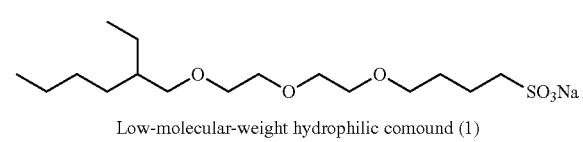

Low-molecular-weight hydrophilic comound (1)

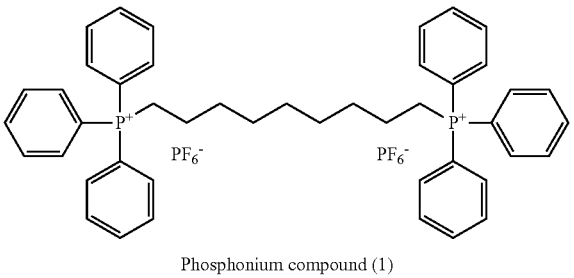

Phosphonium compound (1)

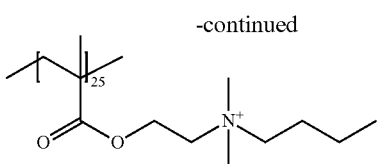

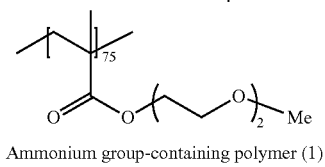

Ammonium group-containing polymer (1)

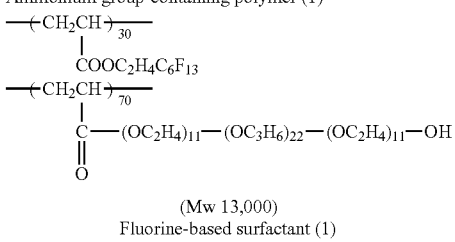

(Mw 13,000)
Fluorine-based surfactant (1)

A method for preparing a micro gel (1) used in the micro gel liquid will be described below.

<Preparation of Polyhydric Isocyanate Compound (1)>

Bismuth tris(2-ethylhexanoate) (NEOSTAN U-600, manufactured by Nitto Kasei Co., Ltd.) (43 mg) was added to an ethyl acetate (25.31 g) suspended solution of isophorone diisocyanate (17.78 g, 80 mmol) and the following polyhydric phenol compound (1) (7.35 g, 20 mmol), and the components were stirred. The reaction temperature was set to 50° C. in a case in which the generation of heat settled, and the components were stirred for three hours, thereby obtaining an ethyl acetate solution of a polyhydric isocyanate compound (1) (50% by mass).

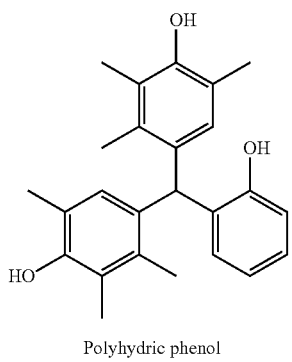

compound (1)

Polyhydric phenol

<Preparation of Micro Gel (1)>

Oil-phase components described below and a water-phase component described below were mixed together and emulsified at 12,000 rpm for 10 minutes using a homogenizer. The obtained emulsion was stirred at 45° C. for four hours, an aqueous solution of 10% by mass of 1,8-diazabicyclo [5.4.0]undec-7-ene-octanoic acid salt (U-CAT SA102, manufactured by San-Apro Ltd.) (5.20 g) was added thereto, and the components were stirred at room temperature for 30 minutes and left to stand at 45° C. for 24 hours. Adjustment was made using distilled water so that the concentration of the solid content reached 20% by mass, thereby obtaining a water dispersion liquid of a micro gel (1). The average particle diameter was measured by a light scattering method and found out to be 0.28 μm.

(Oil-Phase Components)

(Component 1) Ethyl acetate: 12.0 g (Component 2) An adduct obtained by adding trimethylolpropane (6 mol) and xylene diisocyanate (18 mol) and adding methyl terminal polyoxy ethylene (1 mol, the number of the oxyethylene unit repeated: 90) thereto (a solution of 50% by mass of ethyl acetate, manufactured by Mitsui Chemicals Inc.): 3.76 g (Component 3) Polyhydric isocyanate compound (1) (as a solution of 50% by mass of ethyl acetate): 15.0 g (Component 4) An ethyl acetate solution of 65% by mass of dipentaerythritol pentaacrylate (SR-399, Sartomer Japan Inc.): 11.54 g (Component 5) An ethyl acetate solution of 10% by mass of a sulfonate-type surfactant (BIONINE A-41-C, manufactured by Takemoto Oil & Fat Co., Ltd.):
4.42 g (Water-Phase Component)

Distilled water: 46.87 g

<Formation of Protective Layer>

A coating fluid for a protective layer having the following composition was applied onto the image-recording layer by means of bar coating and dried in an oven at 120° C. for 60 seconds, thereby forming a protective layer having a dried coating amount of 0.15 g/m² and thus producing a lithographic printing plate precursor A.

<Coating Fluid for Protective Layer>

Inorganic lamellar compound dispersion liquid (1) (described below) 1.5 g
6% By mass aqueous solution of
  polyvinyl alcohol (CKS50 manufactured by The Nippon Synthetic Chemical Industry Co., Ltd.,
  sulfonic acid-modified, degree of saponification of 99% by mol or higher, degree of polymerization of 300)
  0.55 g
6% By mass aqueous solution of polyvinyl alcohol (PVA-405 manufactured by Kuraray Co., Ltd., degree of saponification of 81.5% by mol, degree of polymerization of 500)
  0.03 g
1% By mass aqueous solution of a surfactant (polyoxyethylene lauryl ether, EMALEX 710, manufactured by Nihon Emulsion Co., Ltd.)
  0.86 g
Ion exchange water 6.0 g A method for preparing the inorganic lamellar compound dispersion liquid (1) used for the coating fluid for a protective layer will be described below. <Preparation of inorganic lamellar compound dispersion liquid (1)>

Synthetic mica (SOMASIF ME-100 manufactured by Co-op Chemical Co., Ltd.) (6.4 g) was added to ion exchange water (193.6 g) and was dispersed using a homogenizer until the average particle diameter (the laser scattering method) reached 3 μm. The aspect ratio of the obtained dispersed particle was 100 or higher.

<Formation of Image-Recording Layer B>

A coating fluid for an image-recording layer (2) having the following composition was applied on the undercoat layer by means of bar coating and dried in an oven at 70° C. for 60 seconds, thereby forming an image-recording layer having a dried coating amount of 0.6 g/m².

<Coating Fluid for Image-Recording Layer (2)>

Decomposable infrared absorbing dye (shown in Table 1) 0.046 g
Color developer (shown in Table 1) 0.040 g
Acid-generating agent (1) (shown in Table 1) Amount shown in Table 1
Acid-generating agent (2) (shown in Table 1) Amount shown in Table 1
Polymer fine particle water dispersion liquid (1) (22% by mass) (described below)
10.0 g

| | |
|---|---|
| Polymerizable compound | 1.50 g |
| SR-399 (manufactured by Sartomer Japan Inc.) | |
| Byk 336 (manufactured by BYK Additives & Instruments) | 0.4 g |
| Klucel M (manufactured by Hercules Incorporated) | 4.8 g |
| ELVACITE 4026 (manufactured by Ineos Acrylics) | 2.5 g |
| n-Propanol | 55.0 g |
| 2-Butanone | 17.0 g |

The compounds which were used for the coating fluid for an image-recording layer (2) and are expressed using trade names are as described below.

SR-399: Dipentaerythritol pentaacrylate
Byk 336: Modified dimethyl polysiloxane copolymer (a solution of 25% by mass of xylene and methoxypropyl acetate)
Klucel M: Hydroxypropyl cellulose (2% by mass aqueous solution)
ELVACITE 4026: Highly branched polymethyl methacrylate (a solution of 10% by mass of 2-butanone)

A method for preparing the polymer fine particle water dispersion liquid (1) used for the coating fluid for an image-recording layer (2) will be described below.

<Preparation of Polymer Fine Particle Water Dispersion Liquid (1)>

A stirrer, a thermometer, a dropping funnel, a nitrogen introduction pipe, and a reflux cooler were provided to a 1,000 ml four-neck flask, nitrogen gas was introduced thereinto, polyethylene glycol methyl ether methacrylate (PEGMA, the average repeating unit number of ethylene glycol: 50) (10 g), distilled water (200 g), and n-propanol (200 g) were added thereto while carrying out deoxidation, and the components were heated until the inner temperature reached 70° C. Next, a mixture obtained by mixing styrene (St) (10 g), acrylonitrile (AN) (80 g), and 2,2'-azobisisobutyronitrile (0.8 g) in advance was added dropwise thereto for one hour. A reaction continued for five hours after the end of the dropwise addition, then, 2,2'-azobisisobutyronitrile (0.4 g) was added thereto, and the inner temperature was increased up to 80° C. Subsequently, 2,2'-azobisisobutyronitrile (0.5 g) was added thereto for six hours. At a stage of continuing the reaction for a total of 20 hours, 98% or more of polymerization had progressed, and a polymer fine particle water dispersion liquid (1) including PEGMA/St/AN in a mass ratio of 10/10/80 was prepared. The particle size distribution of the polymer fine particle had the maximum value at a particle diameter of 150 nm.

The particle size distribution was obtained by capturing an electron micrograph of the polymer fine particles, measuring the particle diameters of a total of 5,000 fine particles on the photograph, dividing the range of the obtained particle diameter measurement values from zero to the maximum value into 50 sections using a logarithmic scale, and plotting the appearance frequency of the respective particle diameters. Meanwhile, for a non-spherical particle, the particle diameter value of a spherical particle having the same particle area as the particle area on the photograph was considered as the particle diameter.

<Formation of Image-Recording Layer C>

An image-recording layer coating fluid (3) was applied on the undercoat layer by means of bar coating so that the composition after application became as described below and dried in an oven at 50° C. for 60 seconds, thereby forming an image-recording layer.

<Coating Fluid for Image-Recording Layer (3)>

| | |
|---|---|
| Decomposable infrared absorbing dye (shown in Table 1) | 0.020 g/m$^2$ |
| Color developer (shown in Table 1) | 0.015 g/m$^2$ |
| Acid-generating agent (1) (shown in Table 1) | Amount shown in Table 1 |
| Acid-generating agent (2) (shown in Table 1) | Amount shown in Table 1 |
| Polymer fine particle water dispersion liquid (1) [described above] | 0.693 g/m$^2$ |
| Glascol E15 (manufactured by Allied Colloids Manufacturing GMBH) | 0.09 g/m$^2$ |
| ERKOL WX48/20 (manufactured by ERKOL) | 0.09 g/m$^2$ |
| Zonyl FSO100 (manufactured by DuPont) | 0.0075 g/m$^2$ |

The compounds which were used for the image-recording layer coating fluid (3) and are expressed using trade names are as described below.

Glascol E15: Polyacrylic acid
ERKOL WX48/20: Polyvinyl alcohol/polyvinyl acetate copolymer
Zonyl FSO100: Surfactant

[Production of Lithographic Printing Plate Precursor]

The support and the image-recording layer were combined together as shown in Table 1, thereby producing a lithographic printing plate precursor. The protective layer was formed on the image-recording layer A, but the protective layer was not formed on the image-recording layer B and the image-recording layer C.

(Evaluation of Lithographic Printing Plate Precursors)

For the respective lithographic printing plate precursors, the color developability, the printing resistance, the white light stability, and the tone reproducibility were evaluated in the following manner. The evaluation results are shown in Table 1.

(1) Color Developability

The obtained lithographic printing plate precursors were exposed using a TRENDSETTER 3244VX manufactured by Creo Co., Ltd. which was equipped with a water cooling-type 40 W infrared semiconductor laser under conditions of an output of 11.7 W, an external surface drum rotation speed of 250 rpm, and a resolution of 2,400 dpi (dot per inch, 1 inch=25.4 mm). The exposure was carried out under conditions of 25° C. and 50% RH.

The color development of the lithographic printing plate precursor was measured immediately after exposure and after two hours of storage in a dark plate (25° C.) after the exposure. The color development was measured using a spectrophotometer CM2600d and operation software CM-S100W manufactured by Konica Minolta, Inc. by means of a specular component excluded (SCE) method. The color developability were evaluated using the difference $\Delta L$ between the L* value of an exposed portion and the L* value of a non-exposed portion using L* values (brightness) in the L*a*b* color specification system. As the value of $\Delta L$ increases, the color developability becomes more favorable.

(2) Printing Resistance

The lithographic printing plate precursors were exposed using a LUXEL PLATESETTER T-6000III manufactured by Fujifilm Corporation which was equipped with an infrared semiconductor laser under conditions of an external surface drum rotation speed of 1,000 rpm, a laser output of 70%, and a resolution of 2,400 dpi. Exposed images were provided with solid images and 50% halftone dot charts of 20 µm dot FM screens.

Without carrying out a development process on the exposed plate precursors, the lithographic printing plate precursors were attached to the plate trunk of a printer LITHRONE 26 manufactured by Komori Corporation. Dampening water and ink were supplied using dampening water of ECOLITY-2 (manufactured by Fujifilm Corporation)/tap water=2/98 (capacity ratio) and Values-G(N) BLACK INK (manufactured by DIC Graphics Corporation) and using the standard automatic printing start method of LITHRONE 26, and then printing was carried out on TOKUBISHI art paper (76.5 kg) (manufactured by Mitsubishi Paper Mills limited) at a printing rate of 10,000 pieces per hour.

As the number of printed pieces increased, the image-recording layer gradually wore, and thus the ink concentration on printed matters decreased. The number of pieces of printed paper until the value of the halftone dot area ratio of FM screen 50% halftone dots on printed matters measured using a gretag density meter decreased to be 5% lower than the measurement value obtained in a case in which printing was carried out on a 100$^{th}$ piece of paper was measured, and the printing resistance was evaluated.

(3) White Light Stability

In an environment of room temperature (25° C.) and a humidity of 50%, an OSRAM FLR40SW fluorescent light manufactured by Mitsubishi Electric Corporation was used as a light source, and the lithographic printing plate precursor was set at a location of an illuminance of 1,000 lx in a pocket illuminance meter ANA-F9 manufactured by Tokyo Photoelectric Co., Ltd. and irradiated with white light for two hours.

After that, the lithographic printing plate precursor was exposed using a Luxel PLATESETTER T-6000III manufactured by Fujifilm Corporation which was equipped with an infrared semiconductor laser under conditions of an external surface drum rotation speed of 1,000 rpm, a laser output of 70%, and a resolution of 2,400 dpi. An exposed image was provided with a solid image and a 50% halftone dot chart of a 20 μm dot FM screen.

Without carrying out a development process on the exposed plate precursor, the lithographic printing plate precursor was attached to the plate trunk of a printer LITHRONE 26 manufactured by Komori Corporation. Dampening water and ink were supplied using dampening water of Ecolity-2 (manufactured by Fujifilm Corporation)/ tap water=2/98 (capacity ratio) and Values-G(N) BLACK INK (manufactured by DIC Graphics Corporation) and using the standard automatic printing start method of LITHRONE 26, and then printing was carried out on 100 pieces of TOKUBISHI art paper (76.5 kg) (manufactured by Mitsubishi Paper Mills limited) at a printing rate of 10,000 pieces per hour.

The on-machine development of a non-exposed portion in the image-recording layer was completed on the printer, and the number of pieces of printing paper required until ink was not transferred to the non-image area was measured and evaluated as the white light stability. As the number of pieces of printing paper decreases, the white light stability becomes more favorable.

(4) Tone Reproducibility

The halftone dot area ratio of 50% halftone dots was measured using a gretag density meter, the dot gain amount (%) of the 50% halftone dots was obtained from the difference between the actual measurement value of the halftone dot area ratio and the original image halftone % (=50%), and the tone reproducibility was evaluated using this numerical value. The numerical value closer to zero indicates superior tone reproducibility. The numerical value of 5% or less is a practically permissible level, and the numerical value of 6% or more lacks practicality.

TABLE 1

| | Support | Image-recording layer | Infrared absorbing dye | Color developer | Acid-generating agent 1 Structure | Acid-generating agent 1 Amount added | Acid-generating agent 2 Structure | Acid-generating agent 2 Amount added |
|---|---|---|---|---|---|---|---|---|
| Example 1 | B | A | IR-1 | C-1 | None | — | A2-1 | 0.245 g |
| Example 2 | B | A | IR-2 | C-2 | A1-1 | 0.010 g | None | — |
| Example 3 | B | A | IR-3 | C-3 | A1-2 | 0.010 g | None | — |
| Example 4 | B | C | IR-4 | C-4 | A1-1 | 0.015 g/m$^2$ | A2-2 | 0.210 g/m$^2$ |
| Example 5 | B | A | IR-5 | C-5 | None | — | A2-1 | 0.245 g |
| Example 6 | D | B | IR-6 | C-6 | None | — | A2-1 | 0.245 g |
| Example 7 | B | A | IR-7 | C-7 | None | — | A2-1 | 0.245 g |
| Example 8 | B | C | IR-8 | C-8 | A1-3 | 0.015 g/m$^2$ | None | — |
| Example 9 | B | A | IR-9 | C-9 | A1-1 | 0.010 g | A2-1 | 0.245 g |
| Example 10 | D | B | IR-10 | C-10 | A1-1 | 0.010 g | None | — |
| Example 11 | B | A | IR-11 | C-11 | A1-4 | 0.010 g | None | — |
| Example 12 | B | A | IR-12 | C-12 | A1-1 | 0.010 g | None | — |
| Comparative Example 1 | B | A | IR-13 | None | A1-1 | 0.010 g | None | — |
| Comparative Example 2 | B | A | IR-9 | None | A1-1 | 0.010 g | None | — |
| Comparative Example 3 | D | B | IR-14 | C-13 | None | — | A2-3 | 0.245 g |

| | Visibility (ΔL) Immediately after exposure | Visibility (ΔL) After two hours | Printing resistivity (Number of pieces (×10,000)) | White light stability (Number of pieces) | Tone reproducibility (%) |
|---|---|---|---|---|---|
| Example 1 | 10 | 10 | 8 | 15 | 2 |
| Example 2 | 11 | 10 | 8 | 15 | 2 |
| Example 3 | 11 | 11 | 8 | 14 | 2 |
| Example 4 | 12 | 11 | 8 | 14 | 3 |
| Example 5 | 11 | 10 | 8 | 13 | 2 |
| Example 6 | 12 | 11 | 8 | 13 | 2 |
| Example 7 | 13 | 12 | 8 | 12 | 2 |
| Example 8 | 13 | 12 | 10 | 11 | 2 |
| Example 9 | 13 | 13 | 8 | 10 | 3 |
| Example 10 | 14 | 13 | 10 | 8 | 2 |
| Example 11 | 13 | 12 | 10 | 8 | 2 |
| Example 12 | 14 | 13 | 10 | 8 | 2 |
| Comparative Example 1 | 8 | 8 | 8 | 20 | 4 |
| Comparative Example 2 | 9 | 9 | 8 | 20 | 4 |
| Comparative Example 3 | 5 | 3 | 8 | 30 | 4 |

The structures of the infrared absorbing dyes IR-1 to IR-14, the color developers C-1 to C-13, and the acid-generating agents A1-1 to A1-4 and A2-1 to A2-3 shown in Table 1 will be illustrated below. The infrared absorbing dyes IR-1 to IR-13 are the decomposable infrared absorbing dye according to the present invention, and the infrared absorbing dye IR-14 is an infrared absorbing dye other than the decomposable infrared absorbing dye according to the present invention.

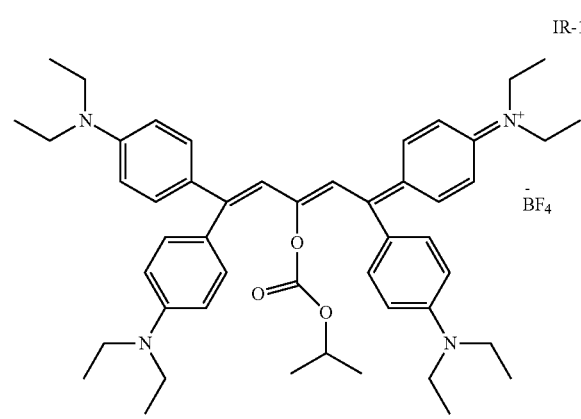

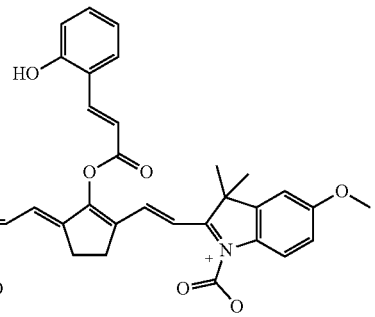

IR-10
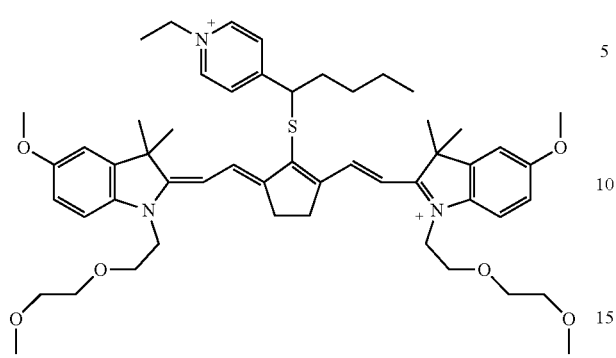
IR-11
IR-12
IR-13
IR-14
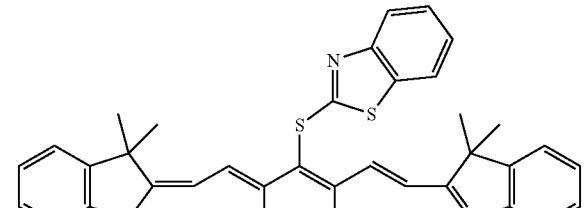
C-1
C-2
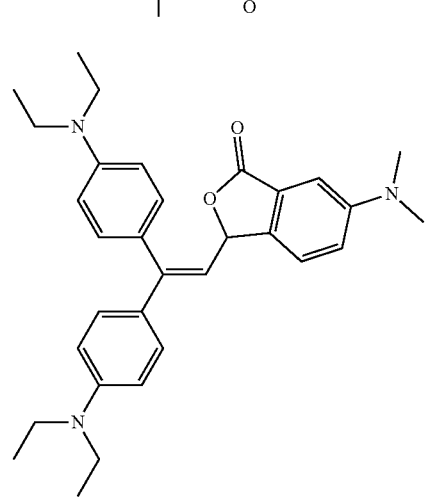
C-3
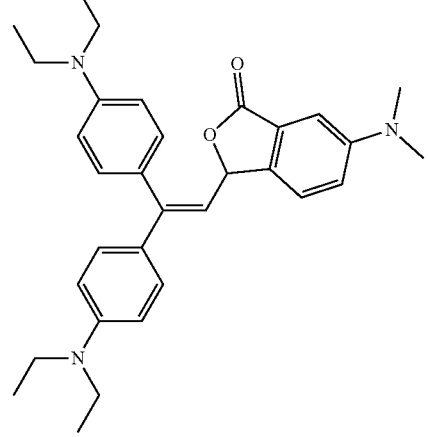
C-4
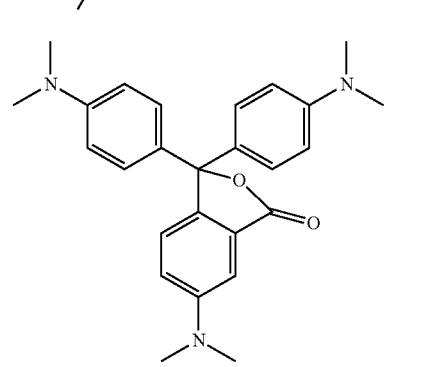
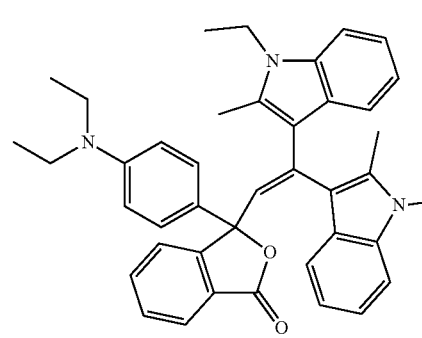

-continued
C-5
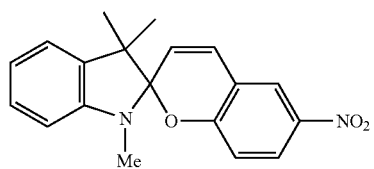
C-6
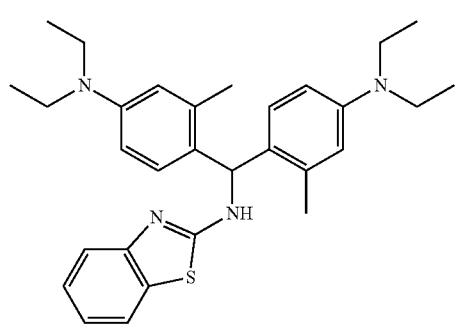
C-7
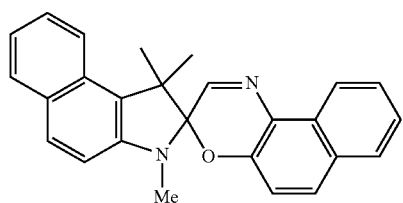
C-8
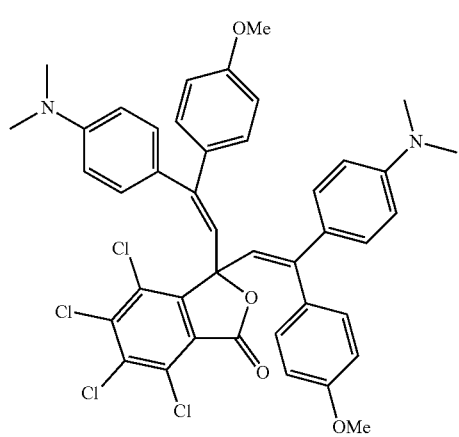
C-9
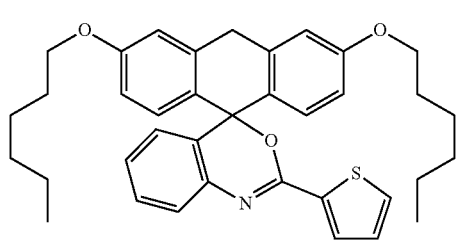
-continued
C-10
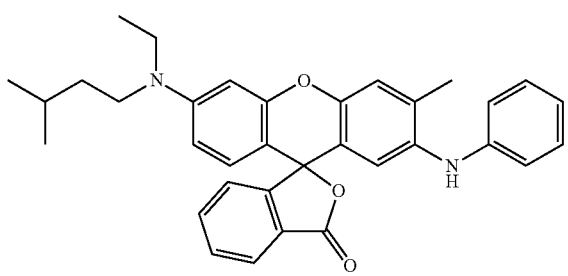
C-11
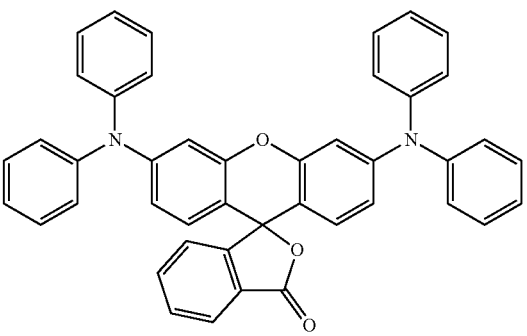
C-12
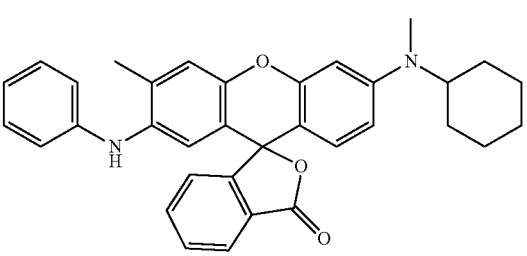
C-13
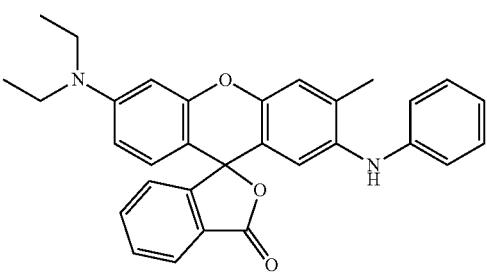
A1-1
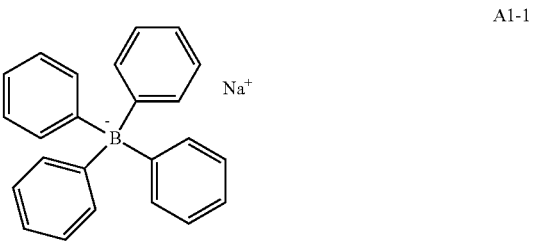

-continued

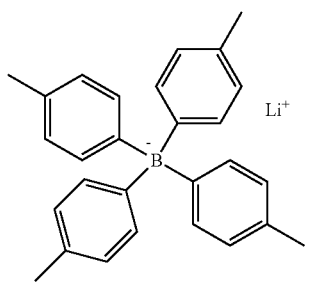
A1-2

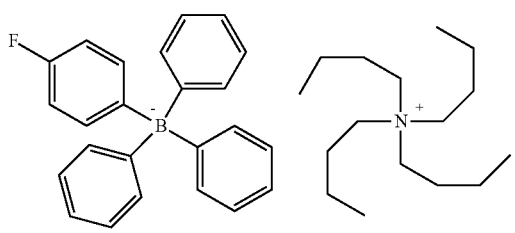
A1-3

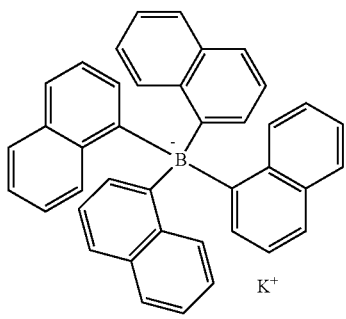
A1-4

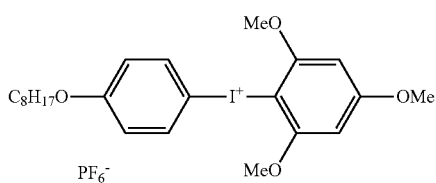
A2-1

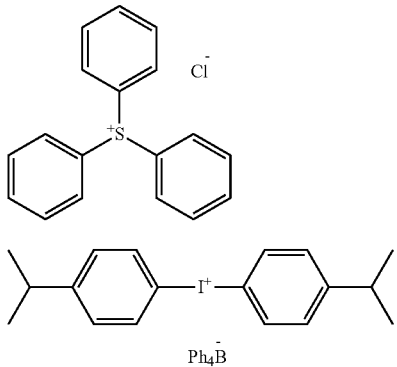
A2-2

A2-3

From the results shown in Table 1, it is clear that, compared with the lithographic printing plate precursors of the comparative examples which contain the compound for comparison, the lithographic printing plate precursor according to the embodiment of the present invention which has the image-recording layer containing the infrared absorbing dye that decomposes by exposure to an infrared ray and the color developer that develops color due to the exposure to an infrared ray is excellent in visibility (plate inspection property) by color development and is capable of maintaining excellent visibility (plate inspection property) even after aged. Furthermore, it is found that the lithographic printing plate precursor according to the embodiment of the present invention is capable of providing a lithographic printing plate which has excellent white light stability and is excellent in terms of printing resistance and tone reproducibility, but the lithographic printing plate precursors of the comparative examples are poor in any of printing resistance, white light stability, and tone reproducibility.

According to the present invention, it is possible to provide a lithographic printing plate precursor providing a lithographic printing plate which is excellent in terms of visibility (plate inspection property) by color development, is capable of maintaining excellent visibility (plate inspection property) even after aged, has excellent white light stability, and is excellent in terms of printing resistance and tone reproducibility and a method for producing a lithographic printing plate in which the lithographic printing plate precursor is used.

The present invention has been described in detail with reference to specific embodiments, but it is clear to a person skilled in the related art that a variety of modifications or corrections can be added thereto within the concept and scope of the present invention.

The present application claims priority on the basis of a Japanese Patent Application filed on Jun. 30, 2017 (JP2017-129814), the content of which is incorporated herein by reference.

What is claimed is:

1. A lithographic printing plate precursor comprising:
an image-recording layer on a hydrophilic support,
wherein the image-recording layer contains an infrared absorbing dye that decomposes by exposure to an infrared ray and a color developer that develops color due to the exposure to an infrared ray,
the infrared absorbing dye is a cyanine dye, and
the cyanine dye is a cyanine dye represented by the following Formula 2,

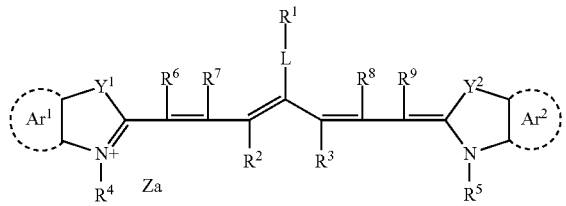

Formula 2 wherein, in the Formula 2, $R^1$ represents a group in which an $R^1$-L bond is cleaved by exposure to an infrared ray, $R^2$ and $R^3$ each independently represent a hydrogen atom or an alkyl group or $R^2$ and $R^3$ may be linked to each other to form a ring, $Ar^1$ and $Ar^1$ each independently represent a group forming a benzene ring or a naphthalene ring, $Y^1$ and $Y^2$ each independently represent an oxygen atom, a sulfur atom, —$NR^0$—, or a dialkyl methylene group, $R^0$ represents a hydrogen atom, an alkyl group, or an aryl group, $R^4$ and $R^5$ each independently represent an alkyl group, a —CON group, or a —$PO_3M_2$ group, M represents a hydrogen atom, a Na atom, a K atom, or an onium group, $R^6$ to $R^9$ each independently represent a hydrogen atom or an alkyl group, L represents (a) a sulfur atom, and $R^1$ is a group represented by the following Formula (2-1), or (b) —$NR^{10}$—, $R^{10}$ represents a hydrogen atom, an alkyl group, or an aryl group, and $R^1$ that bonds to N is a group represented by the following Formula (3-1), and Za represents a counter ion that neutralizes a charge,

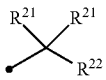

Formula (2-1)

wherein, in the Formula (2-1), ● represents a bonding site with the sulfur atom represented by L in the Formula 2, $R^{21}$'s each independently represent a hydrogen atom, an alkyl group, or an aryl group, and $R^{22}$ represents an aryl group, an alkenyl group, an alkoxy group, or an onium group,

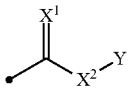

Formula (3-1)

wherein, in the Formula (3-1), ● represents a bonding site with a nitrogen atom included in L in the Formula 2, $X^1$ and $X^2$ each independently represent an oxygen atom or a sulfur atom, and Y represents a group represented by the Formula (2-1).

2. The lithographic printing plate precursor according to claim 1,
wherein, in the Formula 2, $R^4$ and $R^5$ each are independently a substituted alkyl group.

3. The lithographic printing plate precursor according to claim 1,
wherein, in the Formula 2, $R^4$ and $R^5$ each are independently an unsubstituted alkyl group.

4. The lithographic printing plate precursor according to claim 1,
wherein the color developer is a heat color developer.

5. The lithographic printing plate precursor according to claim 4,
wherein the heat color developer is at least one compound selected from a spiropyran compound, a spirooxazine compound, a spirolactone compound, and a spirolactam compound.

6. The lithographic printing plate precursor according to claim 1,
wherein the color developer is an acid color developer, and the image-recording layer further contains an acid-generating agent.

7. The lithographic printing plate precursor according to claim 6,
wherein the acid color developer is at least one compound selected from a spiropyran compound, a spirooxazine compound, a spirolactone compound, and a spirolactam compound.

8. The lithographic printing plate precursor according to claim 6,
wherein the acid color developer is a spirolactone compound represented by the following Formula 3:

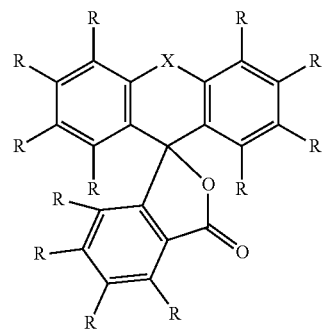

Formula 3 wherein, in the Formula 3, X represents an oxygen atom, a sulfur atom, or —$NR^{19}$—, $R^{19}$ represents a hydrogen atom, an alkyl group, or an aryl group, and R's each independently represent a hydrogen atom or a monovalent substituent.

9. The lithographic printing plate precursor according to claim 8,
wherein, in the Formula 3, X is an oxygen atom.

10. The lithographic printing plate precursor according to claim 6,
wherein the acid-generating agent is an electron-donating acid-generating agent.

11. The lithographic printing plate precursor according to claim 6,
wherein the acid-generating agent is an electron-accepting acid-generating agent.

12. The lithographic printing plate precursor according to claim 6,
wherein the acid-generating agent comprises an electron-donating acid-generating agent and an electron-accepting acid-generating agent.

13. The lithographic printing plate precursor according to claim 10,
wherein the electron-donating acid-generating agent is a borate compound.

14. The lithographic printing plate precursor according to claim 1,
wherein the image-recording layer further contains a polymerizable compound.

15. The lithographic printing plate precursor according to claim 1,
wherein the image-recording layer further contains a polymer particle.

16. The lithographic printing plate precursor according to claim 1,
wherein the image-recording layer further contains a binder polymer.

17. A method for producing a lithographic printing plate comprising:
image-exposing the lithographic printing plate precursor according to claim 1 using an infrared laser; and
removing a non-exposed portion of the image-recording layer using at least one selected from printing ink and dampening water on a printer.

* * * * *